US011733275B2

(12) United States Patent
Nate et al.

(10) Patent No.: US 11,733,275 B2
(45) Date of Patent: *Aug. 22, 2023

(54) ZERO-CROSSING DETECTION CIRCUIT

(71) Applicant: Rohm Co., Ltd., Kyoto (JP)

(72) Inventors: Satoru Nate, Kyoto (JP); Akinobu Sawada, Kyoto (JP); Natsuki Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 53 days.

This patent is subject to a terminal disclaimer.

(21) Appl. No.: 17/499,138

(22) Filed: Oct. 12, 2021

(65) Prior Publication Data

US 2022/0034946 A1 Feb. 3, 2022

Related U.S. Application Data

(63) Continuation of application No. 16/634,296, filed on Jan. 27, 2020, now Pat. No. 11,181,562.

(30) Foreign Application Priority Data

Jul. 31, 2017 (JP) ................................. 2017148233
Sep. 22, 2017 (JP) ................................. 2017182109
Sep. 22, 2017 (JP) ................................. 2017182111

(51) Int. Cl.
*G01R 19/175* (2006.01)
*H03K 5/1536* (2006.01)
*H02M 1/08* (2006.01)

(52) U.S. Cl.
CPC .......... *G01R 19/175* (2013.01); *H02M 1/083* (2013.01); *H03K 5/1536* (2013.01)

(58) Field of Classification Search
CPC .... G01R 19/175; H02M 1/083; H03K 5/1536
(Continued)

(56) References Cited

U.S. PATENT DOCUMENTS 3,727,079 A * 4/1973 Garrett ................ H04L 25/4904 327/79
3,767,938 A * 10/1973 Kueper .................. H03K 5/153 327/79
(Continued)

FOREIGN PATENT DOCUMENTS

CN 201110615 9/2008
CN 201113782 9/2008
(Continued)

OTHER PUBLICATIONS

Japan Patent Office, International Search Report for PCT/JP2018/027792 dated Oct. 23, 2018.

*Primary Examiner* — William Hernandez
(74) *Attorney, Agent, or Firm* — Fish & Richardson P.C.

(57) ABSTRACT

A zero-crossing detection circuit includes a zero-crossing detection unit arranged to compare a first monitoring target signal and a second monitoring target signal respectively input through diodes from a first node and a second node between which an AC signal is applied, so as to generate a first comparison signal, and a logic unit arranged to estimate a zero cross of the AC signal from the first comparison signal so as to generate a zero-crossing detection signal. The zero-crossing detection circuit preferably includes a monitoring unit arranged to adjust the first monitoring target signal and the second monitoring target signal to be suitable for input to the zero-crossing detection unit. The logic unit preferably counts a period of the first comparison signal and estimates a zero cross of the AC signal using a count value thereof.

16 Claims, 57 Drawing Sheets

(58) Field of Classification Search
USPC .............................................................. 327/79
See application file for complete search history.

(56) References Cited

U.S. PATENT DOCUMENTS

| | | | | |
|---|---|---|---|---|
| 3,824,464 | A * | 7/1974 | Rotier .................... | H03K 5/153 327/516 |
| 4,112,381 | A * | 9/1978 | Mortensen ............. | G01R 19/04 327/79 |
| 5,929,577 | A * | 7/1999 | Neidorff ................. | H02P 6/182 318/599 |
| 2010/0109709 | A1* | 5/2010 | Hallak .................. | H02M 1/083 327/79 |
| 2011/0194312 | A1* | 8/2011 | Gaknoki ............... | H02M 1/083 363/21.12 |
| 2011/0279163 | A1 | 11/2011 | Barnett et al. | |
| 2013/0028623 | A1 | 1/2013 | Inukai | |
| 2014/0028354 | A1* | 1/2014 | Yao ...................... | H03K 5/1536 327/79 |
| 2015/0062974 | A1* | 3/2015 | Lund .................... | H03K 5/1536 363/21.04 |
| 2017/0336445 | A1 | 11/2017 | Ariyama | |
| 2020/0158766 | A1 | 5/2020 | Nate et al. | |

FOREIGN PATENT DOCUMENTS

| | | | |
|---|---|---|---|
| CN | 201336574 | | 10/2009 |
| JP | S51-60877 | U | 5/1976 |
| JP | S61-68684 | U | 5/1986 |
| JP | S62-115781 | | 7/1987 |
| JP | 2004-012168 | A | 1/2004 |
| JP | 2008-070285 | A | 3/2008 |
| JP | 2013-029417 | | 2/2013 |
| JP | 2017-099178 | A | 6/2017 |
| JP | 2017-211365 | | 11/2017 |

* cited by examiner

ZERO-CROSSING DETECTION CIRCUIT

CROSS-REFERENCE TO RELATED APPLICATIONS

This application is a Continuation of U.S. application Ser. No. 16/634,296 filed Jan. 27, 2020, which is a U.S. National Phase Application under 35 U.S.C. § 371 of International Patent Application No. PCT/JP2018/027792, filed Jul. 25, 2018, which claims priority to JP Application No. 2017-182111, filed Sep. 22, 2017, JP Application No. 2017-182109, filed Sep. 22, 2017 and JP Application No. 2017-148233, filed Jul. 31, 2017, the disclosures of which are incorporated herein by reference.

TECHNICAL FIELD

The invention disclosed in this specification relates to a zero-crossing detection circuit.

BACKGROUND ART

FIG. 57 is a diagram illustrating a conventional example of a zero-crossing detection circuit. A zero-crossing detection circuit DET of this conventional example is a circuit arranged to detect a zero cross of an AC voltage Vac applied between a live (L) terminal and a neutral (N) terminal (i.e. a cross point of the AC voltage Vac and a ground potential), and is mounted in a home electrical appliance as substantially discrete components (in the example of this diagram, total eleven components including a photocoupler PC, a PNP type bipolar transistor Qa, resistors Ra to Rd, diodes Da and Db, a zener diode ZD, and a capacitor Ca).

Note that there is Patent Document 1 as an example of a conventional technique related to the above description.

LIST OF CITATIONS

Patent Literature

Patent Document 1: JP-A-2017-99178

SUMMARY OF THE INVENTION

Technical Problem

Now, the zero-crossing detection circuit DET of this conventional example has problems including (1) photocoupler PC has large power consumption; (2) there are a large number of the discrete components; (3) detection accuracy is low due to temperature characteristics of the photocoupler PC or other factors; and (4) high-voltage components have low reliability (in an application such as a washing machine, electric corrosion of the resistor Ra is apt to occur). However, the zero-crossing detection circuit DET of this conventional example has operation experience of many years, and it is difficult to redesign. Therefore, it is continuously used as before.

In view of the above-mentioned problem found by the inventors, it is an object of the invention disclosed in this specification to provide a zero-crossing detection circuit that can detect a zero cross of an AC signal without using a photocoupler.

Means for Solving the Problem

A zero-crossing detection circuit disclosed in this specification includes a peak detection unit arranged to detect a peak of a monitoring target signal input through a diode from an AC signal input terminal so as to generate a peak detection signal, and a zero-crossing detection unit arranged to estimate a zero cross of the AC signal from the peak detection signal so as to generate a zero-crossing detection signal.

Further, the zero-crossing detection circuit disclosed in this specification includes a zero-crossing detection unit arranged to compare a first monitoring target signal and a second monitoring target signal respectively input through diodes from a first node and a second node between which an AC signal is applied, so as to generate a first comparison signal, and a logic unit arranged to estimate a zero cross of the AC signal from the first comparison signal so as to generate a zero-crossing detection signal.

Further, the zero-crossing detection circuit disclosed in this specification includes a logic unit arranged to estimate a zero cross of the AC signal in accordance with at least one of a first monitoring target signal and a second monitoring target signal respectively input through diodes from the first node and the second node between which an AC signal is applied, so as to generate a zero-crossing detection signal, and an input stop detection unit arranged to compare the first monitoring target signal with the second monitoring target signal after giving an offset to one of them so as to generate an input stop detection signal, in which the logic unit fixes a logic level of the zero-crossing detection signal in accordance with the input stop detection signal.

Note that other features, elements, steps, advantages, and characteristics will become apparent from the following detailed description of embodiments and attached drawings related to the description.

Advantageous Effects of the Invention

According to the invention disclosed in this specification, it is possible to provide a zero-crossing detection circuit that can detect a zero cross of an AC signal without using a photocoupler.

DESCRIPTION OF EMBODIMENTS

Electronic Equipment (First Structural Example and Second Structural Example)

Figure 1:
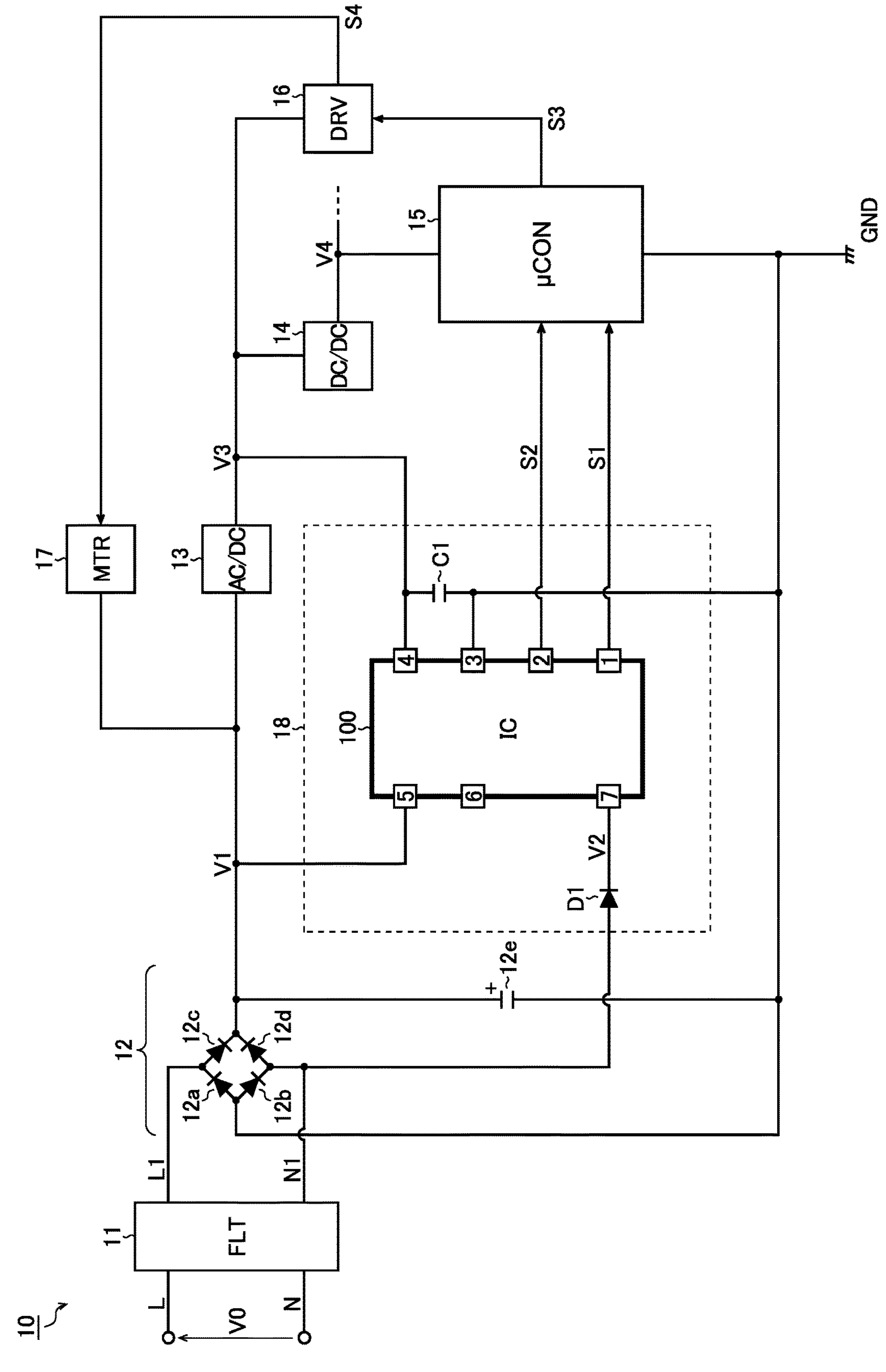
FIG. 1 is a diagram illustrating a first structural example (normal rectifying) of electronic equipment.
Figure 2:
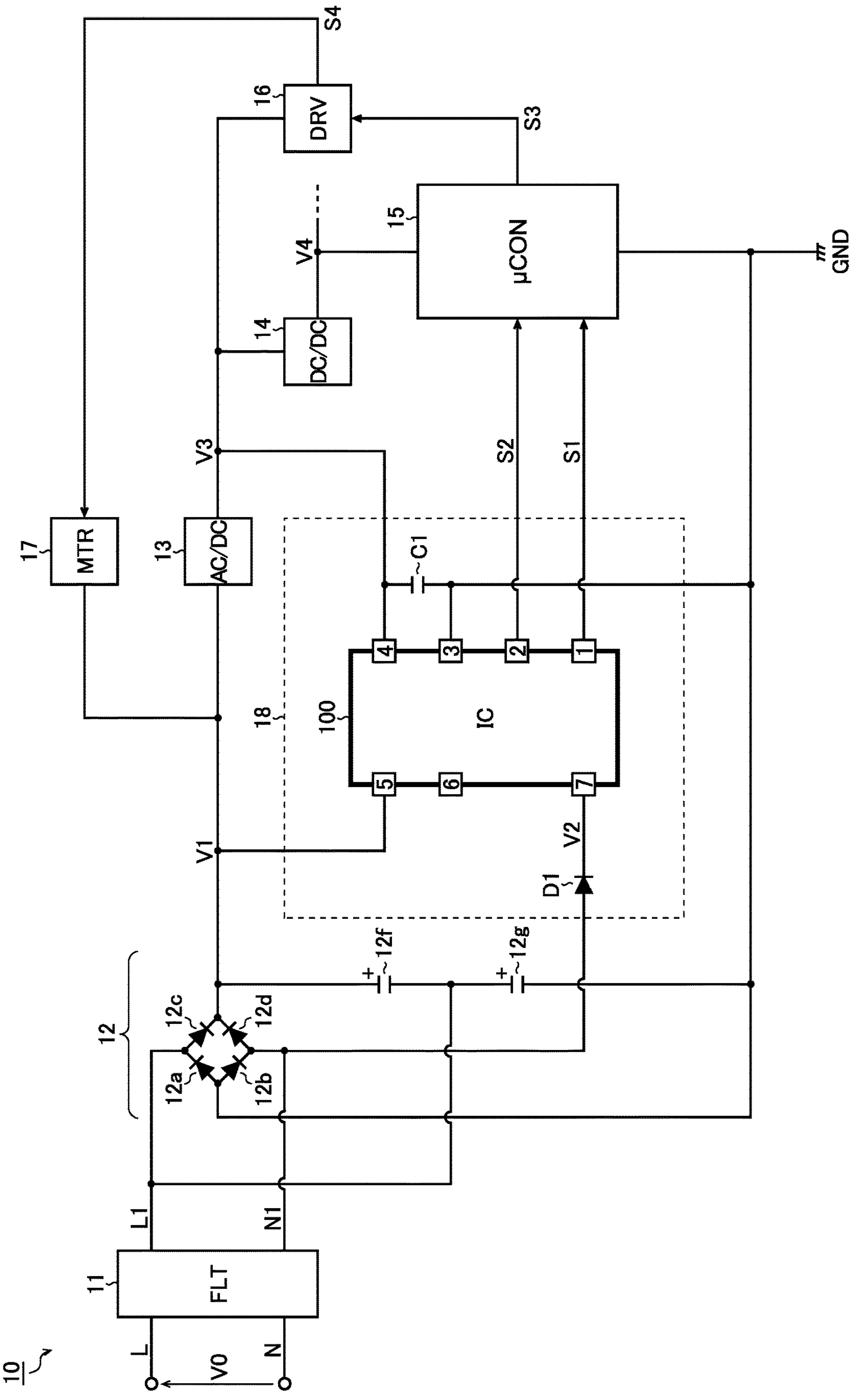
FIG. 2 is a diagram illustrating a second structural example (voltage doubler rectifying) of the electronic equipment.

FIGS. 1 and 2 are diagrams respectively illustrating a first structural example (normal rectifying method) and a second structural example (voltage doubler rectifying method) of electronic equipment that operates when an AC voltage V0 is supplied. Electronic equipment 10 of each structural example includes a filter 11, a rectifying unit 12, an AC/DC converter 13, a DC/DC converter 14, a microcomputer 15, a driver 16, a motor 17, and a zero-crossing detection circuit 18.

The filter 11 removes noises and surges from an AC voltage V0 (e.g. AC 80 V to 264 V) input between a live (L) terminal and a neutral (N) terminal, so as to output the result between an L1 terminal and an N1 terminal. Note that a protection element such as a fuse may be disposed at a preceding stage of the filter 11.

The rectifying unit 12 is a circuit block that performs normal rectifying or voltage doubler rectifying of the AC voltage V0 after the filtering process by the filter 11 so as to generate a rectified voltage V1 (e.g. DC 100 V to 450 V), and supplies the rectified voltage V1 to the AC/DC converter 13, the motor 17, and the zero-crossing detection circuit 18. The rectifying unit 12 includes diodes **12*a* to 12*d*, a capacitor 12*e* (normal rectifying method) or capacitors 12*f* and 12*g*** (voltage doubler rectifying method).

Note that the normal rectifying method (FIG. 1) is a rectification method that is mainstream overseas in which commercial AC power sources are usually a 200 V system. In contrast, the voltage doubler rectifying method (FIG. 2) is a rectification method that is mainstream in Japan in which the commercial AC power source is a 100 V system.

A cathode of the diode **12*a* and an anode of the diode 12*c* are both connected to the L1 terminal. A cathode of the diode 12*b* and an anode of the diode 12*d* are both connected to the N1 terminal. Cathodes of the diodes 12*c* and 12*d* are connected to each other, and the connection node thereof corresponds to an output terminal of the rectified voltage V1. Anodes of the diodes 12***a* and 12*b* are connected to each other, and the connection node thereof is connected to a ground terminal GND that is common to the microcomputer 15 and the zero-crossing detection circuit 18. In this way, the diodes 12*a* to 12*d* are connected to each other so as to form a diode bridge, which performs full wave rectification of the AC voltage V0 after the filtering process so as to generate the rectified voltage V1.

Further, if the rectifying unit 12 adopts the normal rectifying method, the single capacitor 12*e* is connected between the output terminal of the rectified voltage V1 and the ground terminal GND as illustrated in FIG. 1. In contrast, if the rectifying unit 12 adopts the voltage doubler rectifying method, the capacitors 12*f* and 12*g* are connected in series between the output terminal of the rectified voltage V1 and the ground terminal GND as illustrated in FIG. 2. Note that the connection node of the capacitors 12*f* and 12*g* is connected to the L1 terminal.

The AC/DC converter 13 generates a desired first DC voltage V3 (e.g. DC 13.0 V to 18.0 V) from the rectified voltage V1 obtained by rectifying the AC voltage V0, and outputs the first DC voltage V3 to the DC/DC converter 14, the driver 16, and the zero-crossing detection circuit 18.

The DC/DC converter 14 generates a desired second DC voltage V4 (e.g. DC 5.0 V) from the first DC voltage V3 and outputs the second DC voltage V4 to the microcomputer 15 and the like.

The microcomputer 15 operates when the second DC voltage V4 is supplied, and generates a motor control signal S3 so as to control drive of the motor 17 in accordance with a detection result of the zero-crossing detection circuit 18 (i.e. an ACOUT signal S1 and a DCOUT signal S2).

The driver 16 operates when the first DC voltage V3 is supplied, and generates a motor drive signal S4 in accordance with the motor control signal S3.

The motor 17 operates when the rectified voltage V1 is supplied, and it is one type of load that is driven to rotate in accordance with the motor drive signal S4.

The zero-crossing detection circuit 18 is a circuit block that detects a zero cross of the AC voltage V0 (i.e. a cross point of the AC voltage V0 and the ground potential), and it includes a semiconductor integrated circuit device 100, and a diode D1 and a capacitor C1 that are externally attached to the semiconductor integrated circuit device 100.

The semiconductor integrated circuit device 100 is an IC or LSI in which at least a part of circuit elements constituting the zero-crossing detection circuit 18 (details thereof are described later) are integrated, and has seven external terminals (Pin 1 to Pin 7) as means for establishing connection with outside of the device.

Pin 1 (ACOUT pin) is an output terminal of the ACOUT signal S1 and is connected to the microcomputer 15. Pin 2 (DCOUT pin) is an output terminal of the DCOUT signal S2 and is connected to the microcomputer 15. Pin 3 (GND pin) is a ground terminal and is connected to the ground terminal GND common to the microcomputer 15. In other words, the semiconductor integrated circuit device 100 (therefore the zero-crossing detection circuit 18 using the same) operates with respect to the ground voltage common to the microcomputer 15. Pin 4 (VCC pin) is a power supply terminal and is connected to an output terminal of the AC/DC converter 13 (i.e. an output terminal of the first DC voltage V3). Note that the capacitor C1 is connected between Pin 4 and Pin 3.

Pin 5 (VHDC pin) is a DC input terminal and is connected to an output terminal of the rectifying unit 12 (i.e. an input terminal of the rectified voltage V1). Pin 6 (non-connection (N.C.) pin) is a not used terminal and is not connected to anywhere outside the semiconductor integrated circuit device 100. Pin 7 (VHAC pin) is an AC input terminal and is connected to a cathode of the diode D1 (corresponding to an input terminal of a monitoring target voltage V2). Note that an anode of the diode D1 is connected to the N1 terminal (or the L1 terminal).

In this way, unlike the conventional example (FIG. 38) described above, the zero-crossing detection circuit 18 of this structural example detects a zero cross of the AC voltage V0 with only three mounted components (the semiconductor integrated circuit device 100, the diode D1, and the capacitor C1). Therefore, it is possible to obtain effects such as reduction of standby power consumption (1 W to a few tens mW), reduction of the printed circuit board area (a few hundreds square millimeters to a few tens square millimeters), or improvement in accuracy of load drive control, and thus the electronic equipment 10 adapted to market trends or customer needs can be provided.

However, in order to realize the zero-crossing detection circuit 18 of this structural example, it is necessary to solve technical problems including (1) a photocoupler cannot be used; (2) a zero cross varies when monitoring other than between L and N terminals; and (3) a zero cross detection point is different between the normal rectifying method and the voltage doubler rectifying method.

Figure 3:
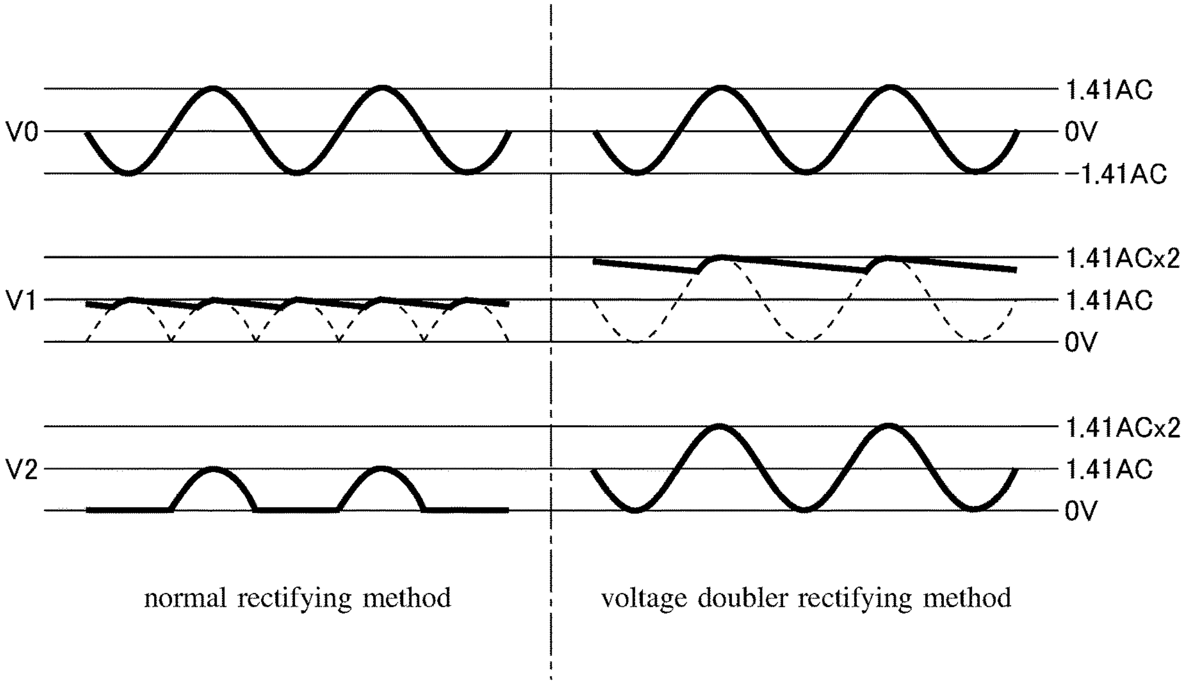
FIG. 3 is a diagram illustrating a relationship between a rectification method and voltages at individual portions.

In particular, the above-mentioned technical problems (2) and (3) are described in detail with reference to the drawings. FIG. 3 is a diagram illustrating a relationship between the rectification method and voltages at individual portions, in which waveforms of the AC voltage V0, the rectified voltage V1, and the monitoring target voltage V2 are shown in order from top to bottom.

For instance, if the AC voltage V0 has a sine waveform varying between +1.41AC and −1.41AC, and if the rectifying unit 12 adopts the normal rectifying method (FIG. 1), the rectified voltage V1 has a DC waveform with a ripple near +1.41AC, and the monitoring target voltage V2 has a half-wave rectified waveform varying between +1.41AC and 0 V, as illustrated in the left side of this diagram. In contrast, if the rectifying unit 12 adopts the voltage doubler rectifying method (FIG. 2), the rectified voltage V1 has a DC waveform with a ripple near +1.41AC×2, and the monitoring target voltage V2 has a sine waveform varying between +1.41AC×2 and 0 V, as illustrated in the right side of this diagram.

In this way, the monitoring target voltage V2 has a waveform different from that of the AC voltage V0, and a distortion may occur in the waveform depending on a load state. In other words, it may be assumed that a zero cross of the monitoring target voltage V2 is varied from a zero cross of the AC voltage V0. Therefore, in the structure for detecting a zero cross of the monitoring target voltage V2, a zero cross of the AC voltage V0 may not be correctly detected.

Further, when trying to detect a zero cross of the monitoring target voltage V2, the detection point is a cross point with 0 V in the normal rectifying method, and it is a cross point with +1.41AC in the voltage doubler rectifying method. Therefore, in the structure for detecting a zero cross of the monitoring target voltage V2, it is required to change the detection point in accordance with the rectification method, and it is difficult to support both the rectification methods.

In the following description, an embodiment of the semiconductor integrated circuit device 100 is exemplified, and it is described that all the technical problems (1) to (3) are solved.

Semiconductor Integrated Circuit Device (First Embodiment)

Figure 4:
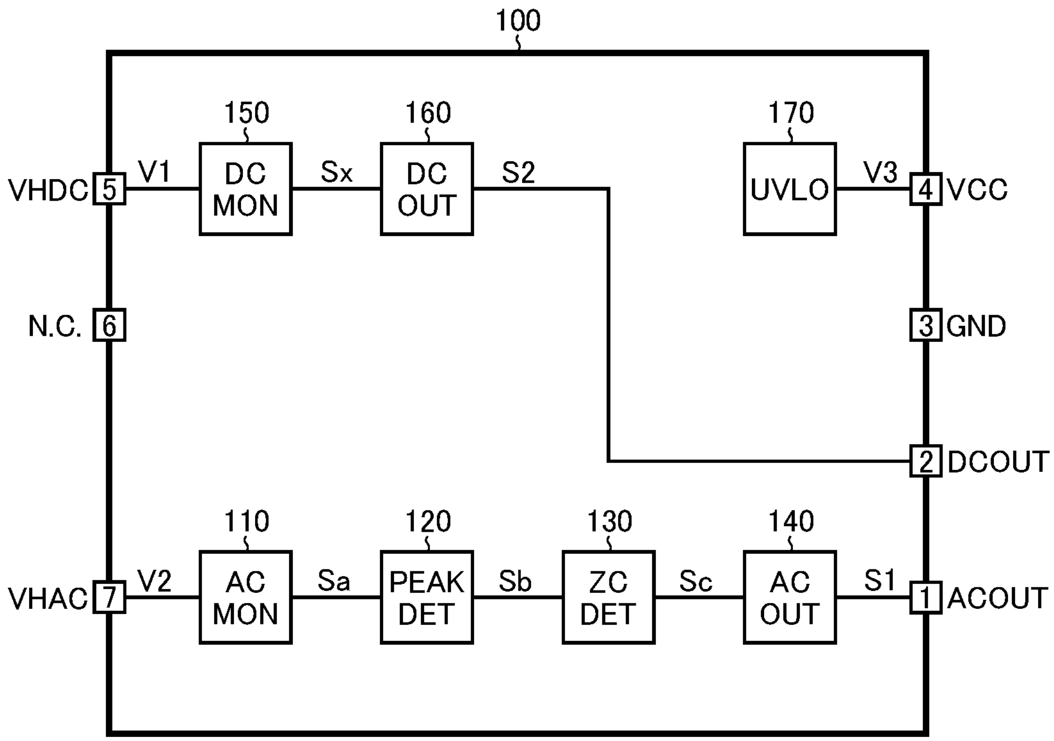
FIG. 4 is a diagram illustrating a first embodiment of a semiconductor integrated circuit device.

FIG. 4 is a diagram illustrating a first embodiment of the semiconductor integrated circuit device 100. The semiconductor integrated circuit device 100 of this embodiment includes an AC monitoring unit 110, a peak detection unit 120, a zero-crossing detection unit 130, a first output unit 140, a DC monitoring unit 150, a second output unit 160, and an undervoltage protection unit 170, which are integrated.

The AC monitoring unit 110 is a high-voltage circuit unit (having a withstand voltage of 650 V, for example), which generates an AC monitor signal Sa suitable for input to the peak detection unit 120 from the monitoring target voltage V2 input to Pin 7 (VHAC pin) (corresponding to the monitoring target signal input through the diode D1 from the N1 terminal applied with the AC voltage V0).

The peak detection unit 120 detects a peak of the AC monitor signal Sa (therefore the monitoring target voltage V2) so as to generate a peak detection signal Sb.

The zero-crossing detection unit 130 is a logic circuit that estimates a zero cross of the AC voltage V0 from the peak detection signal Sb so as to generate a zero-crossing detection signal Sc.

The first output unit 140 receives input of the zero-crossing detection signal Sc so as to generate the ACOUT signal S1, and outputs the ACOUT signal S1 to Pin 1 (ACOUT pin).

The DC monitoring unit 150 is a high-voltage circuit block (having a withstand voltage of 650 V, for example) that generates a DC monitor signal Sx from the rectified voltage V1 input to Pin 5 (VHDC pin).

The second output unit 160 receives input of the DC monitor signal Sx so as to generate the DCOUT signal S2, and outputs the DCOUT signal S2 to Pin 2 (DCOUT pin).

Note that, in the case where the DC monitor signal Sx is through output as the DCOUT signal S2, the second output unit 160 may be eliminated. Further, if the DC monitoring function itself is not necessary, all the DC monitoring unit 150, the second output unit 160, Pin 2 (DCOUT pin), and Pin 5 (VHDC pin) can be eliminated.

The undervoltage protection unit 170 is a protection function unit (so-called undervoltage lock-out (UVLO) protection unit), which disables operation of the semiconductor integrated circuit device 100 when the first DC voltage V3 input to Pin 4 (VCC) is lower than a lower limit value.

<AC Monitoring Unit>

Figure 5:
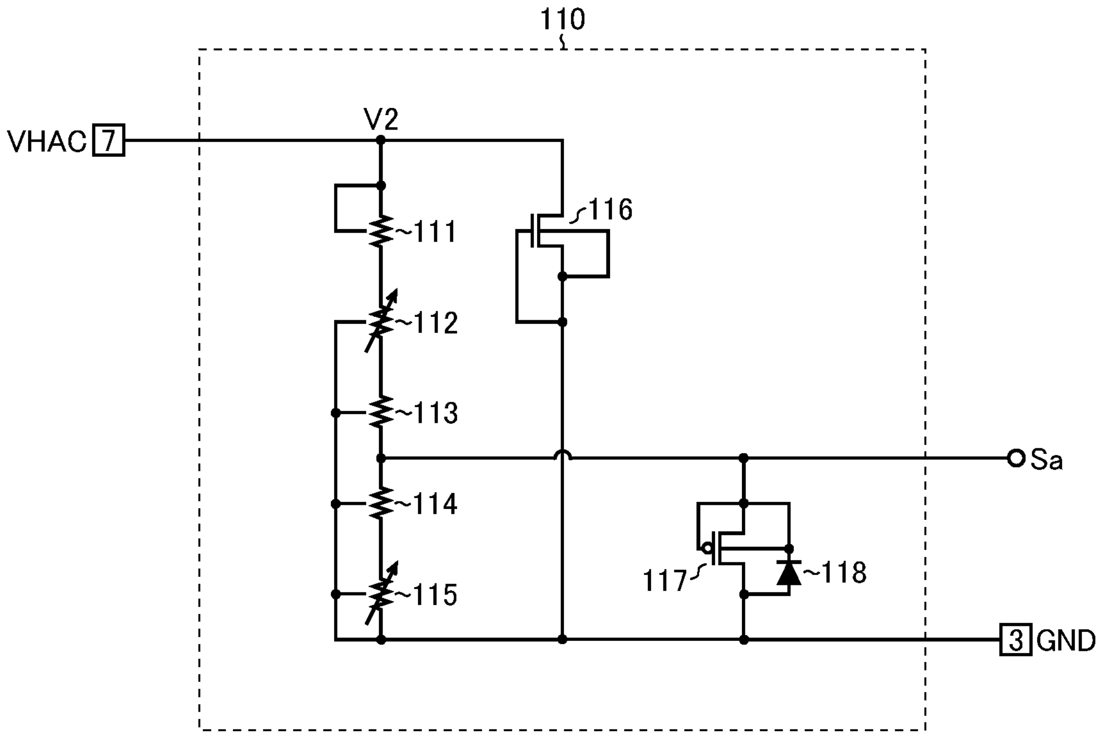
FIG. 5 is a diagram illustrating one structural example of an AC monitoring unit.

FIG. 5 is a diagram illustrating one structural example of the AC monitoring unit 110. The AC monitoring unit 110 of this structural example includes resistors 111 to 115, an N-channel metal-oxide semiconductor field-effect transistor (NMOSFET) 116, a P-channel MOSFET (PMOSFET) 117, and a diode 118.

The resistors 111 to 115 are connected in series between Pin 7 (VHAC pin) and Pin 3 (GND pin) in the illustrated order. Note that the connection node of the resistor 113 and the resistor 114 corresponds to an output terminal of the AC monitor signal Sa. In other words, the resistors 111 to 115 function as a voltage divider circuit that divides the monitoring target voltage V2 input to Pin 7 so as to generate the AC monitor signal Sa. For instance, it is supposed that a combined resistance of the resistors 111 to 113 is Rx (e.g. 10 MΩ) and that a combined resistance of the resistors 114 and 115 is Ry (e.g. 0.1 MΩ). Then, $Sa=(Ry/(Rx+Ry))\times V2$ ($\approx 0.01\times V2$) holds.

Further, in the example of this diagram, each resistance of the resistors 112 and 115 among the resistors 111 to 115 can be adjusted by trimming or the like. Therefore, the above-mentioned voltage division ratio Ry/(Rx+Ry) can be arbitrarily set.

Note that it is preferred to use polysilicon resistors having a withstand voltage of 100 V or higher (e.g. 650 V) as the resistors 111 to 115. In particular, when the resistors 111 to 115 are integrated, not only a high-voltage structure in a path through the resistors 111 to 115 (in a lateral direction) but also a high-voltage structure between the semiconductor substrate and the resistors 111 to 115 (in a vertical direction) is required. Therefore, in the semiconductor substrate on which the AC monitoring unit 110 is integrated, it is preferred to form a high-voltage region having a higher withstand voltage in the substrate thickness direction (in the vertical direction) than other region, and to form the resistors 111 to 115 on the high-voltage region. As the high-voltage region described above, it is possible to use a lateral double-diffused MOSFET (LDMOSFET) region with abundant results of high withstand voltage.

A drain of the NMOSFET 116 is connected to Pin 7. A source, a gate, and a backgate of the NMOSFET 116 are all connected to Pin 3. A drain of the PMOSFET 117 is connected to Pin 3. A source, a gate, and a backgate of the PMOSFET 117 are all connected to the output terminal of the AC monitor signal Sa. A cathode of the diode 118 is connected to the backgate of the PMOSFET 117. The drain of the PMOSFET 117 and an anode of the diode 118 are both connected to Pin 3. Each of the NMOSFET 116, the PMOSFET 117, and the diode 118 connected in this way functions as an electrostatic protection element.

Note that the AC monitoring unit 110 is not limited to this structural example using the voltage divider circuit, but may have a structure in which the monitoring target voltage V2 is sampled at a predetermined sampling rate, and the sampled values are output as the AC monitor signal Sa to the peak detection unit 120, for example.

Further, the DC monitoring unit 150 should have basically the same structure as the AC monitoring unit 110. In other words, in the above description, "Pin 7 (VHAC pin)" can be replaced by "Pin 5 (VHDC pin)", and "AC monitor signal Sa" can be replaced by "DC monitor signal Sx", so that a structure and an operation of the DC monitoring unit 150 can be understood.

<Peak Detection Unit>

Figure 6:
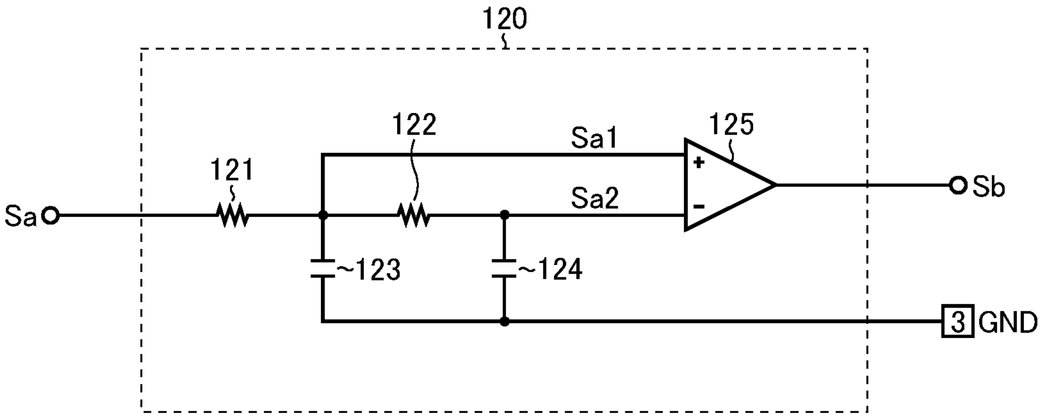
FIG. 6 is a diagram illustrating one structural example of a peak detection unit.

FIG. 6 is a diagram illustrating one structural example of the peak detection unit 120. As illustrated in this diagram, the peak detection unit 120 of this structural example includes resistors 121 and 122, capacitors 123 and 124, and a comparator 125.

A first terminal of the resistor 121 is connected to an input terminal of the AC monitor signal Sa. A second terminal of the resistor 121 is connected to a first terminal of the resistor 122, a first terminal of the capacitor 123, and a noninverting input terminal (+) of the comparator 125. A second terminal of the resistor 122 is connected to a first terminal of the capacitor 124 and an inverting input terminal (−) of the comparator 125. Second terminals of the capacitors 123 and 124 are both connected to Pin 3 (GND pin). An output terminal of the comparator 125 corresponds to an output terminal of the peak detection signal Sb.

Note that the resistor 121 (e.g. 2 MΩ) and the capacitor 123 (e.g. 10 pF) function as an RC filter that removes noise components superimposed on the AC monitor signal Sa, so as to generate a first AC monitor signal Sa1.

In contrast, the resistor 122 (e.g. 4.7 MΩ) and the capacitor 124 (e.g. 20 pF) function as a delay unit that gives a predetermined delay to the first AC monitor signal Sa1, so as to generate a second AC monitor signal Sa2.

The comparator 125 compares the first AC monitor signal Sa1 (without delay) with the second AC monitor signal Sa2 (with delay), so as to generate the peak detection signal Sb. The peak detection signal Sb is high level when the first AC monitor signal Sa1 is higher than the second AC monitor signal Sa2, and it is low level when the first AC monitor signal Sa1 is lower than the second AC monitor signal Sa2. The peak detection signal Sb generated in this way falls to low level with a little delay after a peak occurs in the monitoring target voltage V2. This point will be described in detail later with a specific example.

Note that the circuit structure of this diagram is merely an example, and any circuit structure may be adopted as long as a peak of the monitoring target voltage V2 (or the AC monitor signal Sa) can be appropriately detected.

<First Output Unit>

Figure 7:
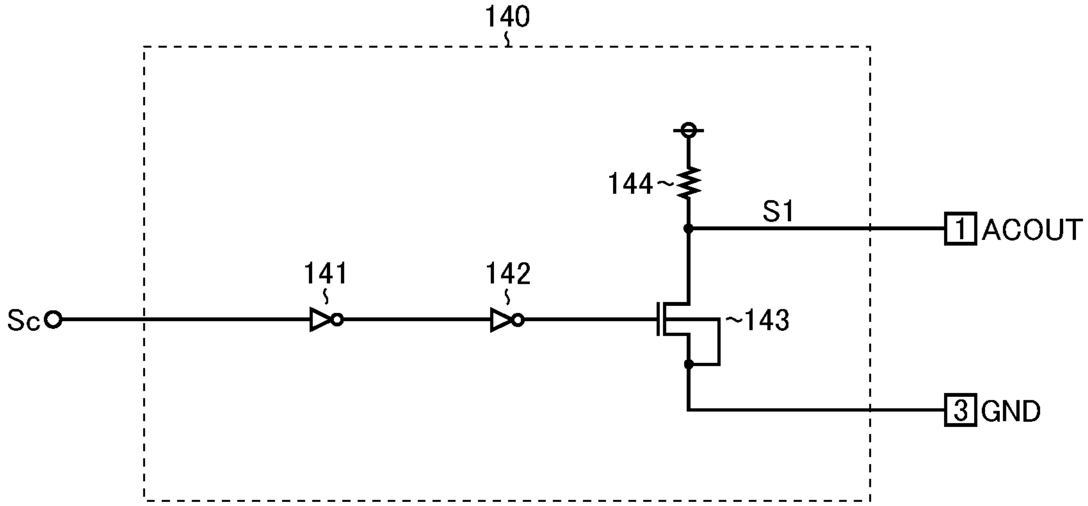
FIG. 7 is a diagram illustrating one structural example of a first output unit.

FIG. 7 is a diagram illustrating one structural example of the first output unit 140. The first output unit 140 of this structural example includes inverters 141 and 142, an NMOSFET 143, and a resistor 144. An input terminal of the inverter 141 is connected to an input terminal of the zero-crossing detection signal Sc. An output terminal of the inverter 141 is connected to an input terminal of the inverter 142. An output terminal of the inverter 142 is connected to a gate of the NMOSFET 143. A first terminal of the resistor 144 is connected to a power supply terminal (e.g. DC 5 V). A second terminal of the resistor 144 and a drain of the NMOSFET 143 are both connected to Pin 1 (ACOUT pin). A source and a backgate of the NMOSFET 143 are both connected to Pin 3 (GND pin).

In the first output unit 140 of this structural example, when the zero-crossing detection signal Sc is high level, the NMOSFET 143 is turned on, and hence the ACOUT signal S1 output from Pin 1 becomes low level. In contrast, when the zero-crossing detection signal Sc is low level, the NMOSFET 143 is turned off, and hence the ACOUT signal S1 becomes high level.

In this way, the ACOUT signal 51 generated in the first output unit 140 with an open drain is basically a logically inverted signal of the zero-crossing detection signal Sc.

<Zero-Crossing Detection Process>

Figure 8:
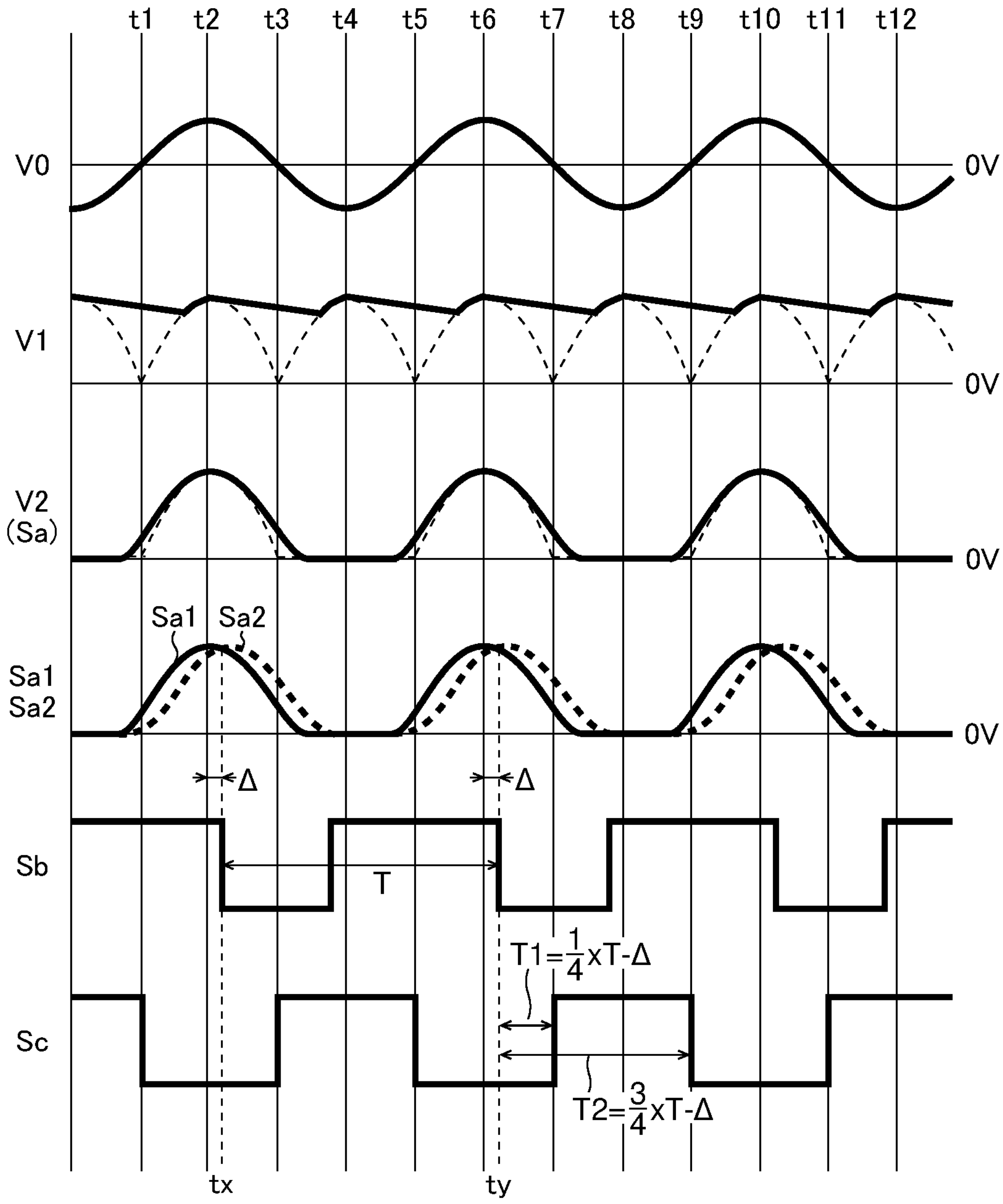
FIG. 8 is a timing chart showing one example of a zero-crossing detection process.

FIG. 8 is a timing chart showing one example of the zero-crossing detection process by the zero-crossing detection unit 130, in which the AC voltage V0, the rectified voltage V1, the monitoring target voltage V2 (or the AC monitor signal Sa), the first AC monitor signal Sa1, the second AC monitor signal Sa2, the peak detection signal Sb, and the zero-crossing detection signal Sc are shown in order from top to bottom. In the following description, behavior in the case where the rectifying unit 12 adopts the normal rectifying method (FIG. 1) is exemplified and described in detail.

The waveform of the AC voltage V0 is a sine waveform in which positive and negative polarities are switched at a predetermined period. Note that in the example of this diagram, a zero cross from negative to positive polarity occurs at time points t1, t5, and t9 in the AC voltage V0, while a zero cross from positive to negative polarity occurs at time points t3, t7, and tn. Further, in the example of this diagram, the AC voltage V0 has positive peaks at time points t2, t6, and t10, while it has negative peaks at time points t4, t8, and t12.

The waveform of the rectified voltage V1 is a DC waveform with a ripple near the peak of the full wave rectification waveform of the AC voltage V0 (see the thin broken line).

If the rectifying unit 12 adopts the normal rectifying method (FIG. 1), the waveform of the monitoring target voltage V2 (or the AC monitor signal Sa) is basically a half-wave rectified waveform of the AC voltage V0. In other words, if the AC voltage V0 has a positive value, the monitoring target voltage V2 also has a positive value, while the monitoring target voltage V2 is not lower than 0 V even if the AC voltage V0 has a negative value.

Note that the waveform of the monitoring target voltage V2 may have a distortion depending on a load state or the like as illustrated by overlapped thin broken line (ideal) and thick solid line (reality). Therefore, even if a zero cross of the monitoring target voltage V2 is detected, it is difficult to correctly detect a zero cross of the AC voltage V0.

In contrast, after earnest research, the inventors found that a peak timing of the monitoring target voltage V2 is substantially identical to a peak timing of the AC voltage V0 without depending on a load state or the like, in other words, the AC voltage V0 and the monitoring target voltage V2 have the same phase only at each peak timing. On the basis of this knowledge, the inventors created a novel arithmetic algorithm that enables to estimate a zero cross of the AC voltage V0 from peak timing of the monitoring target voltage V2. In the following description, while continuing the description of FIG. 8, the above-mentioned arithmetic algorithm is described in detail.

The first AC monitor signal Sa1 (thick solid line) and the delayed signal thereof, i.e. the second AC monitor signal Sa2 (thick broken line) cross each other at time point (e.g. time point tx) when a predetermined delay time Δ elapses from the peak timing of the monitoring target voltage V2 (e.g. the time point t2). Specific description is given as follows with reference to this diagram. A high/low relationship between the first AC monitor signal Sa1 and the second AC monitor signal Sa2 is switched from Sa1>Sa2 to Sa1<Sa2 before and after the time point tx. As a result, the peak detection signal Sb falls from high level to low level at the time point tx.

In other words, it can be said that a falling edge of the peak detection signal Sb indicates a peak timing of the monitoring target voltage V2 (therefore a positive peak timing of the AC voltage V0). Therefore, the zero-crossing detection unit 130 sequentially detects falling edges of the peak detection signal Sb, so as to count a period T of the peak detection signal Sb (e.g. from the time point tx to the time point ty in this diagram), and estimates a zero cross of the AC voltage V0 using the count value.

More specifically, on the precondition that the AC voltage V0 has a constant period and a constant phase, the zero-crossing detection unit 130 refers to the period T of the peak detection signal Sb so as to determine rising timing and falling timing of the zero-crossing detection signal Sc.

For instance, the zero-crossing detection unit 130 starts counting of standby time T1 corresponding to the period T obtained in advance (e.g. T1=(¼)×T−Δ) from time point (e.g. time point ty) when the peak detection signal Sb falls to low level, and raises the zero-crossing detection signal Sc from low level to high level at time point when the standby time T1 elapses. The rising timing of the zero-crossing detection signal Sc is substantially identical to timing when the AC voltage V0 is switched from positive to negative (i.e. a zero cross from positive to negative).

Further, the zero-crossing detection unit 130 decreases the zero-crossing detection signal Sc from high level to low level at time point when standby time T2 longer than the standby time T1 (e.g. T2=(¾)×T−Δ) elapses from time point (e.g. the time point ty) when the peak detection signal Sb falls to low level. The falling timing of the zero-crossing detection signal Sc is substantially identical to timing when the AC voltage V0 is switched from negative to positive (i.e. a zero cross from negative to positive).

Note that, as the count value of the period T that is used for determining the standby time T1 and the standby time T2, a count value one period before may be used, or an average count value of a few periods may be used. Further, the delay time Δ that is used for determining the standby time T1 and the standby time T2 (i.e. a shift between the true peak timing and a pulse edge timing of the peak detection signal Sb) is known from circuit characteristics of the delay unit (the resistor 122 and the capacitor 124). However, it is possible to determine the rising timing and the falling timing of the zero-crossing detection signal Sc ignoring the delay time Δ and without correction thereof.

Further, in this diagram, the zero-crossing detection process in the normal rectifying method (FIG. 1) is exemplified as described above, but also in the zero-crossing detection process in the voltage doubler rectifying method (FIG. 2), the same zero-crossing detection process as described above can be performed except that the waveform of the monitoring target voltage V2 (or the AC monitor signal Sa) is different. In other words, the novel arithmetic algorithm described above can support both the normal rectifying method (FIG. 1) and the voltage doubler rectifying method (FIG. 2).

However, the zero-crossing detection process of this diagram is merely one example, and any arithmetic algorithm can be adopted as long as a pulse edge of the zero-crossing detection signal Sc can be appropriately generated from the peak detection signal Sb.

<Noise Removing Process>

Figure 9:
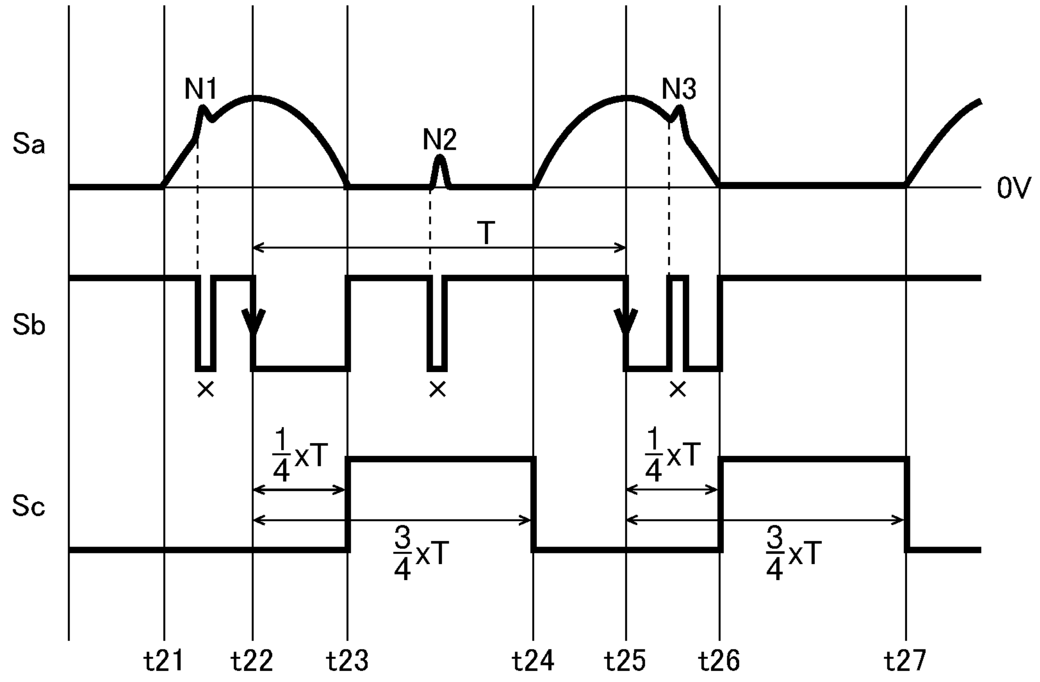
FIG. 9 is a timing chart showing one example of a noise removing process.

Next, in a real application, a method of removing noises, which are assumed to be superimposed on the peak detection signal Sb, is described in detail with reference to the drawings. FIG. 9 is a timing chart showing one example of a noise removing process by the zero-crossing detection unit 130, in which the AC monitor signal Sa, the peak detection signal Sb, and the zero-crossing detection signal Sc are shown in order from top to bottom. Note that in the following description, the delay time Δ is ignored for convenience sake of description.

In the example of this diagram, the AC monitor signal Sa has peaks at time points t22 and t25, and along with this, the peak detection signal Sb falls from high level to low level. Therefore, with respect to the falling edge of the peak detection signal Sb, the rising timing and the falling timing of the zero-crossing detection signal Sc are determined, and hence a zero cross of the AC voltage V0 can be correctly estimated. This is described above.

However, in the electronic equipment 10, undesired noises (in this diagram, noises N1 to N3) are superimposed on the AC monitor signal Sa due to a counter electromotive force of the motor 17 or the like. Note that the noise N1 is superimposed in the period while the AC monitor signal Sa is increasing from zero to a peak value (i.e. from time point t21 to time point t22). In contrast, the noise N2 is superimposed in the period while the AC monitor signal Sa is kept at zero (i.e. from time point t23 to time point t24). Further, the noise N3 is superimposed in the period when the AC monitor signal Sa is falling from the peak value to zero (i.e. from time point t25 to time point t26).

When these noises N1 to N3 are superimposed, the peak detection signal Sb may be switched to an undesired logic level, and hence a peak of the AC monitor signal Sa cannot be correctly detected. Therefore, after the logic level of the peak detection signal Sb is switched, if the logic level after the switching is not kept for a predetermined mask period (e.g. 1600 μs), the zero-crossing detection unit 130 ignores the switching of the logic level.

For instance, from the time point t21 to the time point t22, the peak detection signal Sb falls to low level due to the noise N1, but soon it rises to high level, and therefore this falling edge is ignored. In other words, the zero-crossing detection unit 130 regards that the peak detection signal Sb is kept at high level from the time point t21 to the time point t22.

Similarly, from the time point t23 to the time point t24, the peak detection signal Sb falls to low level due to the noise N2, but soon it rises to high level, and therefore this falling edge is also ignored. In other words, the zero-crossing detection unit 130 regards that the peak detection signal Sb is kept at high level from the time point t23 to the time point t24.

In contrast, from the time point t25 to the time point t26, the peak detection signal Sb rises to high level due to the noise N3, but soon it falls to low level, and therefore this rising edge is ignored. In other words, the zero-crossing detection unit 130 regards that the peak detection signal Sb is kept at low level from the time point t25 to the time point t26.

Note that a unit that performs the noise removing process described above is not necessarily limited to the zero-crossing detection unit 130. It is useful to finish the noise removing process before a certain signal processing is performed after the input of the peak detection signal Sb is received.

Further, an analog noise filter or a digital noise filter (such as a finite impulse response (FIR) filter) may be disposed between the peak detection unit 120 and the zero-crossing detection unit 130.

Semiconductor Integrated Circuit Device (Second Embodiment)

Figure 10:
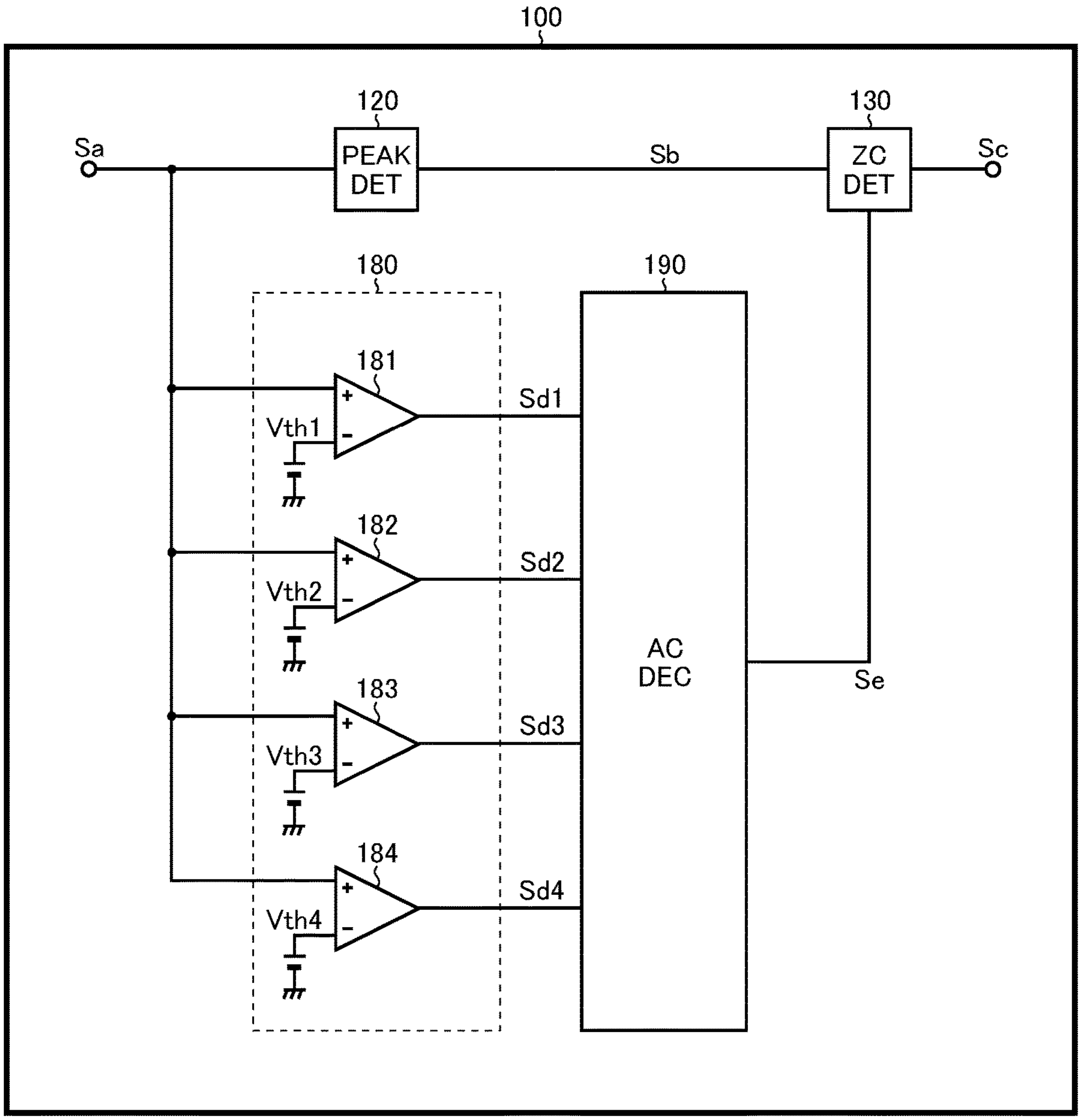
FIG. 10 is a diagram illustrating a second embodiment of the semiconductor integrated circuit device.

FIG. 10 is a diagram illustrating a second embodiment of the semiconductor integrated circuit device 100. The semiconductor integrated circuit device 100 of this embodiment is based on the first embodiment (FIG. 4) and further includes a comparing unit 180 and an AC waveform determination unit 190 (in this diagram, the AC monitoring unit 110, the first output unit 140, the DC monitoring unit 150, the second output unit 160, and the undervoltage protection unit 170 are not illustrated). Therefore, an element having the same structure as in the first embodiment is denoted by the same numeral or symbol as in FIG. 4 so that overlapping description is omitted. In the following description, characteristic parts of this embodiment are mainly described.

The comparing unit 180 includes four comparators 181 to 184, and compares the AC monitor signal Sa with each of a plurality of threshold values Vth1 to Vth4 (Vth1<Vth2<Vth3<Vth4) so as to generate a plurality of comparison signals Sd1 to Sd4.

More specifically, the comparator 181 compares the AC monitor signal Sa input to a noninverting input terminal (+) with the threshold value Vth1 input to the inverting input terminal (−) so as to generate the comparison signal Sd1.

Therefore, the comparison signal Sd1 is high level when the AC monitor signal Sa is higher than the threshold value Vth1, while it is low level when the AC monitor signal Sa is lower than threshold value Vth1.

The comparator 182 compares the AC monitor signal Sa input to a noninverting input terminal (+) with the threshold value Vth2 input to the inverting input terminal (−) so as to generate the comparison signal Sd2. Therefore, the comparison signal Sd2 is high level when the AC monitor signal Sa is higher than the threshold value Vth2, while it is low level when the AC monitor signal Sa is lower than the threshold value Vth2.

The comparator 183 compares the AC monitor signal Sa input to a noninverting input terminal (+) with the threshold value Vth3 input to the inverting input terminal (−) so as to generate the comparison signal Sd3. Therefore, the comparison signal Sd3 is high level when the AC monitor signal Sa is higher than the threshold value Vth3, while it is low level when the AC monitor signal Sa is lower than the threshold value Vth3.

The comparator 184 compares the AC monitor signal Sa input to a noninverting input terminal (+) with the threshold value Vth4 input to the inverting input terminal (−) so as to generate the comparison signal Sd4. Therefore, the comparison signal Sd4 is high level when the AC monitor signal Sa is higher than the threshold value Vth4, while it is low level when the AC monitor signal Sa is lower than the threshold value Vth4.

Note that the comparing unit 180 is not limited to the four channels. The number of channels can be arbitrary (two or more channels).

The AC waveform determination unit 190 stores whether or not each of the rising edge and the falling edge has occurred in each of the comparison signals Sd1 to Sd4, and detects whether or not both the rising edge and the falling edge have occurred in at least one of the comparison signals Sd1 to Sd4 during one period of the zero-crossing detection signal Sc, so as to generate a waveform determination signal Se. The waveform determination signal Se is a normal determination logic level (e.g. low level) when the AC monitor signal Sa has a normal waveform, while it is an abnormal determination logic level (e.g. high level) when the AC monitor signal Sa has an abnormal waveform.

Note that the AC waveform determination unit 190 recognizes that the logic level is valid first time when each logic level of the comparison signals Sd1 to Sd4 is kept for a predetermined period (e.g. 40 μs). With this structure, noise or chattering in the comparison signals Sd1 to Sd4 can be ignored, and hence the AC waveform determination process can be correctly performed.

The zero-crossing detection unit 130 stops generation or output of the zero-crossing detection signal Sc when the waveform determination signal Se is the abnormal determination logic level (e.g. high level). For instance, when an instantaneous power failure occurs in the AC power source, if the waveform of the AC monitor signal Sa becomes abnormal, generation or output of the zero-crossing detection signal Sc is stopped. Therefore, the microcomputer 15 promptly recognizes the occurrence of abnormality in the AC voltage V0 so as to stop driving of the motor 17 without delay, and thus safety and reliability of the electronic equipment 10 can be enhanced.

<AC Waveform Determination Process>

Figure 11:
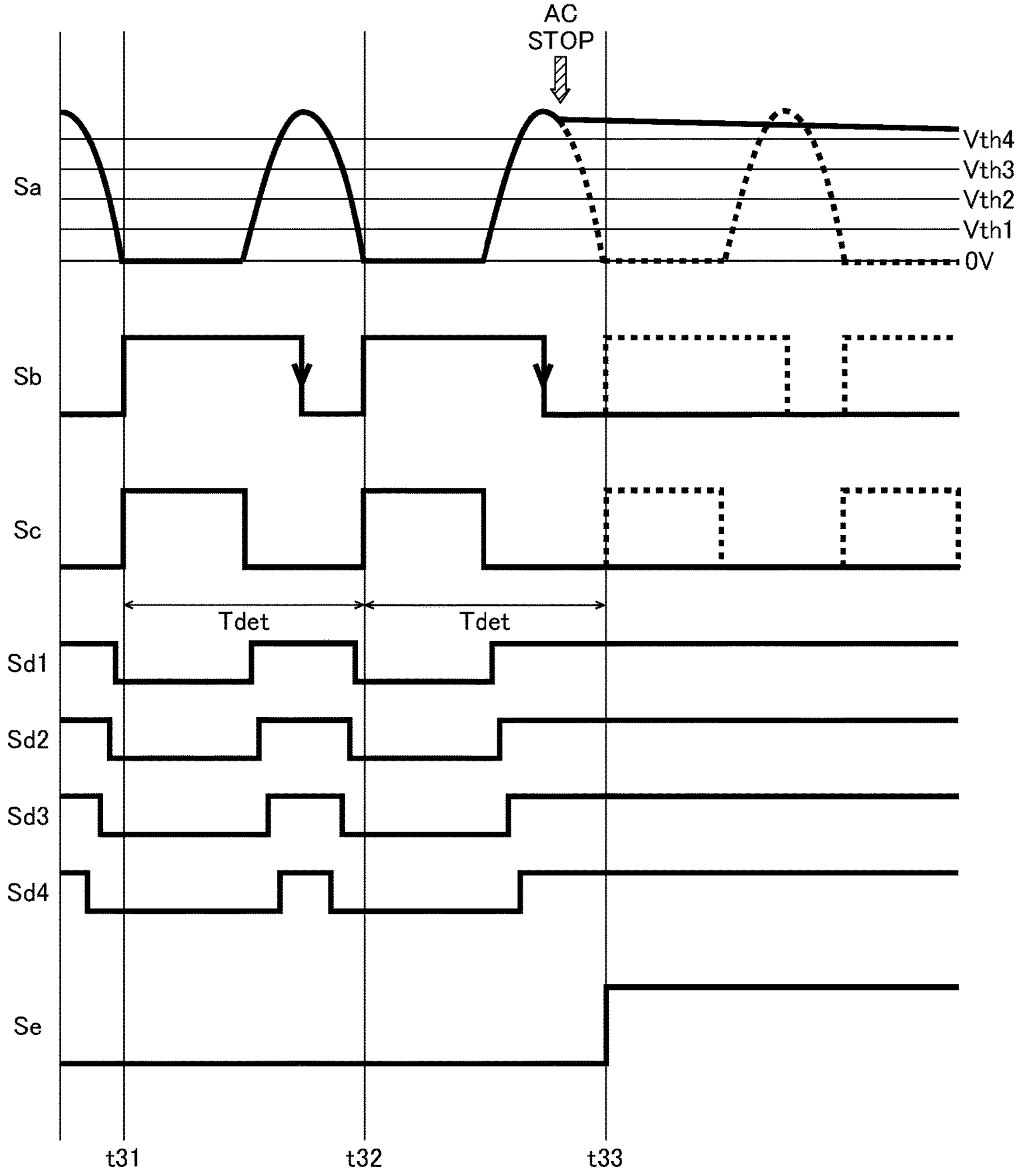
FIG. 11 is a timing chart showing one example of an AC waveform determination process.

FIG. 11 is a timing chart showing one example of the AC waveform determination process by the AC waveform determination unit 190, in which the AC monitor signal Sa, the peak detection signal Sb, the zero-crossing detection signal Sc, the comparison signals Sd1 to Sd4, and the waveform determination signal Se are shown in order from top to bottom.

The AC monitor signal Sa is normally input in the period from time point t31 to time point t32, and in a predetermined detection period Tdet (corresponding to one period of the zero-crossing detection signal Sc), the AC monitor signal Sa rises from zero (<Vth1) to a peak value (>Vth4) and then falls again to zero. As a result, both the rising edge and the falling edge occur in each of the comparison signals Sd1 to Sd4. Therefore, it is determined that the AC monitor signal Sa has a normal waveform, and the waveform determination signal Se is low level (i.e. a logic level in the normal determination).

In contrast, in the period from time point t32 to time point t33, the AC monitor signal Sa rises from zero to a peak value and falls again. Just after that, an instantaneous power failure occurs in the AC power source, and as a result, the AC monitor signal Sa is kept at a voltage value higher than the threshold value Vth4. Note that in the conventional structure (FIG. 20) using a photocoupler having large power consumption, if an instantaneous power failure occurs in the AC power source, power supply to the load is also stopped without delay, and hence there is no particular problem. However, in this structure without using a photocoupler, the monitoring target voltage V2 is not discharged, and hence the state as illustrated in the drawing can occur.

In this case, if the monitoring target voltage V2 (therefore the AC monitor signal Sa) varies periodically due to a certain factor, a peak of the AC monitor signal Sa is misdetected despite that the power supply from the AC power source is stopped, and hence the zero-crossing detection signal Sc is still output. As a result, the microcomputer 15 misdetermines that power is continuously supplied from the AC power source, and there may be a malfunction that the motor 17 is continuously rotated by remaining power.

In contrast, in the structure including the comparing unit 180 and the AC waveform determination unit 190, if the AC monitor signal Sa is kept at a voltage value higher than the threshold value Vth4, all the comparison signals Sd1 to Sd4 are fixed to high level, and hence it is determined that the waveform of the AC monitor signal Sa is abnormal. Therefore, the waveform determination signal Se is raised to high level (i.e. the abnormal determination logic level). As a result, after the time point t33, generation and output of the zero-crossing detection signal Sc is stopped, and hence the microcomputer 15 can promptly recognize an instantaneous power failure in the AC power source and can stop driving of the motor 17 without delay.

Note that as a result of slow discharge of the monitoring target voltage V2, a rising edge and a falling edge may occur in the AC monitor signal Sa at a period longer than the above-mentioned detection period Tdet. However, by setting the detection period Tdet to one period of the zero-crossing detection signal Sc, it is possible to prevent misdetermination that the AC monitor signal Sa has a normal waveform on the basis of this pulse edge.

Figure 12:
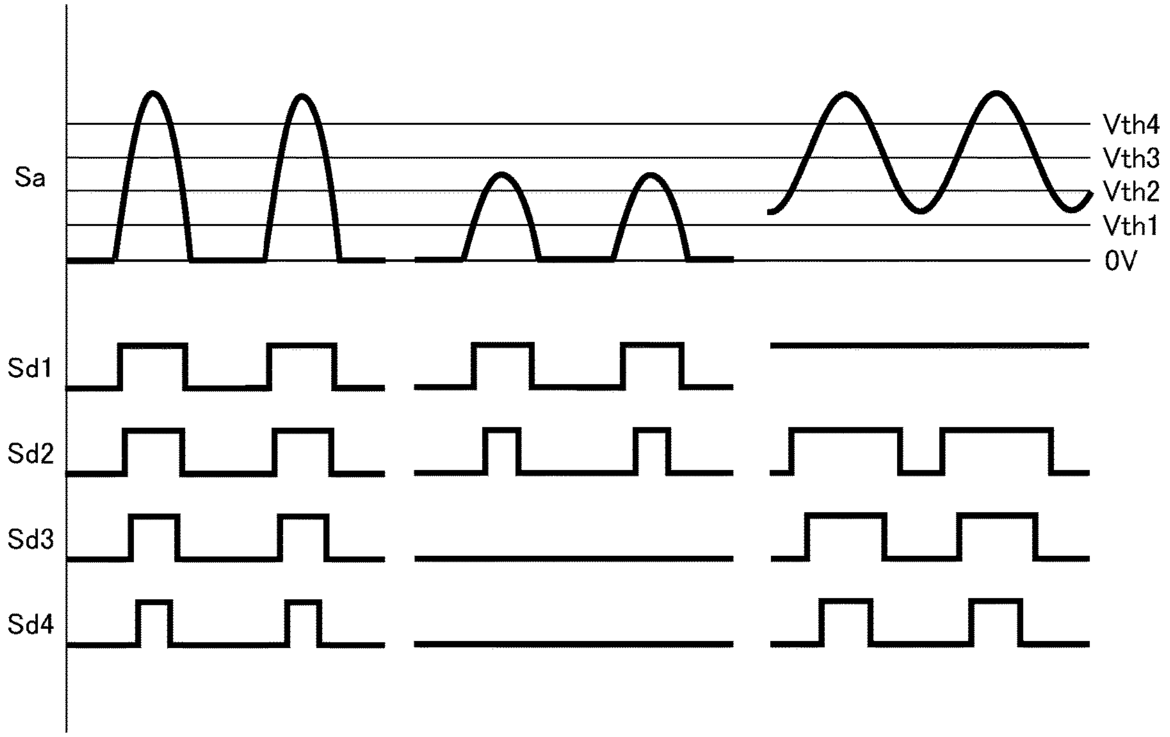
FIG. 12 is a diagram illustrating a normal determination example of an AC monitor signal.

FIG. 12 is a diagram illustrating a normal determination example of the AC monitor signal Sa, in which the AC monitor signal Sa and the comparison signals Sd1 to Sd4 are shown in order from top to bottom.

On the left side of this diagram, similarly to the time points t31 to t32 in FIG. 11, there is shown the manner in which the AC monitor signal Sa varies so as to cross over all the threshold values Vth1 to Vth4. In this case, periodical pulse edges occur in all the comparison signals Sd1 to Sd4, and it is determined that the AC monitor signal Sa is normal.

In contrast, in the middle of this diagram, there is shown the manner in which the AC monitor signal Sa varies so as to cross over only the threshold values Vth1 and Vth2 (here, the manner in which peak values of the half-wave rectified waveform are lower than the threshold value Vth3). In this case, although the comparison signals Sd3 and Sd4 are fixed to low level, periodical pulse edges occur in both the comparison signals Sd1 and Sd2, and hence it is determined that the AC monitor signal Sa is normal.

Further, on the right side of this diagram, there is shown the manner in which the AC monitor signal Sa varies so as to cross over the threshold values Vth2 to Vth4 (here, the manner in which lower peak values of the AC waveform are higher than the threshold value Vth1). In this case, although the comparison signal Sd1 is fixed to high level, periodical pulse edges occur in each of the comparison signals Sd2 to Sd4, and hence it is determined that the AC monitor signal Sa is normal.

In this way, with the comparing unit 180 having a plurality of channels, the AC waveform determination process can be performed appropriately for the AC monitor signal Sa having various normal waveforms.

Further, it is not necessarily required to perform the AC waveform determination process described above in combination with the peak detection process or the zero-crossing detection process, but it can be performed by itself.

Semiconductor Integrated Circuit Device (Third Embodiment)

Figure 13:
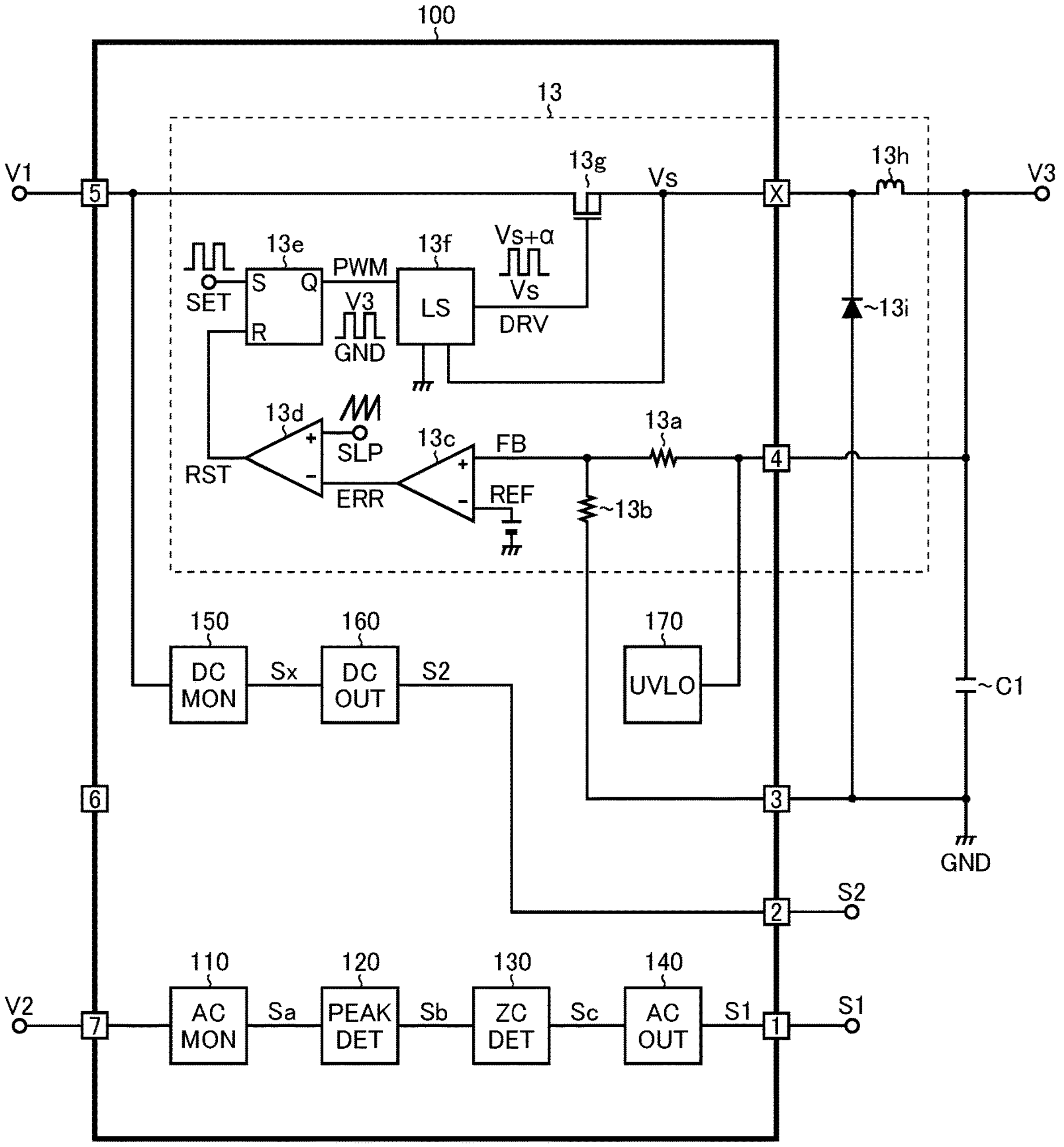
FIG. 13 is a diagram illustrating a third embodiment of the semiconductor integrated circuit device.

FIG. 13 is a diagram illustrating a third embodiment of the semiconductor integrated circuit device 100. The semiconductor integrated circuit device 100 of this embodiment is based on the first embodiment (FIG. 4) and further includes an integrated AC/DC converter 13 as a feature. Therefore, an element having the same structure as in the first embodiment is denoted by the same numeral or symbol as in FIG. 4 so that overlapping description is omitted. In the following description, characteristic parts of this embodiment are mainly described.

The semiconductor integrated circuit device 100 includes resistors 13*a* and 13*b*, an error amplifier 13*c*, a comparator 13*d*, an RS flip-flop 13*e*, a level shifter 13*f*, and an NMOSFET 13*g*, which are integrated, among circuit elements constituting the AC/DC converter 13.

Further, an external terminal (Pin X) is added to the semiconductor integrated circuit device 100 along with integration of the AC/DC converter 13. Note that a coil 13*h* and a diode 13*i* among circuit elements constituting the AC/DC converter 13 are externally connected to Pin X. Specifically, a first terminal of the coil 13*h* and a cathode of the diode 13*i* are connected to Pin X. A second terminal of the coil 13*h* is connected to the output terminal of the first DC voltage V3. An anode of the diode 13*i* is connected to Pin 3 (GND pin).

Inside the semiconductor integrated circuit device 100, the resistors 13*a* and 13*b* are connected in series between Pin 4 (VCC pin) and Pin 3 (GND pin), and function as a voltage divider circuit that outputs a feedback signal FB (i.e. a divided voltage of the first DC voltage V3) from the connection node of the resistors 13*a* and 13*b*.

The error amplifier 13*c* generates an error signal ERR in accordance with a difference between the feedback signal FB input to the noninverting input terminal (+) and a predetermined reference signal REF input to the inverting input terminal (−). The error signal ERR is higher as the difference between the feedback signal FB and the reference signal REF is larger, while it is lower as the difference between the feedback signal FB and the reference signal REF is smaller.

The comparator 13*d* compares a slope signal SLP having a sawtooth waveform (or a triangular waveform) input to the noninverting input terminal (+) with the error signal ERR input to the inverting input terminal (−), so as to generate a reset signal RST. The reset signal RST is high level when the slope signal SLP is higher than the error signal ERR, while it is low level when the slope signal SLP is lower than the error signal ERR.

The RS flip-flop 13*e* determines a logic level of a pulse width modulation signal PWM on the basis of both a set signal SET (i.e. a clock signal having a rectangular waveform oscillated at a predetermined switching frequency) input to a set terminal (S) and the reset signal RST input to a reset terminal (R), and outputs the pulse width modulation signal PWM from the output terminal (Q). For instance, the pulse width modulation signal PWM is set to high level when the set signal SET rises to high level, while it is reset to low level when the reset signal RST rises to high level.

The level shifter 13*f* performs level shift of the pulse width modulation signal PWM (H=V3 and L=GND) so as to generate a drive signal DRV (H=Vs+α and L=Vs, where Vs denotes a source voltage of the NMOSFET 13*g* at Pin X).

The NMOSFET 13*g* is connected between Pin 5 (VHDC pin) and Pin X, and it is an output switching element that is turned on and off by the drive signal DRV.

In this way, the AC/DC converter 13 is packed into a single package of the semiconductor integrated circuit device 100, and hence the number of components can be reduced.

Note that the example based on the first embodiment (FIG. 4) is described in this embodiment, but it may be based on the second embodiment (FIG. 10).

Semiconductor Integrated Circuit Device (Fourth Embodiment)

Figure 14:
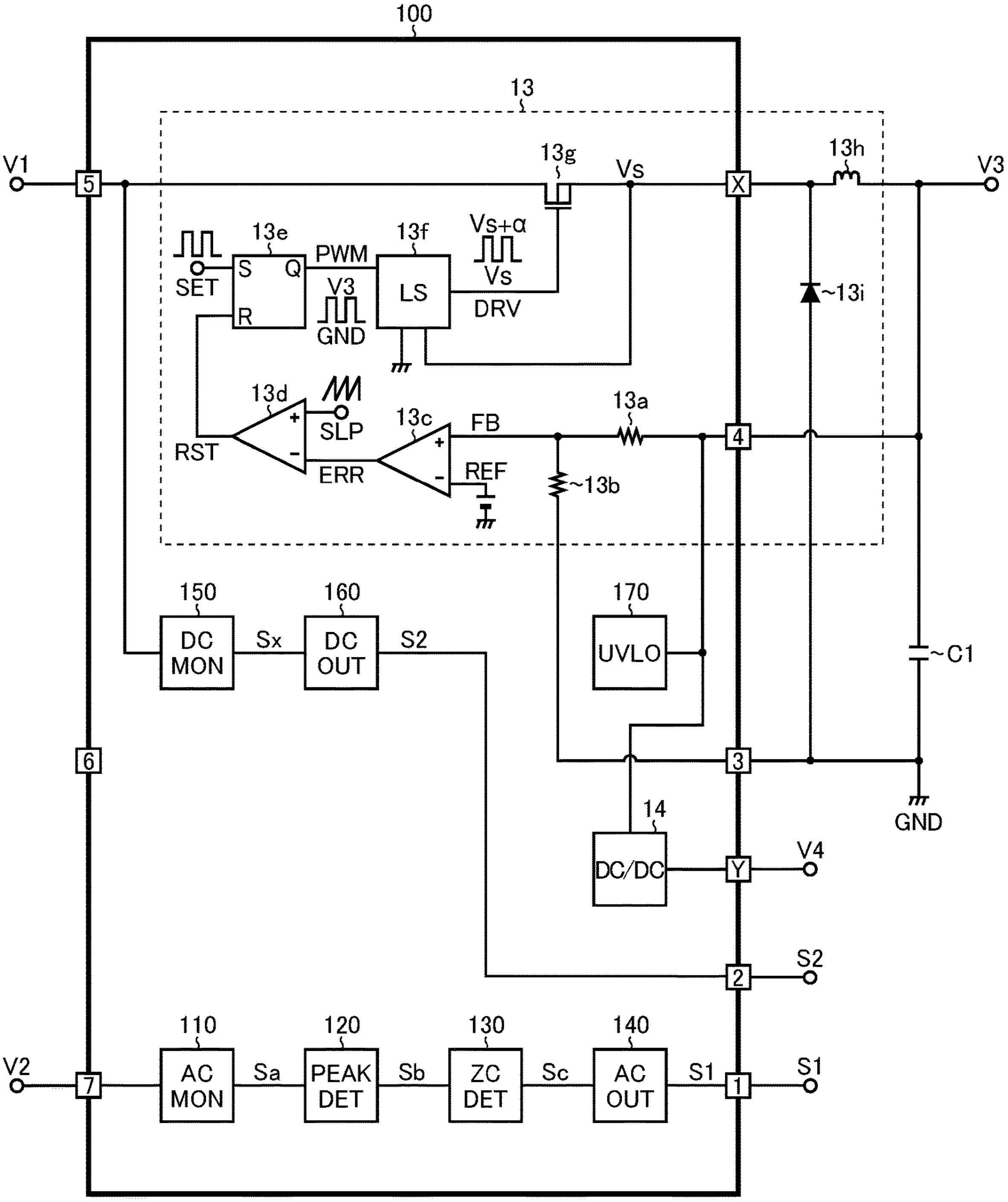
FIG. 14 is a diagram illustrating a fourth embodiment of the semiconductor integrated circuit device.

FIG. 14 is a diagram illustrating a fourth embodiment of the semiconductor integrated circuit device 100. The semiconductor integrated circuit device 100 of this embodiment is based on the third embodiment (FIG. 13) and further includes an integrated DC/DC converter 14 as a feature. Note that an external terminal (Pin Y) to output the second DC voltage V4 is added to the semiconductor integrated circuit device 100 of this embodiment along with integration of the DC/DC converter 14. In this way, not only the AC/DC converter 13 but also the DC/DC converter 14 is packed into a single package, and hence the number of components can be further reduced.

<Package>

Figure 15:
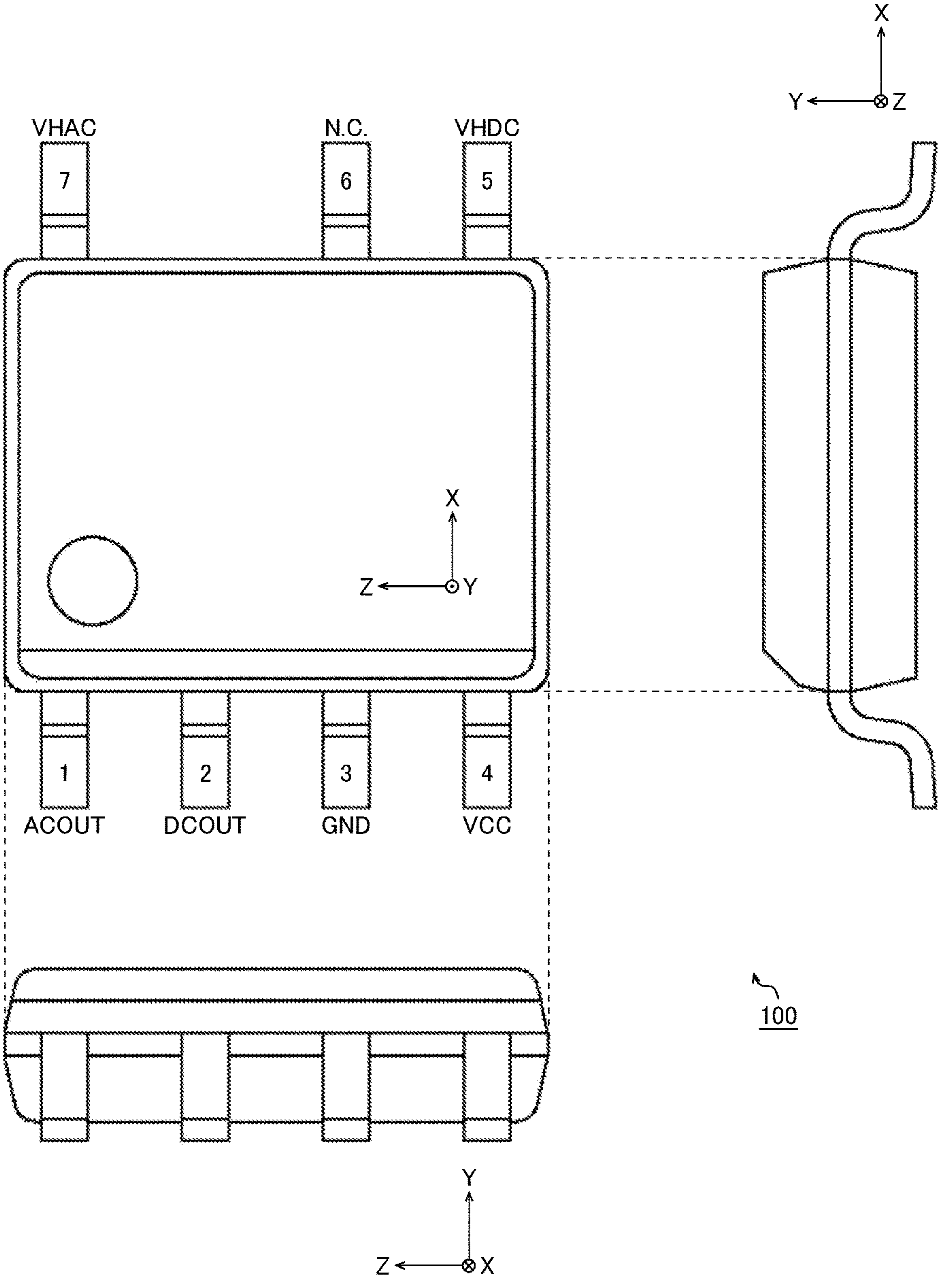
FIG. 15 is an external view illustrating a package of the semiconductor integrated circuit device.

FIG. 15 is an external view showing a package of the semiconductor integrated circuit device 100. This diagram shows an example of a small outline package (SOP) in which external terminals extend in two directions from long sides of the package.

Pin 1 (ACOUT pin), Pin 2 (DCOUT pin), Pin 3 (GND pin), and Pin 4 (VCC pin) are low withstand voltage terminals to which the rectified voltage V1 or the monitoring target voltage V2 is not applied (Pin 1 and Pin 2 have a withstand voltage of 5 V, and Pin 3 and Pin 4 have a withstand voltage of 30 V), and are arranged on a first side of the package.

In contrast, Pin 5 (VHDC pin) and Pin 7 (VHAC pin) are high withstand voltage terminals (having a withstand voltage of 700 V) to which the rectified voltage V1 and the monitoring target voltage V2 are applied, and are arranged on a second side of the package. With this pin assignment, creepage distances for insulation can be secured between Pin 1 to Pin 4 and Pin 5 or Pin 7, and hence insulation between the pins can be easily secured.

Note that an external terminal that is originally to be disposed between Pin 7 (VHAC pin) and Pin 6 (N.C. pin) is eliminated. Therefore, an inter-terminal distance between Pin 7 and neighboring Pin 6 is larger than that between neighboring pins of Pin 1 to Pin 4. Further, ignoring Pin 6 that is not used, the inter-terminal distance between Pin 5 and Pin 7 is naturally larger than that between neighboring pins of Pin 1 to Pin 4. With this pin assignment, insulation between the pins on the second side can also be sufficiently secured.

Package Layout (First Example)

Figure 16:
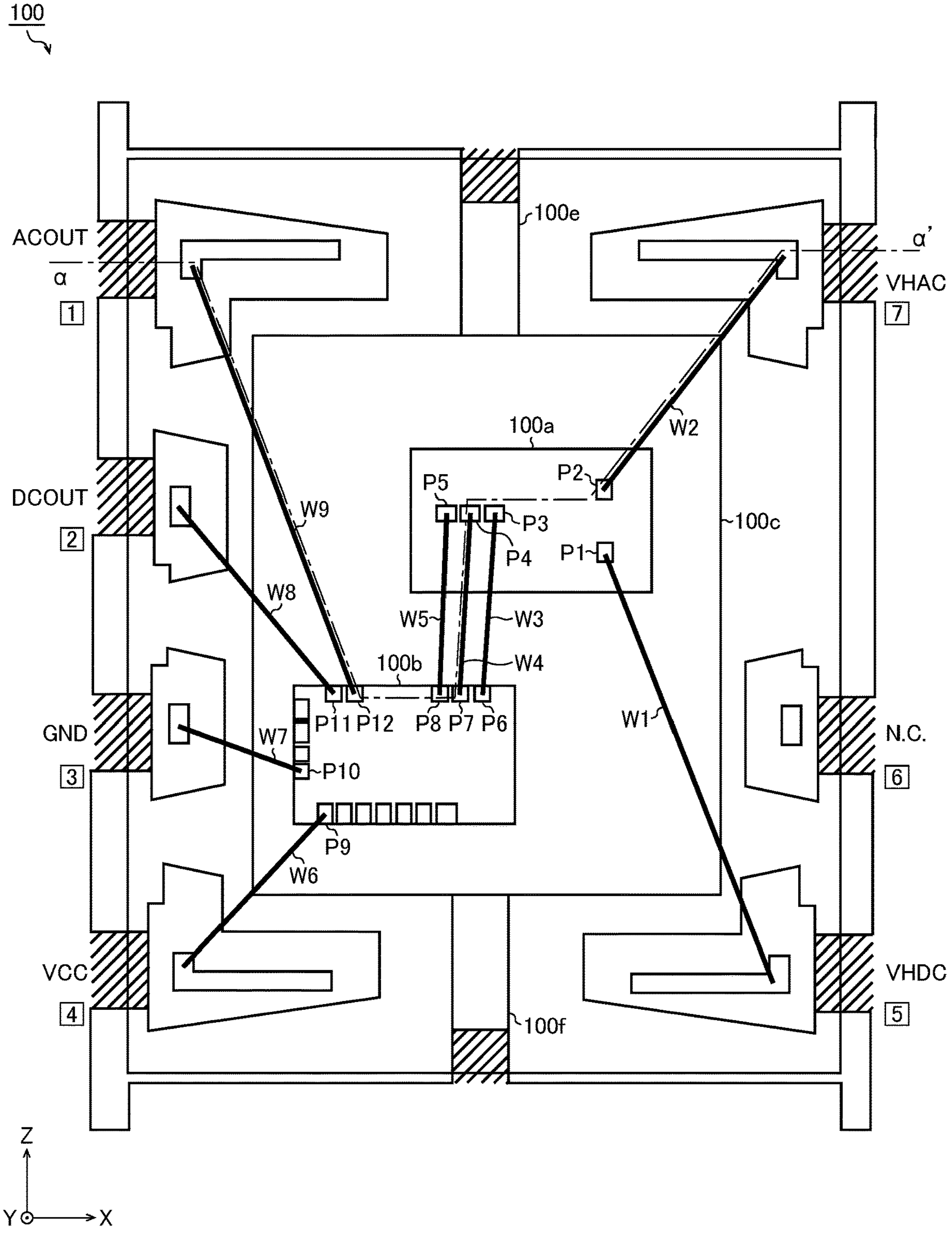
FIG. 16 is a diagram illustrating a first example of a package layout.

FIG. 16 is a diagram illustrating a first example of the package layout (an XZ plan view). In the semiconductor integrated circuit device 100 of this diagram, a first chip 100*a* and a second chip 100*b* are mounted on an island 100*c*.

Figure 17:
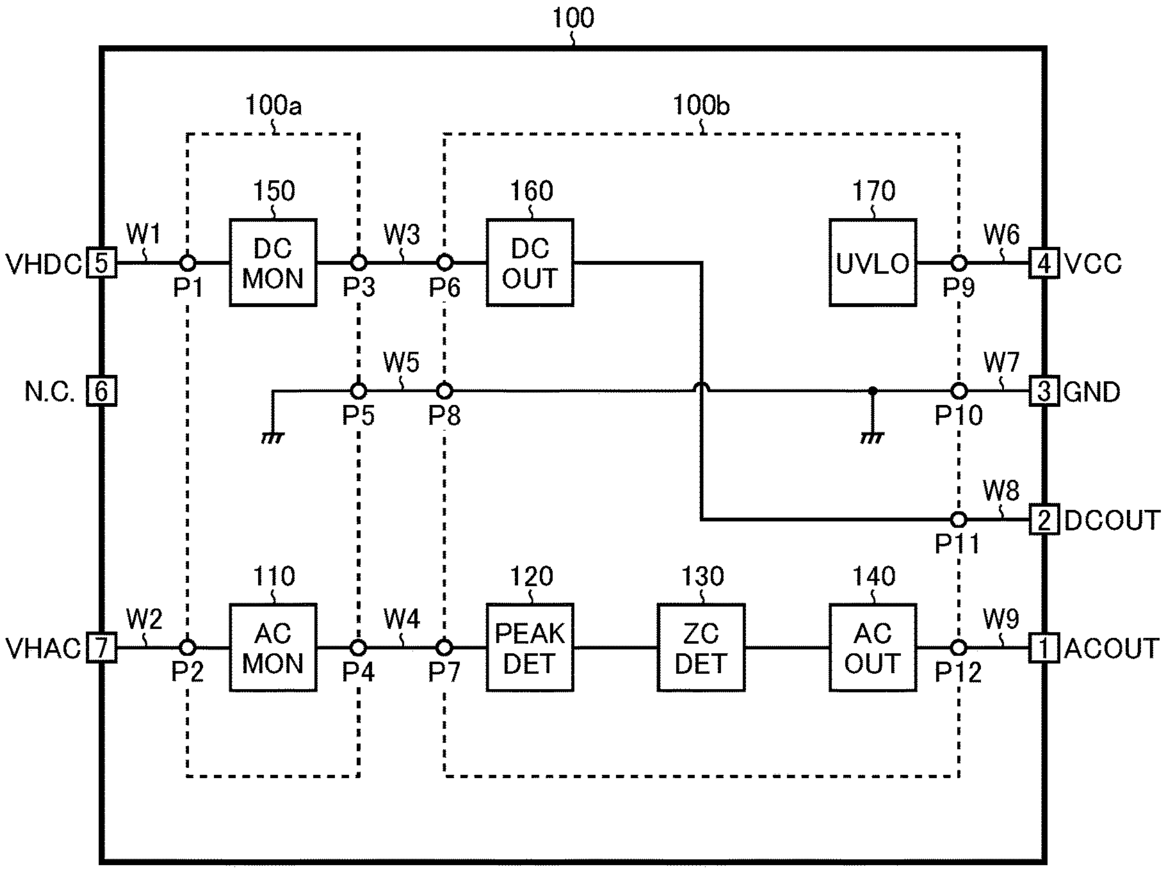
FIG. 17 is a diagram illustrating internal structures of a first chip and a second chip.

First, internal structures of the first chip 100*a* and the second chip 100*b* are described in detail with reference to the drawings. FIG. 17 is a diagram illustrating internal structures of the first chip 100*a* and the second chip 100*b*, in which one example based on the first embodiment (FIG. 4) is shown.

The first chip 100*a* includes the AC monitoring unit 110 and the DC monitoring unit 150, which are integrated. Further, the first chip 100*a* has Pad P1 to Pad P5 as means for establishing electric connection with outside of the chip. Inside the first chip 100*a*, Pad P1 is connected to an input terminal of the DC monitoring unit 150. Pad P2 is connected to an input terminal of the AC monitoring unit 110. Pad P3 is connected to an output terminal of the DC monitoring unit 150. Pad P4 is connected to an output terminal of the AC monitoring unit 110. Pad P5 is connected to a ground line.

In contrast, the second chip 100*b* includes the peak detection unit 120, the zero-crossing detection unit 130, the first output unit 140, the second output unit 160, and the undervoltage protection unit 170, which are integrated. Further, the second chip 100*b* has Pad P6 to Pad P12 as means for establishing electric connection with outside of the chip. Inside the second chip 100*b*, Pad P6 is connected to an input terminal of the second output unit 160. Pad P7 is connected to an input terminal of the peak detection unit 120. Pad P8 is connected to the ground line. Pad P9 is connected to an input terminal of the undervoltage protection unit 170 (i.e. a power supply line). Pad P10 is connected to the ground line. Pad P11 is connected to an output terminal of the second output unit 160. Pad P12 is connected to an output terminal of the first output unit 140.

Note that when the second embodiment (FIG. 10) is the base, the comparing unit 180 and the AC waveform determination unit 190 should also be integrated in the second chip 100*b*.

With reference to FIG. 16 again, description of the package layout is continued. Pad P1 is connected to Pin 5 (VHDC pin) via a wire W1. Pad P2 is connected to Pin 7 (VHAC pin) via a wire W2. Pad P3 is connected to Pad P6 via a wire W3. Pad P4 is connected to Pin P7 via a wire W4. Pad P5 is connected to Pin P8 via a wire W5. Pad P9 is connected to Pin 4 (VCC pin) via a wire W6. Pad P10 is connected to Pin 3 (GND pin) via a wire W7. Pad P11 is connected to Pin 2 (DCOUT pin) via a wire W8. Pad P12 is connected to Pin 1 (ACOUT pin) via a wire W9.

Note that as to frame areas inside the package, each of Pin 1 (ACOUT pin), Pin 4 (VCC pin), Pin 5 (VHDC pin), and Pin 7 (VHAC pin) is larger than each of Pin 2 (DCOUT pin), Pin 3 (GND pin), and Pin 6 (N.C. pin).

In other words, as to the X direction (i.e. the left and right direction on the paper), Pin 1 (ACOUT pin) and Pin 4 (VCC pin) have portions protruding than Pin 2 (DCOUT pin) and Pin 3 (GND pin). Similarly, Pin 5 (VHDC pin) and Pin 7 (VHAC pin) have portions protruding than Pin 6 (N.C. pin).

Further, as to the Z direction (i.e. the up and down direction on the paper), Pin 1 (ACOUT pin) and Pin 4 (VCC pin) overlap partially with the island 100*c*. Similarly, Pin 5 (VHDC pin) and Pin 7 (VHAC pin) overlap partially with the island 100*c*.

Furthermore, support frames 100*e* and 100*f* for supporting the island 100*c* are formed respectively between Pin 1 (ACOUT pin) and Pin 7 (VHAC pin) and between Pin 4 (VCC pin) and Pin 5 (VHDC pin).

Note that in the package layout of this diagram, the first chip 100*a* is disposed close to the second side (i.e. close to Pin 5 to Pin 7) on the island 100*c*, while the second chip 100*b* is disposed close to the first side (i.e. close to Pin 1 to Pin 4). By adopting this package layout, the wires W1 to W9 can be as short as possible.

Next, the reason why the semiconductor integrated circuit device 100 is constituted not with a single chip structure but with a double chip structure is described. If the AC monitoring unit 110 and the DC monitoring unit 150 both dealing with high voltage and other circuit units (120 to 140, 160, and 170) dealing with low voltage are integrated in a single chip, it is required to dispose a buffer area between a high withstand voltage processing area and a low withstand voltage processing area. Therefore, the chip size becomes very large, so that substantial cost increase is caused.

In contrast, if the semiconductor integrated circuit device 100 is constituted with a double chip structure, it is not required to dispose a buffer area in each of the first chip 100*a* and the second chip 100*b*. Therefore, the chip size can be reduced, and as a result, cost reduction can be achieved. Further, the first chip 100*a* and the second chip 100*b* are separated, which is very advantageous to withstand voltage, too.

Next, a ground route of the first chip 100*a* is described. Pin 3 (GND pin) is disposed between Pin 2 (DCOUT pin) and Pin 4 (VCC pin), as a shield member for blocking noise propagation from Pin 4 (VCC pin) to Pin 2 (DCOUT pin) or Pin 1 (ACOUT pin). Therefore, if trying to wire bond directly from Pad P5 (i.e. ground pad) of the first chip 100*a* to Pin 3 (GND pin), it inevitably interferes with the wire W8 from Pad P11 of the second chip 100*b* to Pin 2 (DCOUT pin) or the wire W9 from Pad P12 to Pin 1 (ACOUT pin).

Therefore, Pad P5 (i.e. ground pad) of the first chip 100*a* is not wire bonded directly to Pin 3 (GND pin) but is wire bonded to Pad P8 of the second chip 100*b* via the wire W5. As illustrated in FIG. 17 described above, Pad P8 is connected to Pad P10 (i.e. ground pad) of the second chip 100*b* via a GND line formed inside the second chip 100*b*, and is further connected to Pin 3 (GND pin) via the wire W7. Therefore, the ground line of the first chip 100*a* is connected to Pin 3 (GND) via Pad P5, the wire W5, Pad P8, the ground line formed inside the second chip 100*b*, Pad P10, and the wire W7. This ground route can avoid interference with the wire W8 or W9.

Figure 18:
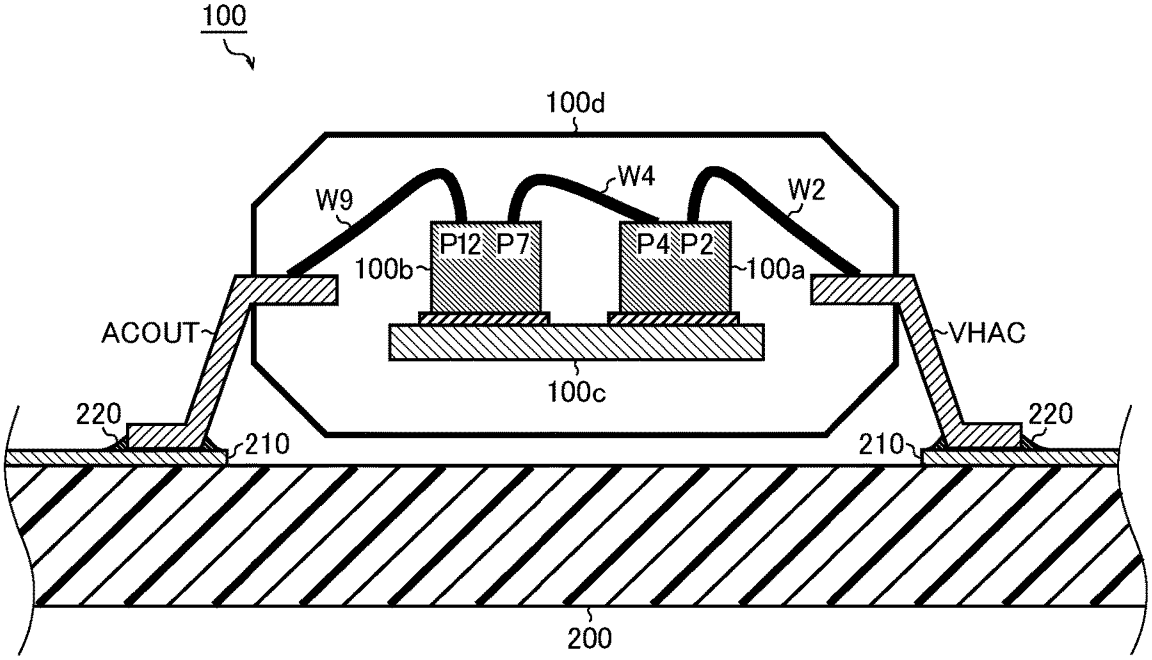
FIG. 18 is a diagram schematically illustrating an α-α' cross section.

FIG. 18 is a diagram schematically illustrating an α-α' cross section of FIG. 16. If the semiconductor integrated circuit device 100 is cut along the α-α' line, it is understood from this diagram that a signal path from Pin 7 (VHAC pin)

to Pin 1 (ACOUT pin) is formed via the wire W2, Pad P2 and Pad P4 of the first chip 100*a*, the wire W4, Pad P7 and Pad P12 of the second chip 100*b*, and the wire W9.

Further, it is also clearly understood from this diagram that the first chip 100*a* and the second chip 100*b* are disposed on the common island 100*c* and are sealed with mold resin 100*d*.

Furthermore, it is also clear from this diagram that the external terminals of the semiconductor integrated circuit device 100 are soldered to copper wire 210 of a printed wiring board 200 with solder 220.

Package Layout (Second Example)

Figure 19:
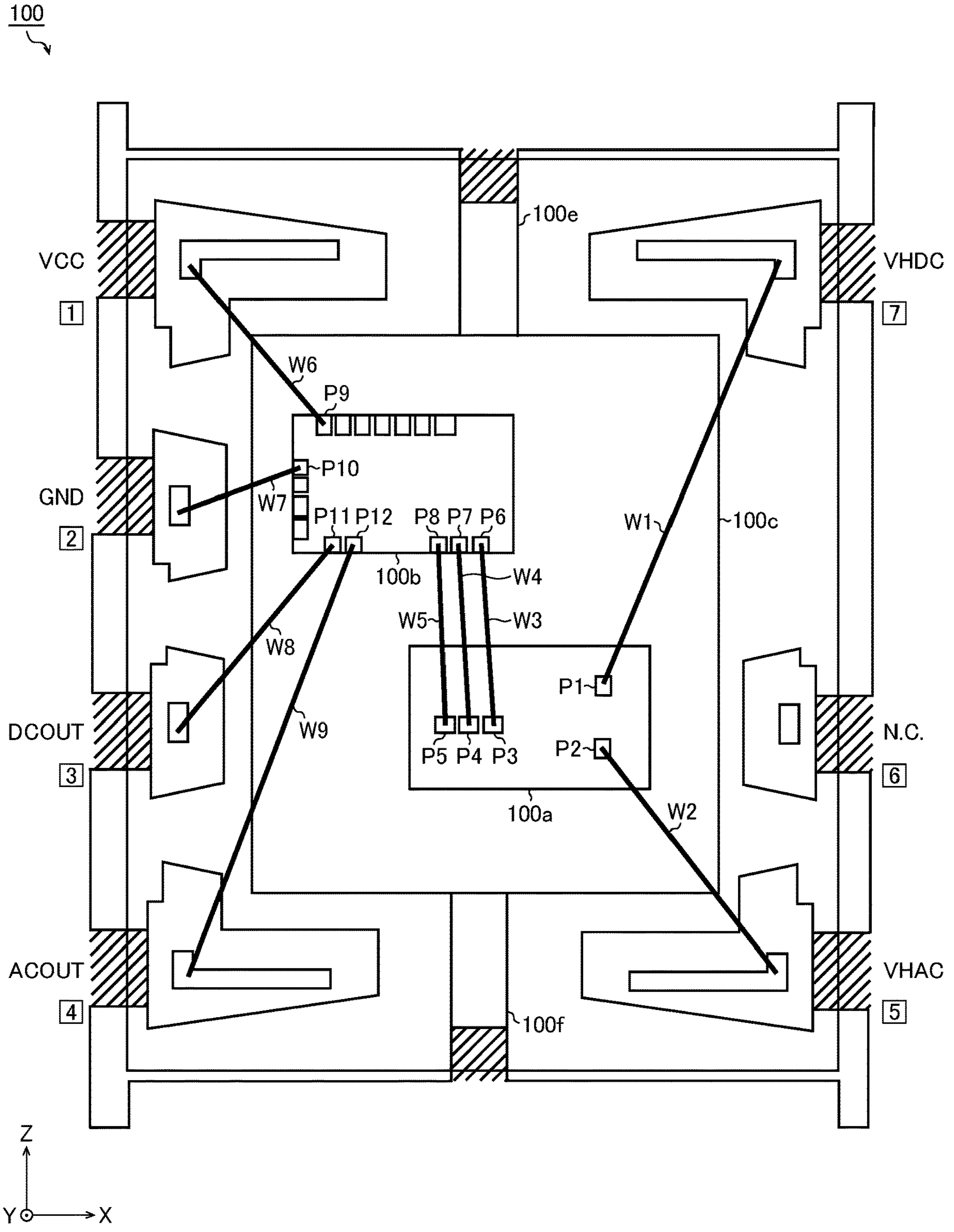
FIG. 19 is a diagram illustrating a second example of the package layout.

FIG. 19 is a diagram illustrating a second example of the package layout. As illustrated in this diagram, the positional relationship between the first chip 100*a* and the second chip 100*b* along the Z-axis direction can be opposite to that in the first example (FIG. 16) described above.

More specifically, in the first example (FIG. 16), on the island 100*c*, the first chip 100*a* is disposed close to the upper side on the paper, while the second chip 100*b* is disposed close to the lower side on the paper. In contrast, in the second example (FIG. 19), on the same island 100*c*, the first chip 100*a* is disposed close to the lower side on the paper, while the second chip 100*b* is disposed close to the upper side on the paper.

Note that when changing the chip layout described above, it is preferred to appropriately change pin functions and the pad arrangement as illustrated in the diagram so that no obstruction occurs in wire bonding between pins and pads.

Further, as to frame areas inside the package, each of Pin 1 (VCC pin), Pin 4 (ACOUT pin), Pin 5 (VHAC pin), and Pin 7 (VHDC pin) is larger than Pin 2 (GND pin), Pin 3 (DCOUT pin), or Pin 6 (N.C. pin).

In other words, as to the X direction (i.e. the left and right direction on the paper), Pin 1 (VCC pin) and Pin 4 (ACOUT pin) have portions protruding than Pin 2 (GND pin) and Pin 3 (DCOUT pin). Similarly, Pin 5 (VHAC pin) and Pin 7 (VHDC pin) have portions protruding than Pin 6 (N.C. pin).

Further, as to the Z direction (i.e. the up and down direction on the paper), Pin 1 (VCC pin) and Pin 4 (ACOUT pin) overlap partially with the island 100*c*. Similarly, Pin 5 (VHAC pin) and Pin 7 (VHDC pin) overlap partially with the island 100*c*.

Furthermore, the support frames 100*e* and 100*f* for supporting the island 100*c* are formed respectively between Pin 1 (VCC pin) and Pin 7 (VHDC pin) and between Pin 4 (ACOUT pin) and Pin 5 (VHAC pin).

Electronic Equipment (Third Structural Example and Fourth Structural Example)

Figure 20:
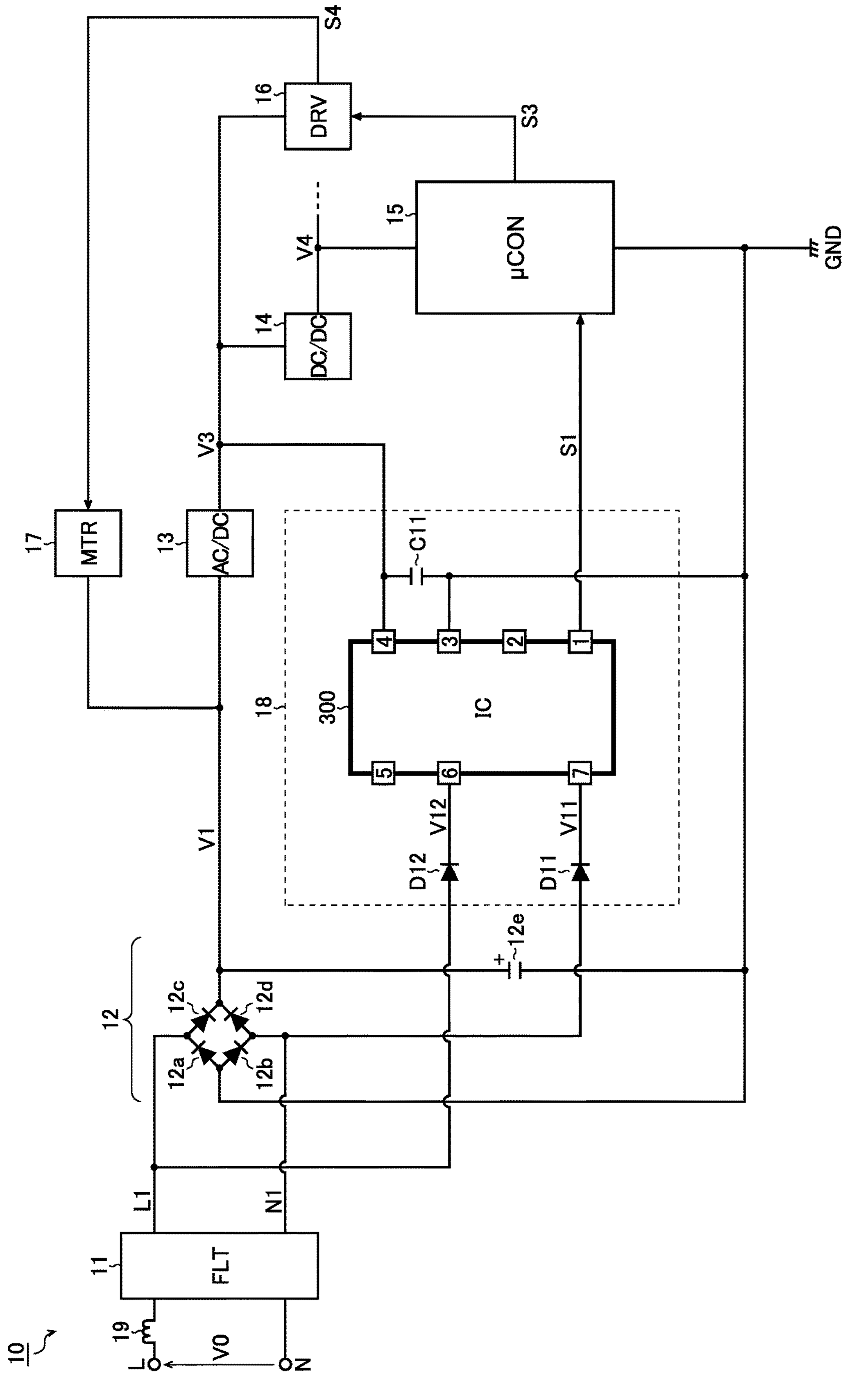
FIG. 20 is a diagram illustrating a third structural example (normal rectifying) of the electronic equipment.
Figure 21:
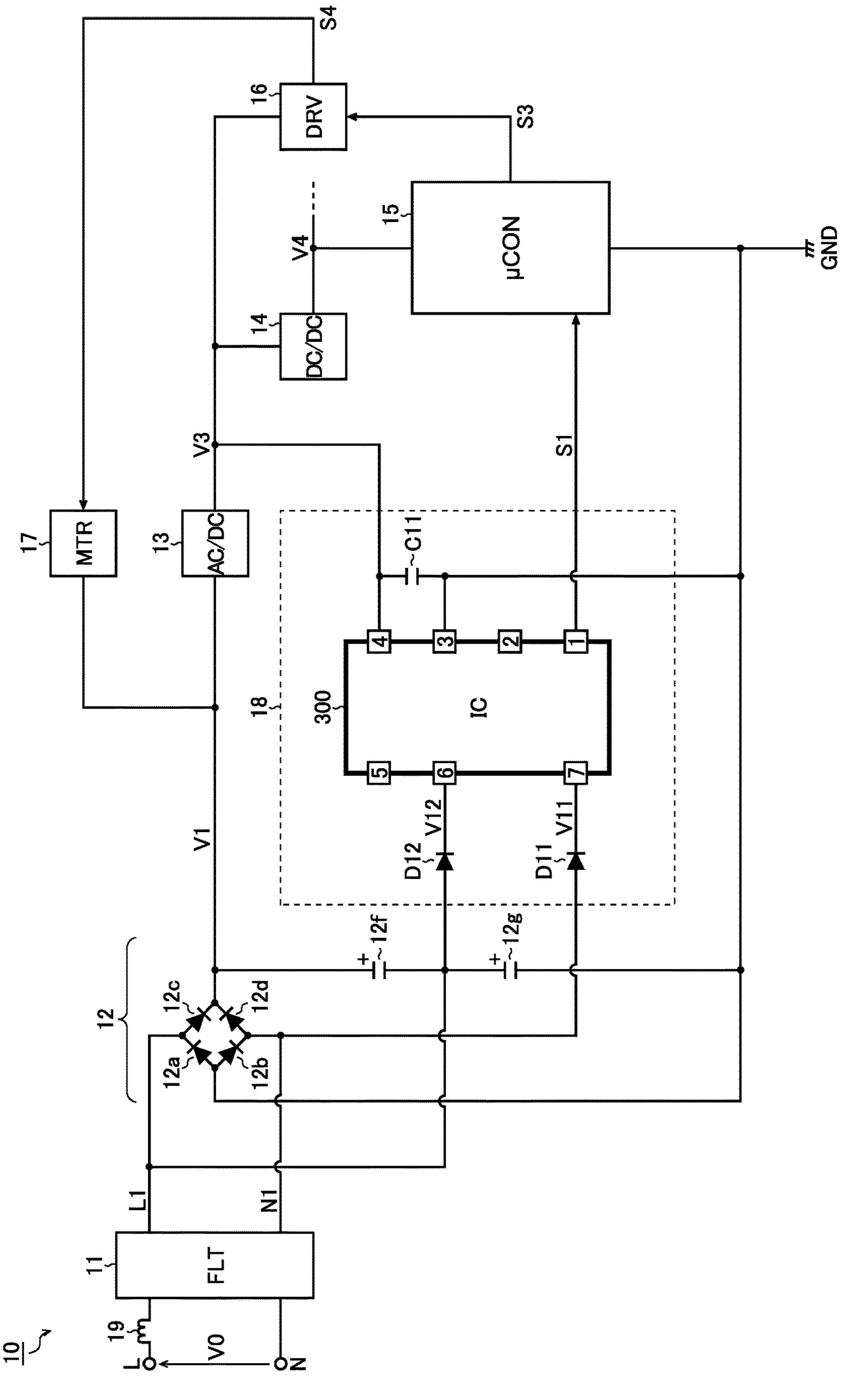
FIG. 21 is a diagram illustrating a fourth structural example (voltage doubler rectifying) of the electronic equipment.

FIGS. 20 and 21 are diagrams respectively illustrating a third structural example (normal rectifying method) and a fourth structural example (voltage doubler rectifying method) of the electronic equipment 10. The electronic equipment 10 of these structural examples are respectively based on the first structural example (FIG. 1) and the second structural example (FIG. 2) described above, and are different from them in that the structure of the zero-crossing detection circuit 18 is modified and that an input reactor 19 is added.

Therefore, an element having the same structure as in the first structural example and the second structural example is denoted by the same numeral or symbol as in FIGS. 1 and 2 so that overlapping description is omitted. In the following description, characteristic parts of the third structural example and the fourth structural example are mainly described.

As described above, the zero-crossing detection circuit 18 is a circuit block that detects a zero cross of the AC voltage V0, and it includes a semiconductor integrated circuit device 300, and diodes D11 and D12, and a capacitor C11, which are externally connected to the semiconductor integrated circuit device 300.

The semiconductor integrated circuit device 300 is an IC or an LSI including at least a part of circuit elements forming the zero-crossing detection circuit 18 (details will be described later), which are integrated, and it has seven external terminals (Pin 1 to Pin 7) as means for establishing electric connection with outside of the device.

Pin 1 (ACOUT pin) is the output terminal of the ACOUT signal S1 and is connected to the microcomputer 15. Pin 2 (N.C. pin) is a not used terminal and is not connected to anywhere outside the semiconductor integrated circuit device 300. Pin 3 (GND pin) is a ground terminal and is connected to the ground terminal GND that is common to the microcomputer 15. In other words, the semiconductor integrated circuit device 300 (therefore the zero-crossing detection circuit 18 using the same) operates with respect to the ground voltage common to the microcomputer 15. Pin 4 (VCC pin) is a power supply terminal and is connected to the output terminal of the AC/DC converter 13 (i.e. the output terminal of the first DC voltage V3). Note that the capacitor C11 is connected between Pin 4 and Pin 3.

Pin 5 (N.C. pin) is a not used terminal and is not connected to anywhere outside the semiconductor integrated circuit device 300. Pin 6 (VHAC2 pin) is a second AC input terminal and is connected to a cathode of the diode D12 (corresponding to an input terminal of the monitoring target voltage V12). An anode of the diode D12 is connected to the L1 terminal (corresponding to a second node). Pin 7 (VHAC1 pin) is a first AC input terminal and is connected to a cathode of the diode D11 (corresponding to an input terminal of the monitoring target voltage V11). An anode of the diode D11 is connected to the N1 terminal (corresponding to a first node).

Note that if the rectifying unit 12 adopts the normal rectifying method (FIG. 20), the terminal voltages at the L1 terminal and at the N1 terminal are equivalent to each other. Therefore, there is no problem if anode connection destinations of the diodes D11 and D12 are exchanged with each other.

Further, anode connection destinations of the diodes D11 and D12 are not necessarily limited to the L1 terminal and the N1 terminal. The monitoring target voltages V11 and V12 can be taken out from arbitrary nodes between which the AC voltage V0 is applied, regardless of a preceding stage or a subsequent stage of the input reactor 19.

The input reactor 19 is disposed aiming at improvement of an input power factor, reduction of harmonics, reduction of motor noise, and the like. Note that this diagram illustrates an example in which the input reactor 19 is disposed on the preceding stage (L terminal side) of the filter 11, but the position thereof is not limited to this. It may be disposed on the N terminal side or on the subsequent stage of the filter 11.

Semiconductor Integrated Circuit Device (Fifth Embodiment)

Figure 22:
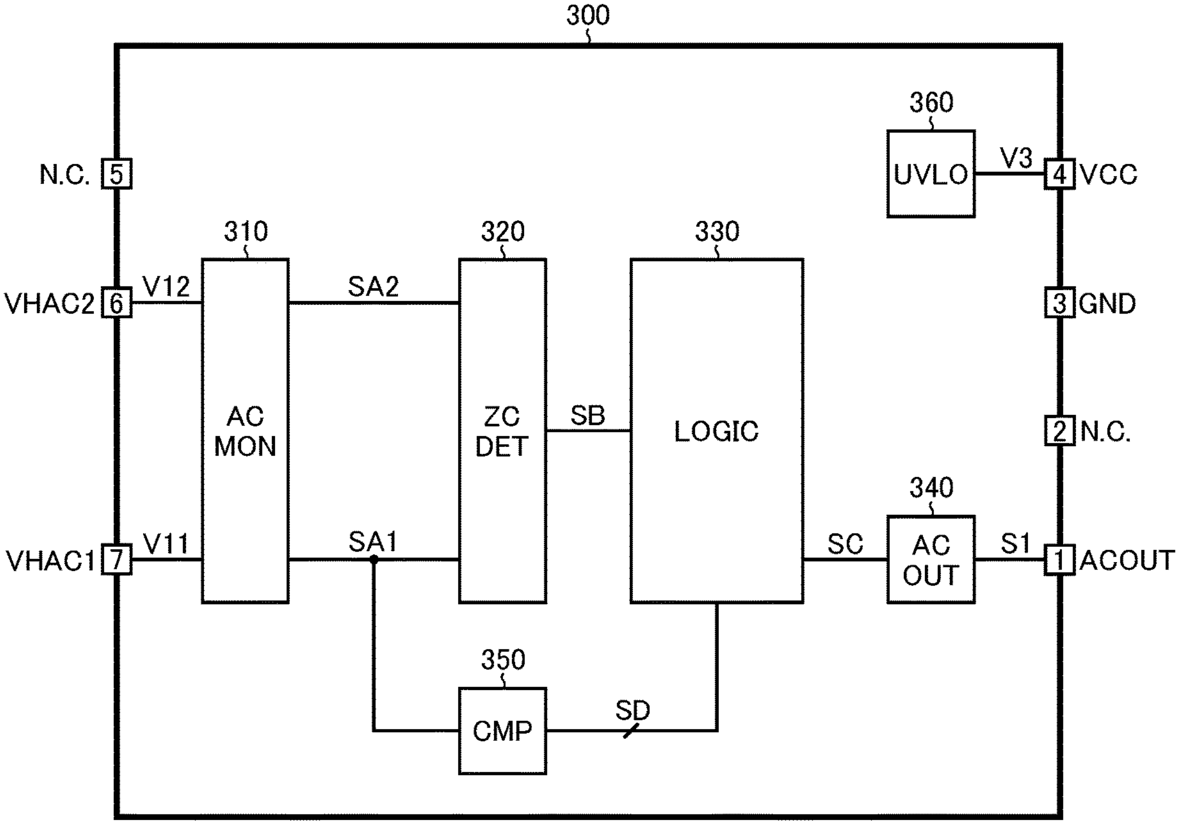
FIG. 22 is a diagram illustrating a fifth embodiment of the semiconductor integrated circuit device.

FIG. 22 is a diagram illustrating a fifth embodiment of the semiconductor integrated circuit device 300. As illustrated in this diagram, the semiconductor integrated circuit device 300 of this embodiment includes an AC monitoring unit 310, a zero-crossing detection unit 320, a logic unit 330, a first output unit 340, a comparing unit 350, and an undervoltage protection unit 360, which are integrated.

The AC monitoring unit 310 is a high-voltage circuit unit (having a withstand voltage of 650 V, for example), which generates AC monitor signals SA1 and SA2 suitable for input to the zero-crossing detection unit 320 from the monitoring target voltage V11 input to Pin 7 (VHAC1 pin) and the monitoring target voltage V12 input to Pin 6 (VHAC2 pin), respectively. Note that the monitoring target voltages V11 and V12 respectively correspond to the first monitoring target signal and the second monitoring target signal input via the diodes D1 and D12 from the N1 terminal and the L1 terminal between which the AC voltage V0 is applied.

The zero-crossing detection unit 320 compares the AC monitor signal SA1 with the AC monitor signal SA2 so as to generate a comparison signal SB.

The logic unit 330 estimates a zero cross of the AC voltage V0 from the comparison signal SB, so as to generate a zero-crossing detection signal SC. Further, the logic unit 330 also has a function to stop generation or output of the zero-crossing detection signal SC in accordance with a detection result of the comparison signal SD (i.e. an AC waveform determination function). This AC waveform determination function is basically the same as the function of the AC waveform determination unit 190 described above, and overlapping description is omitted.

The first output unit 340 receives input of the zero-crossing detection signal SC, so as to generate the ACOUT signal S1, and outputs the ACOUT signal S1 to Pin 1 (ACOUT pin). Note that the first output unit 340 should have basically the same structure as the first output unit 140 of FIG. 7. In other words, the "zero-crossing detection signal Sc" in FIG. 7 can be replaced by the "zero-crossing detection signal SC", so that a structure and an operation of the first output unit 340 can be understood.

The comparing unit 350 compares the AC monitor signal SA1 with each of a plurality of threshold values, so as to generate a plurality of comparison signals SD. Note that the comparing unit 350 should have basically the same structure as the comparing unit 180 of FIG. 10. In other words, the "AC monitor signal Sa" of FIG. 10 can be replaced by the "AC monitor signal SA1", and the "comparison signals Sd1 to Sd4" can be replaced by the "comparison signal SD", so that a structure and an operation of the comparing unit 350 can be understood. Concerning the plurality of threshold values to be compared with the AC monitor signal SA1, not only the threshold value for detecting an instantaneous power failure, but also a threshold value for detecting UVLO, for example, can be set.

The undervoltage protection unit 360 is a protection function unit (so-called UVLO protection unit), which disables operation of the semiconductor integrated circuit device 300 when the first DC voltage V3 input to Pin 4 (VCC) is lower than a lower limit value.

Zero-Crossing Detection Unit (First Example)

Figure 23:
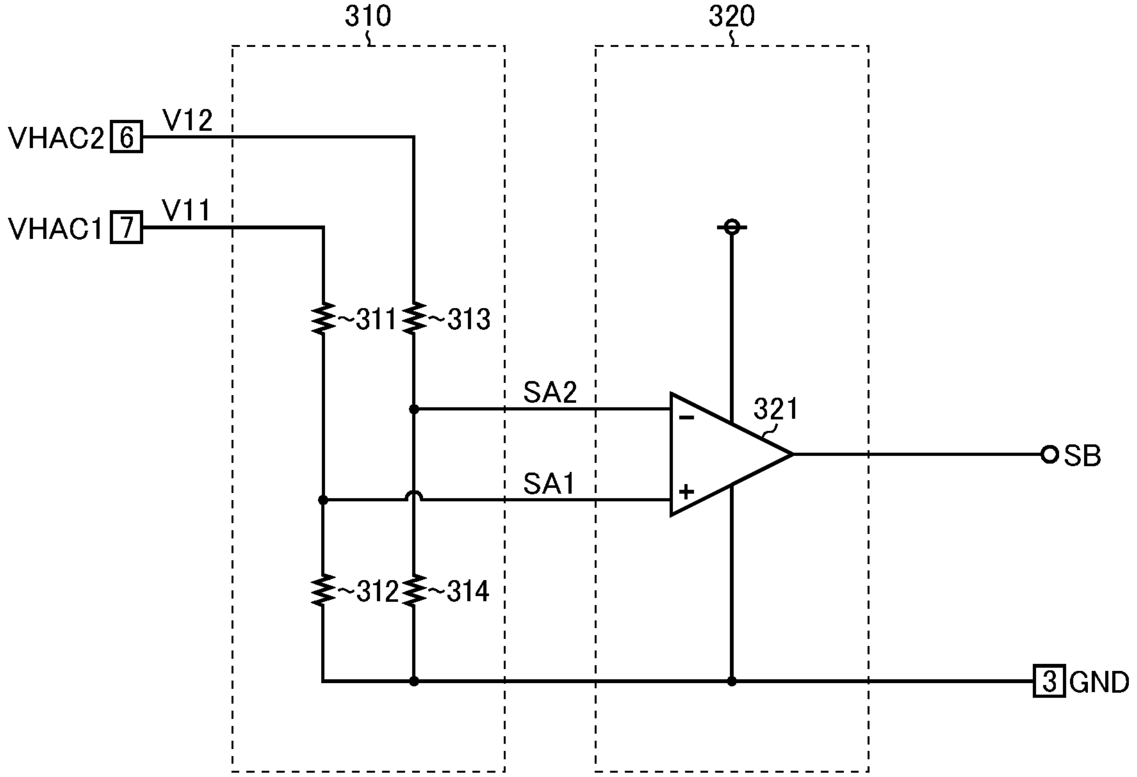
FIG. 23 is a diagram illustrating a first example of a zero-crossing detection unit.

FIG. 23 is a diagram illustrating a first example of the zero-crossing detection unit 320. The zero-crossing detection unit 320 of this example includes a comparator 321, which compares the AC monitor signal SA1 input to the noninverting input terminal (+) with the AC monitor signal SA2 input to the inverting input terminal (−), so as to generate the comparison signal SB. The comparison signal SB is high level when SA1>SA2 holds, while it is low level when SA1<SA2 holds.

The AC monitoring unit 310 disposed on a preceding stage of the zero-crossing detection unit 320 includes resistors 311 to 314. The resistors 311 and 312 are connected in series between Pin 7 (VHAC1) and Pin 3 (GND), so as to output the AC monitor signal SA1 (corresponding to a divided voltage of the monitoring target voltage V11) from the connection node of the resistors 311 and 312. The resistors 313 and 134 are connected in series between Pin 6 (VHAC2) and Pin 3 (GND), so as to output the AC monitor signal SA2 (corresponding to a divided voltage of the monitoring target voltage V12) from the connection node of the resistors 313 and 134.

Note that in this diagram, only the resistors 311 to 314 are shown as structural elements of the AC monitoring unit 310 for simple description, but in reality, similarly to the AC monitoring unit 110 of FIG. 5, various electrostatic protection elements are preferably included.

Zero-Crossing Detection Process (First to Third Examples)

Figure 24:
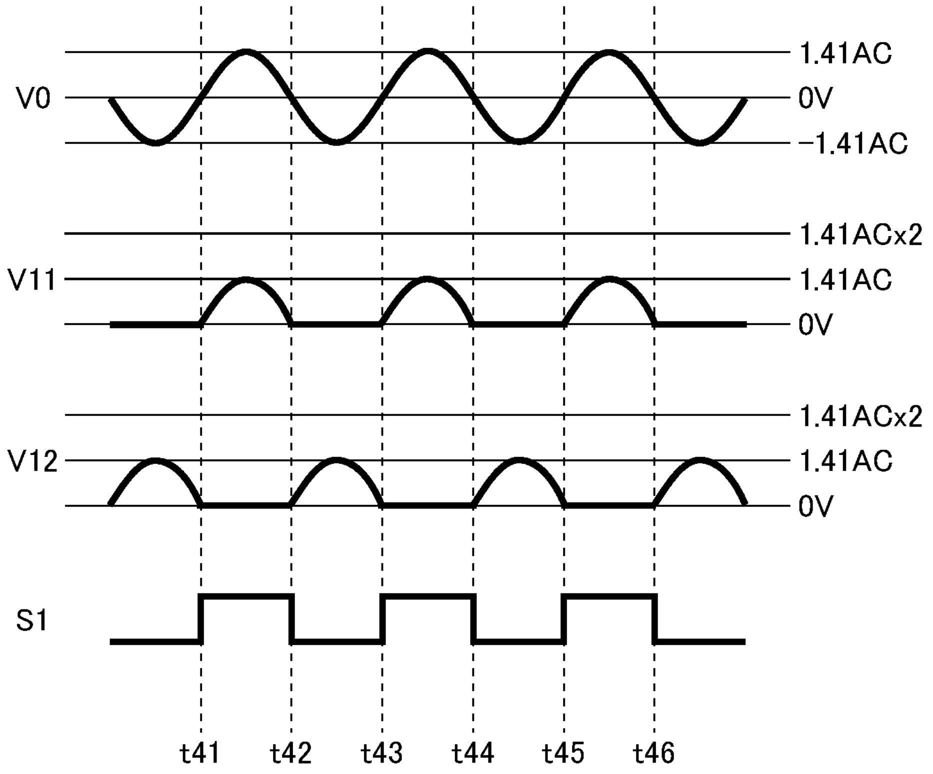
FIG. 24 is a timing chart showing a first example of the zero-crossing detection process.

Next, the zero-crossing detection process by the semiconductor integrated circuit device 300 is described. FIG. 24 is a timing chart showing a first example of the zero-crossing detection process, in which the AC voltage V0, the monitoring target voltages V11 and V12, and the ACOUT signal S1 are shown in order from top to bottom. In particular, this diagram shows an ideal state in which the monitoring target voltages V11 and V12 cross each other at a zero cross of the AC voltage V0.

The semiconductor integrated circuit device 300 monitors voltages at both ends of the AC voltage V0 (i.e. the terminal voltages at the N1 terminal and at the L1 terminal) respectively as the monitoring target voltages V11 and V12 in a pseudo manner, and switches the logic level of the ACOUT signal S1 in accordance with comparison results of them. With reference to this diagram, the ACOUT signal S1 is high level when V11>V12 holds, while it is low level when V11<V12 holds.

In this case, the rising timing of the ACOUT signal S1 is substantially identical to the timing when the AC voltage V0 switches from negative to positive (i.e. at the zero cross from negative to positive) (see time points t41, t43, and t45). In contrast, the falling timing of the ACOUT signal S1 is substantially identical to the timing when the AC voltage V0 switches from positive to negative (i.e. at the zero cross from positive to negative) (see time points t42, t44, and t46).

Figure 25:
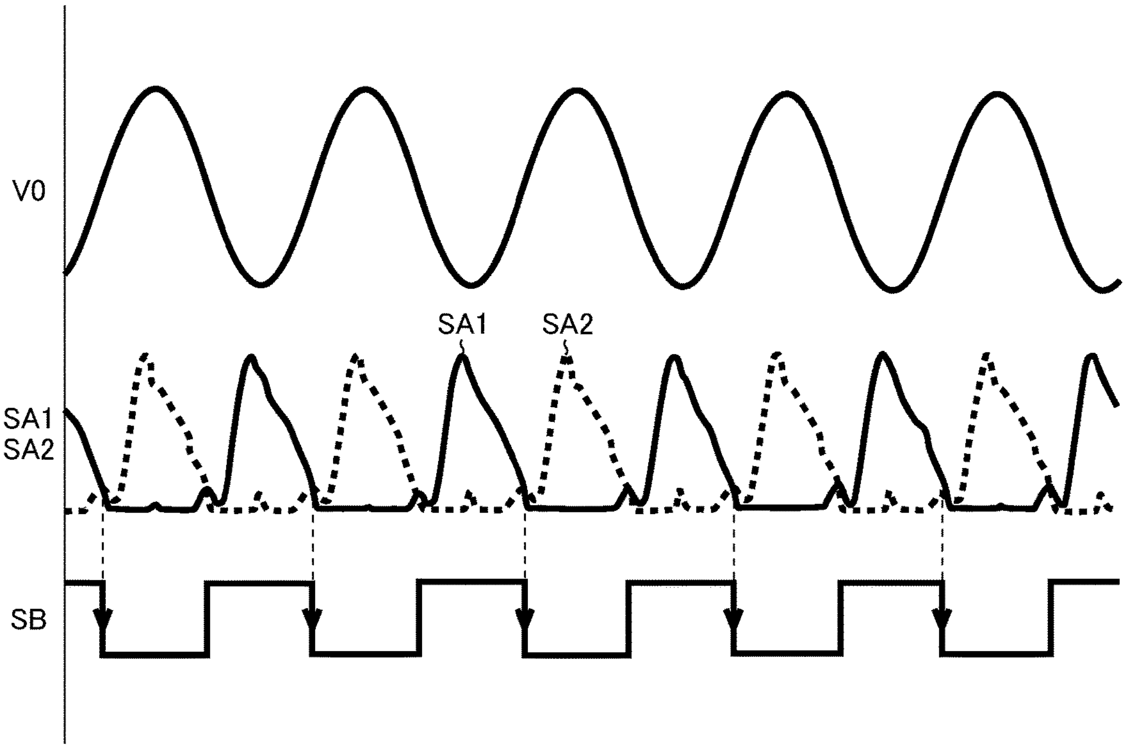
FIG. 25 is a timing chart showing a second example of the zero-crossing detection process.

FIG. 25 is a timing chart showing a second example of the zero-crossing detection process, in which the AC voltage V0, the AC monitor signals SA1 (solid line) and SA2 (broken line), and the comparison signal SB are shown in order from top to bottom. Note that this diagram shows behaviors in the case where the rectifying unit 12 adopts the voltage doubler rectifying method (FIG. 21).

As illustrated in this diagram, in the real electronic equipment 10, due to influence of the input reactor 19, waveforms of the AC monitor signals SA1 and SA2 are largely distorted. In particular, a rising speed of the AC monitor signal SA1 is apt to vary depending on the load Z, and hence the rising timing of the comparison signal SB may largely vary. In contrast, a falling speed of the AC monitor signal SA1 is reluctant to vary depending on the load Z, and hence the falling timing of the comparison signal SB has relatively small variation.

From above consideration, it is preferred that the logic unit 330 should detect the falling timing of the comparison signal SB (i.e. the timing when SA1>SA2 switches to SA1<SA2 along with decrease in the AC monitor signal SA1), so as to estimate a zero cross of the AC voltage V0 on the basis of the detected falling timing.

Figure 26:
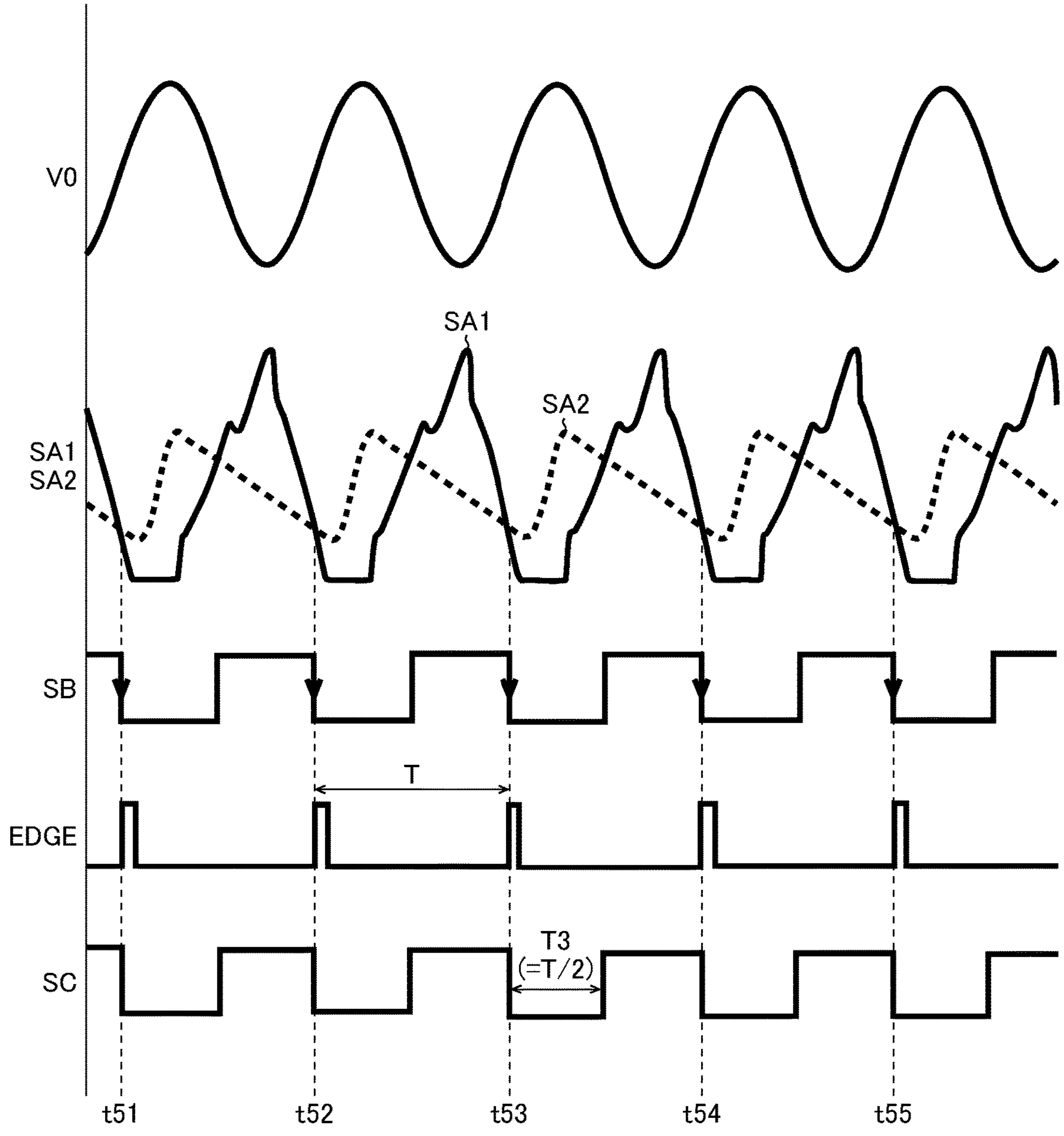
FIG. 26 is a timing chart showing a third example of the zero-crossing detection process.

FIG. 26 is a timing chart showing a third example of the zero-crossing detection process, in which the AC voltage V0, the AC monitor signals SA1 (solid line) and SA2 (broken line), the comparison signal SB, an edge detection signal EDGE (i.e. an internal signal of the logic unit 330), and the zero-crossing detection signal SC are shown in order from top to bottom. Note that this diagram shows behaviors in the case where the rectifying unit 12 adopts the voltage doubler rectifying method (FIG. 21).

As shown by time points t51 to t55, inside the logic unit 330, a pulse is generated on the edge detection signal EDGE at every falling timing of the comparison signal SB. Then, the logic unit 330 counts the pulse interval of the edge detection signal EDGE (i.e. the period T of the comparison signal SB) so as to estimate a zero cross of the AC voltage V0 using the count value.

More specifically, on the precondition that the AC voltage V0 has a constant period and a constant phase, the logic unit 330 refers to the period T of the comparison signal SB so as to determine the rising timing and the falling timing of the zero-crossing detection signal SC.

For instance, the logic unit 330 decreases the zero-crossing detection signal SC from high level to low level at time point when the comparison signal SB falls to low level (e.g. time point t53). This falling timing of the zero-crossing detection signal SC is substantially identical to the timing when the AC voltage V0 is switched from negative to positive (i.e. the zero cross from negative to positive).

Further, the logic unit 330 starts counting of standby time T3 corresponding to the period T obtained in advance (e.g. T3=T/2) from the time point when the comparison signal SB falls to low level, and increases the zero-crossing detection signal SC from low level to high level at the time point when the standby time T3 elapses. This rising timing of the zero-crossing detection signal SC is substantially identical to the timing when the AC voltage V0 is switched from positive to negative (i.e. the zero cross from positive to negative).

Zero-Crossing Detection Unit (Second Example)

Figure 27:
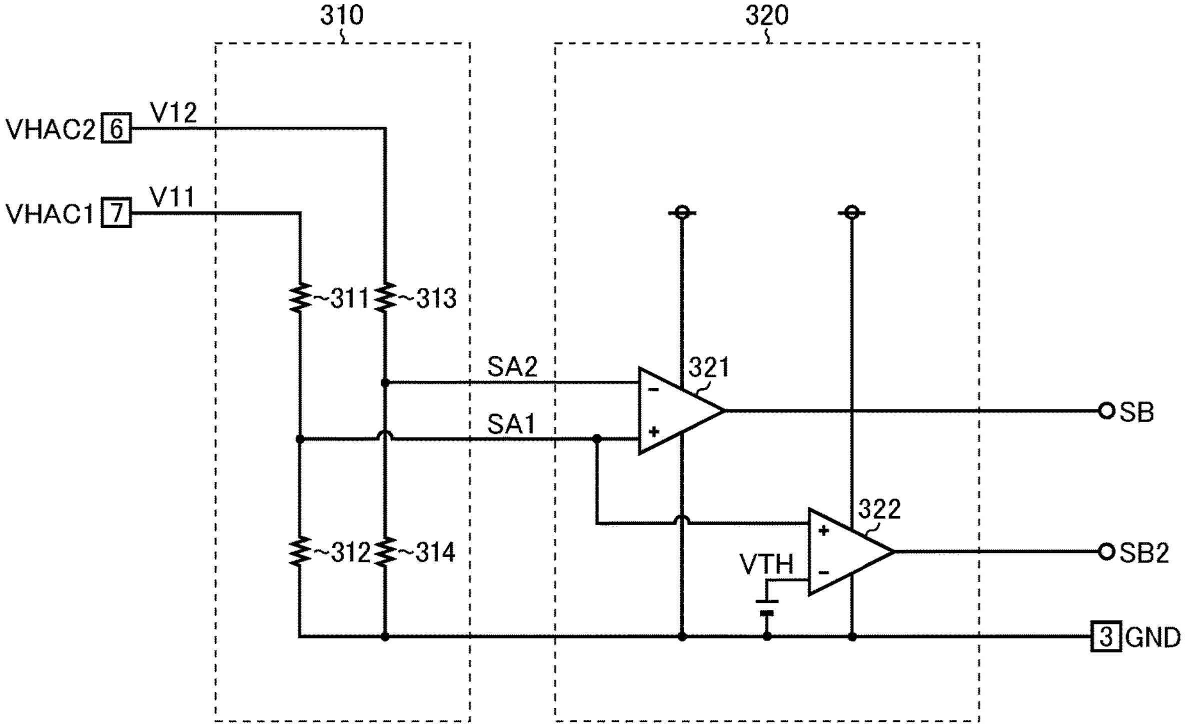
FIG. 27 is a diagram illustrating of a second example of the zero-crossing detection unit.

FIG. 27 is a diagram illustrating a second example of the zero-crossing detection unit 320. The zero-crossing detection unit 320 of this example is based on the first example (FIG. 23) described above, and further includes a comparator 322. The comparator 322 compares the AC monitor signal SA1 input to the noninverting input terminal (+) with a predetermined threshold value VTH (e.g. VTH=20 mV) input to the inverting input terminal (−), so as to generate a comparison signal SB2. The comparison signal SB2 is high level when SA1>VTH holds, while it is low level when SA1<VTH holds.

In the following description, meaning of introducing the comparator 322 is described with reference to the zero-crossing detection process by the semiconductor integrated circuit device 300.

Zero-Crossing Detection Process (Fourth Example to Sixth Example)

Figure 28:
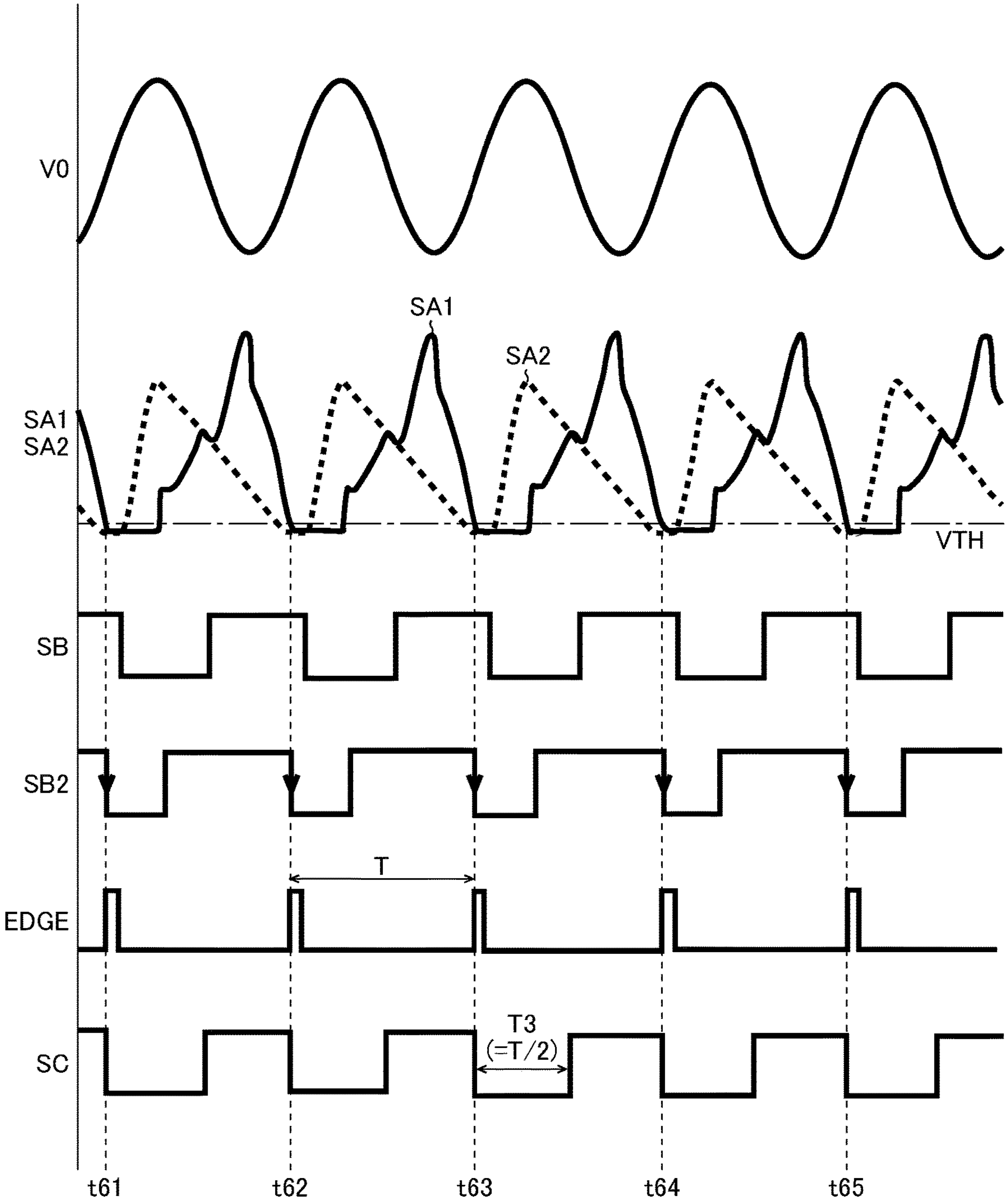
FIG. 28 is a timing chart showing a fourth example of the zero-crossing detection process.

FIG. 28 is a timing chart showing a fourth example of the zero-crossing detection process, in which the AC voltage V0, the AC monitor signals SA1 (solid line) and SA2 (broken line), the comparison signals SB and SB2, the edge detection signal EDGE, and the zero-crossing detection signal SC are shown in order from top to bottom. Note that this diagram shows behaviors in the case where the rectifying unit 12 adopts the voltage doubler rectifying method (FIG. 21).

As illustrated in this diagram, when both the AC monitor signals SA1 and SA2 fall close to 0 V, a logic level of the comparison signal SB may become unstable so that chattering may be caused.

Therefore, when the AC monitor signal SA1 is lower than the predetermined threshold value VTH, the logic unit 330 counts the period T of the comparison signal SB2 instead of the comparison signal SB, and estimates a zero cross of the AC voltage V0 using the count value.

Specifically, as shown by each of time points t61 to t65, inside the logic unit 330, a pulse is generated in the edge detection signal EDGE at every falling timing of the comparison signal SB2. Then, the logic unit 330 counts the pulse interval of the edge detection signal EDGE (i.e. the period T of the comparison signal SB2) so as to estimate a zero cross of the AC voltage V0 using the count value.

For instance, the logic unit 330 decreases the zero-crossing detection signal SC from high level to low level at the time point when the comparison signal SB2 falls to low level (e.g. at time point t63). This falling timing of the zero-crossing detection signal SC is substantially identical to the timing when the AC voltage V0 is switched from negative to positive (i.e. the zero cross from negative to positive).

Further, the logic unit 330 starts counting of the standby time T3 corresponding to the period T obtained in advance (e.g. T3=T/2) from the time point when the comparison signal SB2 falls to low level, and increases the zero-crossing detection signal SC from low level to high level at the time point when the standby time T3 elapses. This rising timing of the zero-crossing detection signal SC is substantially identical to the timing when the AC voltage V0 is switched from positive to negative (i.e. the zero cross from positive to negative).

Figure 29:
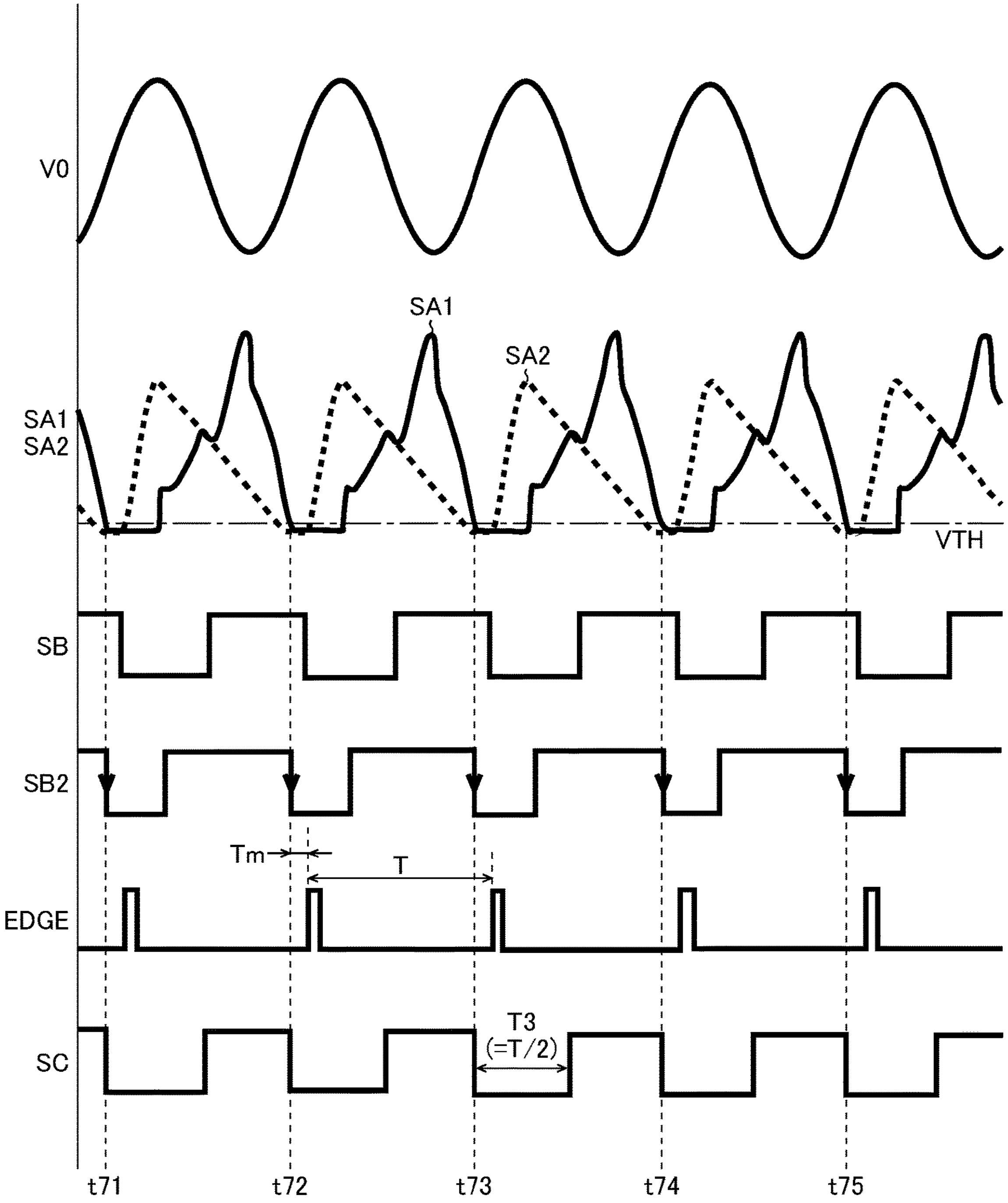
FIG. 29 is a timing chart showing a fifth example of the zero-crossing detection process.
Figure 30:
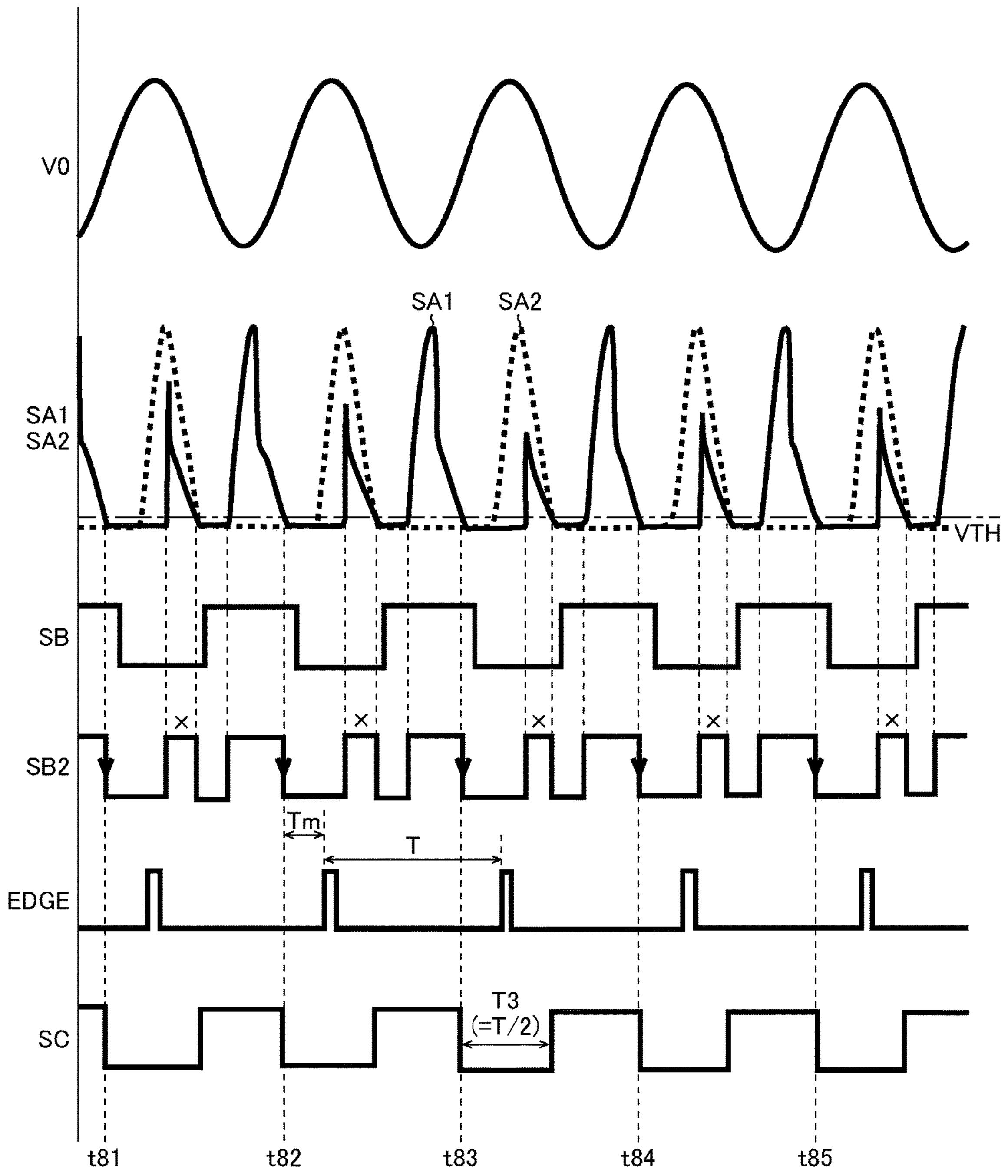
FIG. 30 is a timing chart showing a sixth example of the zero-crossing detection process.

FIGS. 29 and 30 are timing charts respectively showing a fifth example and a sixth example of the zero-crossing detection process, in which the AC voltage V0, the AC monitor signals SA1 (solid line) and SA2 (broken line), the comparison signals SB and SB2, the edge detection signal EDGE, and the zero-crossing detection signal SC are shown in order from top to bottom. Note that the timing charts show behaviors in the case where the rectifying unit 12 adopts the voltage doubler rectifying method (FIG. 21).

As shown in the diagrams, the logic unit 330 has a mask function as measurement against chattering in the comparison signal SB2. Specifically, if the comparison signal SB is not kept at low level during a predetermined mask period Tm after the comparison signal SB2 falls from high level to low level, the logic unit 330 ignores a falling edge of the comparison signal SB2.

With this mask function, even if chattering occurs in the comparison signal SB2, a pulse that is not necessary to the edge detection signal EDGE is not generated, and hence no obstruction occurs in the zero-crossing detection process of the AC voltage V0.

Note that a length of the mask period Tm should be appropriately adjusted inside the logic unit 330. Further, the count start timing of the standby time T3 may be pulse generation timing of the edge detection signal EDGE instead of the falling timing of the comparison signal SB2. In that case, by setting the standby time T3 to T/2−Tm, the rising timing of the zero-crossing detection signal SC can be adjusted to the zero cross of the AC voltage V0.

Electronic Equipment (Fifth Structural Example)

Figure 31:
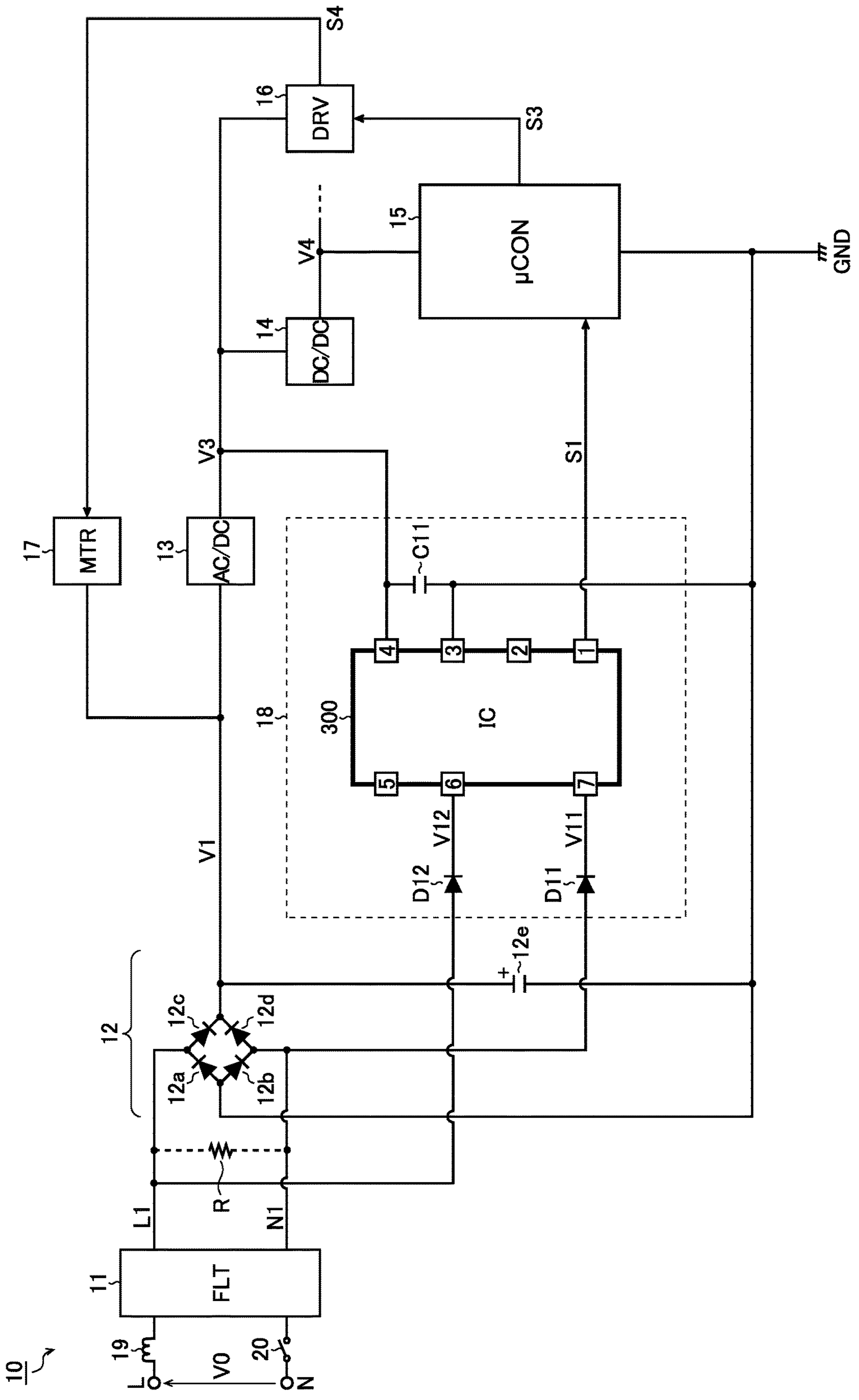
FIG. 31 is a diagram illustrating a fifth structural example (normal rectifying, one-side relay) of the electronic equipment.

FIG. 31 is a diagram illustrating a fifth structural example of the electronic equipment 10 (normal rectifying method, one-side relay). The electronic equipment 10 of this structural example is based on the third structural example (FIG. 20) described above and is different from the same in that a relay switch 20 is disposed on the N terminal side. Therefore, an element having the same structure as in the third structural example is denoted by the same numeral or symbol as in FIG. 20 so that overlapping description is omitted. In the following description, characteristic parts of the fifth structural example are mainly described.

As illustrated in this diagram, in the electronic equipment 10 of this structural example, the relay switch 20 is turned off when the power shuts off, and the N terminal is opened. In this case, if the L1 terminal and the N1 terminal are completely insulated from each other, even if the AC voltage V0 is continuously applied to the L1 terminal, the N1 terminal is maintained at a high impedance state, and hence the monitoring target voltages V11 and V12 do not become the same potential.

However, in reality, there is a leak path (i.e. a resistance component R) between the L1 terminal and the N1 terminal. Therefore, after the relay switch 20 is turned off, the monitoring target voltages V11 and V12 become the same potential (the same phase). Therefore, chattering may occur in the comparison signal SB so that an undesired pulse output may occur in the ACOUT signal S1.

Note that this diagram exemplifies the case where the rectifying unit 12 adopts the normal rectifying method, but the same malfunction as described above can occur in the case where the rectifying unit 12 adopts the voltage doubler rectifying method.

Semiconductor Integrated Circuit Device (Sixth Embodiment)

Figure 32:
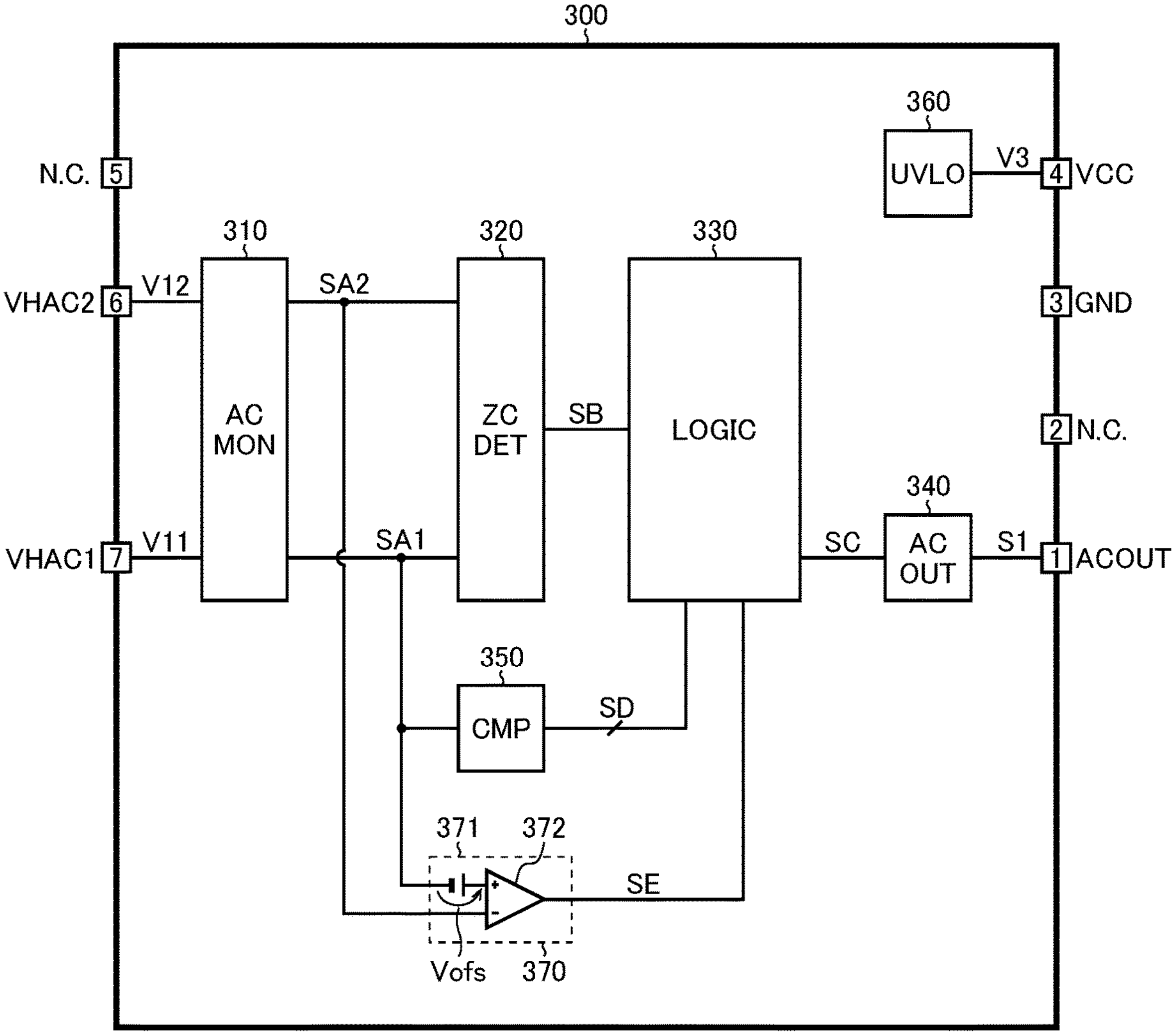
FIG. 32 is a diagram illustrating a sixth embodiment of the semiconductor integrated circuit device.

FIG. 32 is a diagram illustrating a sixth embodiment of the semiconductor integrated circuit device 300. The semiconductor integrated circuit device 300 of this embodiment is based on the fifth embodiment (FIG. 22) described above and further includes an input stop detection unit 370. Therefore, an element having the same structure as in the fifth embodiment is denoted by the same numeral or symbol as in FIG. 22 so that overlapping description is omitted. In the following description, characteristic parts of this embodiment are mainly described.

The input stop detection unit 370 includes an offset power supply 371 and a comparator 372.

The offset power supply 371 pulls up the AC monitor signal SA1 by a predetermined offset voltage Vofs (e.g. Vofs=20 V to 40 V) so as to output the result to the comparator 372.

The comparator 372 compares the AC monitor signal after the offset (SA1+Vofs) input to the noninverting input terminal (+) with the AC monitor signal SA2 input to the inverting input terminal (−) so as to generate an input stop detection signal SE. Therefore, the input stop detection signal SE is high level when SA1+Vofs>SA2 holds, while it is low level when SA1+Vofs<SA2 holds.

In other words, after the relay switch 20 is turned off, when the AC monitor signals SA1 and SA2 become the same phase (or the same potential), SA1+Vofs>SA2 always holds, and hence the input stop detection signal SE does not fall to low level.

The logic unit 330 detects that the input stop detection signal SE is maintained at high level, and fixes the zero-crossing detection signal SC at high level. As a result, even if undesired chattering occurs in the comparison signal SB, the ACOUT signal S1 can be fixed at low level. Therefore, after the relay switch 20 is turned off, pulse output in the ACOUT signal S1 can be securely stopped.

Note that it is arranged that, if the input stop detection signal SE is not maintained at high level for a predetermined mask period Tmask (>T) after the input stop detection signal SE rises to high level, the logic unit 330 ignores the rising.

With this arrangement, as long as the high and low relationship between the AC monitor signals SA1 and SA2 is periodically inverted, the zero-crossing detection signal SC is not fixed to high level, and hence no obstruction occurs in the normal output operation of the ACOUT signal S1.

<Output Pulse Stopping Process>

Figure 33:
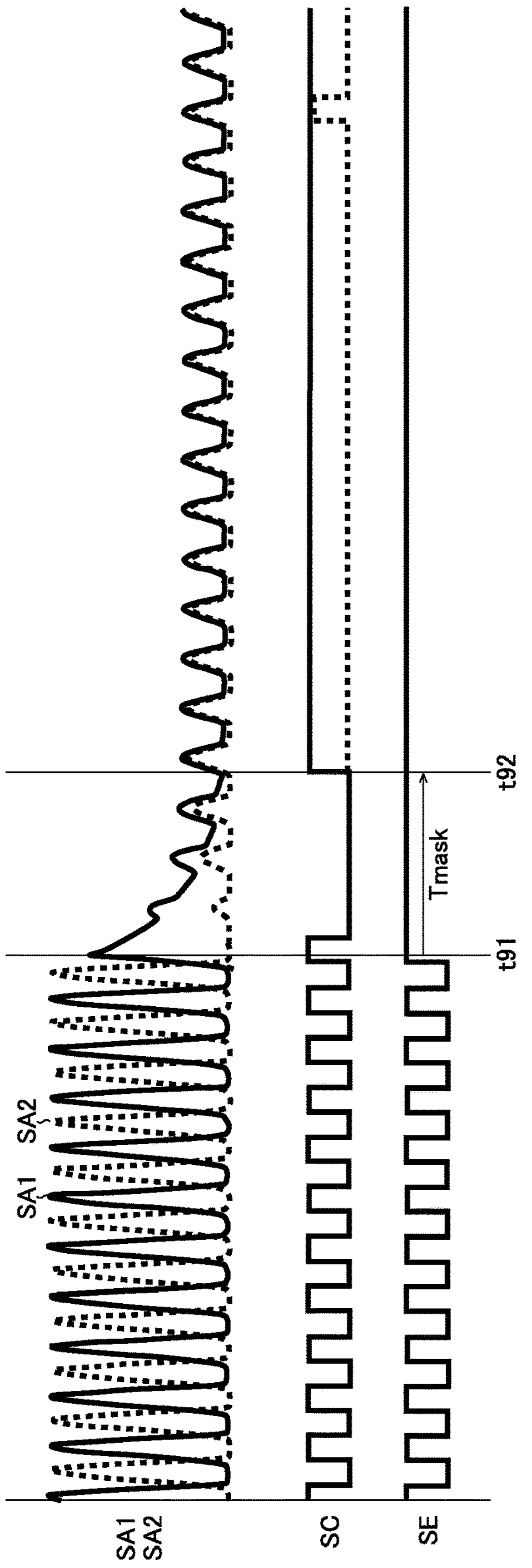
FIG. 33 is a timing chart showing one example of an output pulse stopping process.

FIG. 33 is a timing chart showing one example of an output pulse stopping process when the power shuts off, in which the AC monitor signals SA1 (solid line) and SA2 (broken line), the zero-crossing detection signal SC, and the input stop detection signal SE are shown in order from top to bottom.

Before time point t91, the relay switch 20 is on. Therefore, the high and low relationship between the AC monitor signals SA1 and SA2 is periodically inverted, and periodical pulses are generated in the zero-crossing detection signal SC and the input stop detection signal SE, respectively. Note that, as described above, unless the input stop detection signal SE is maintained at high level for the mask period Tmask (>T), the zero-crossing detection signal SC is not fixed to high level.

When the relay switch 20 is turned off at the time point t91, the AC monitor signals SA1 and SA2 become the same phase, and hence the input stop detection signal SE does not fall to low level. However, the mask period Tmask does not elapse at this time point, and hence the zero-crossing detection signal SC is not fixed to high level.

After that, when the mask period Tmask elapses at time point t92 while the input stop detection signal SE is maintained at high level, the zero-crossing detection signal SC is fixed at high level under determination that the AC monitor signals SA1 and SA2 have the same phase. Therefore, pulse output in the ACOUT signal S1 can be securely stopped.

Note that the semiconductor integrated circuit device 300 of this embodiment is based on the fifth embodiment (FIG. 22), but the zero-crossing detection method does not care when the input stop detection unit 370 is introduced. For instance, the zero-crossing detection unit 320 and the logic unit 330 of FIG. 32 can be replaced by the peak detection unit 120 and the zero-crossing detection unit 130 of FIG. 4. Note that, when this replacement is performed, only one of the AC monitor signals SA1 and SA2 (e.g. the AC monitor signal SA1) should be input to the peak detection unit 120.

Package Layout (Third Example)

Figure 34:
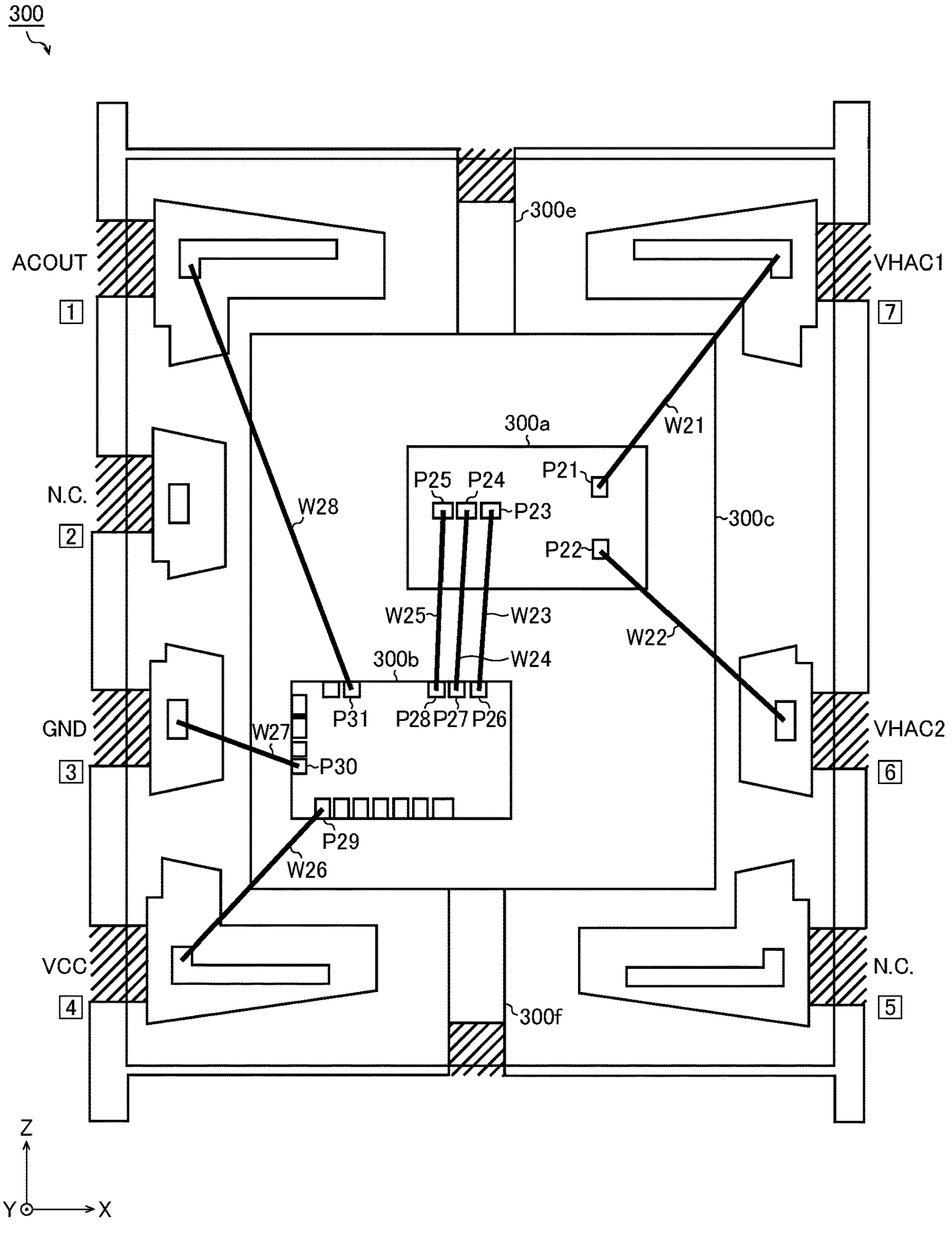
FIG. 34 is a diagram illustrating a third example of the package layout.

FIG. 34 is a diagram illustrating a third example of the package layout of the semiconductor integrated circuit device 300 (XZ plan view). In the semiconductor integrated circuit device 300 of this diagram, a first chip 300*a* and a second chip 300*b* are mounted on an island 300*c*.

Figure 35:
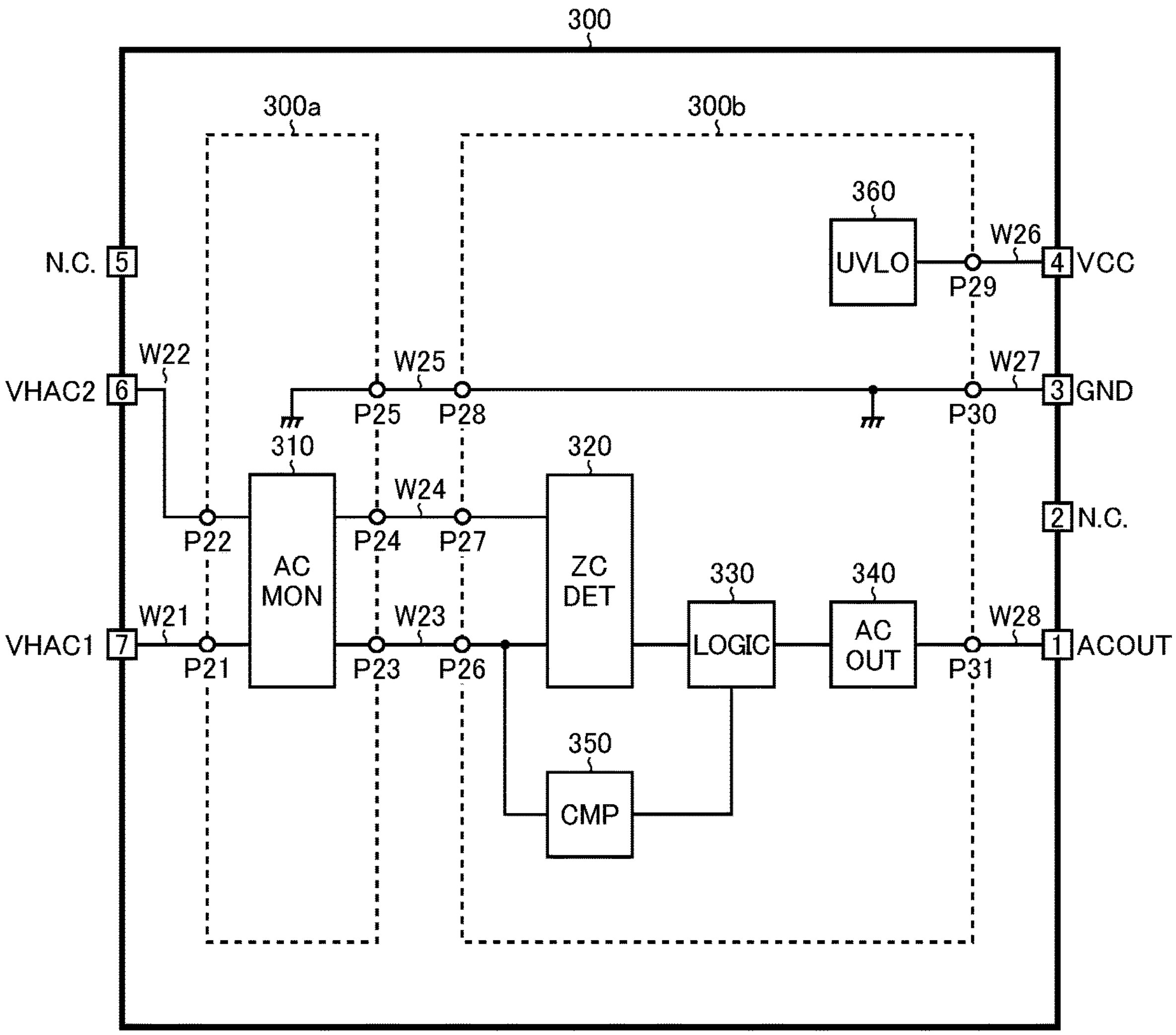
FIG. 35 is a diagram illustrating internal structures of the first chip and the second chip.

First, internal structures of the first chip 300*a* and the second chip 300*b* are described in detail with reference to the drawings. FIG. 35 is a diagram illustrating internal structures of the first chip 300*a* and the second chip 300*b*, and shows one example based on the fifth embodiment (FIG. 22).

The first chip 300*a* includes the integrated AC monitoring unit 310. Further, the first chip 300*a* has Pad P21 to Pad P25 as means for establishing electric connection with outside of the chip. Inside the first chip 300*a*, Pad P21 is connected to the first input terminal of the AC monitoring unit 310 (corresponding to the input terminal of the monitoring target voltage V11). Pad P22 is connected to a second input terminal of the AC monitoring unit 310 (corresponding to the input terminal of the monitoring target voltage V12). Pad P23 is connected to a first output terminal of the AC monitoring unit 310 (corresponding to an output terminal of the AC monitor signal SA1). Pad P24 is connected to the second output terminal of the AC monitoring unit 310 (corresponding to an output terminal of the AC monitor signal SA2). Pad P25 is connected to the ground line.

In contrast, the second chip 300*b* includes the zero-crossing detection unit 320, the logic unit 330, the first output unit 340, the comparing unit 350, and the undervoltage protection unit 360, which are integrated. Further, the second chip 300*b* has Pad P26 to Pad P31 as means for establishing electric connection with outside of the chip. Inside the second chip 300*b*, Pad P26 is connected to a first input terminal of the zero-crossing detection unit 320 (corresponding to an input terminal of the AC monitor signal SA1). Pad P27 is connected to a second input terminal of the zero-crossing detection unit 320 (corresponding to an input terminal of the AC monitor signal SA2). Pad P28 is connected to the ground line. Pad P29 is connected to an input terminal of the undervoltage protection unit 360 (i.e. power supply line). Pad P30 is connected to the ground line. Pad P31 is connected to an output terminal of the first output unit 340.

Note that when the sixth embodiment (FIG. 32) is the base, the input stop detection unit 370 should also be integrated in the second chip 300*b*.

With reference to FIG. 34 again, description of the package layout is continued. Pad P21 is connected to Pin 7 (VHAC1 pin) via a wire W21. Pad P22 is connected to Pin 6 (VHAC2 pin) via a wire W22. Pad P23 is connected to Pad P26 via a wire W23. Pad P24 is connected to Pad P27 via a wire W24. Pad P25 is connected to Pad P28 via a wire W25. Pad P29 is connected to Pin 4 (VCC pin) via a wire W26. Pad P30 is connected to Pin 3 (GND pin) via a wire W27. Pad P31 is connected to Pin 1 (ACOUT pin) via a wire W28.

Note that, as to frame areas inside the package, each of Pin 1 (ACOUT pin), Pin 4 (VCC pin), Pin 5 (N.C. pin), and Pin 7 (VHAC1 pin) is larger than Pin 2 (N.C. pin), Pin 3 (GND pin), or Pin 6 (VHAC2 pin).

In other words, as to the X direction (i.e. the left and right direction on the paper), Pin 1 (ACOUT pin) and Pin 4 (VCC pin) have portions protruding than Pin 2 (N.C. pin) and Pin 3 (GND pin). Similarly, Pin 5 (N.C. pin) and Pin 7 (VHAC1 pin) have portions protruding than Pin 6 (VHAC2 pin).

Further, as to the Z direction (i.e. the up and down direction on the paper), Pin 1 (ACOUT pin) and Pin 4 (VCC pin) overlap partially with the island 300*c*. Similarly, Pin 5 (N.C. pin) and Pin 7 (VHAC1 pin) overlap partially with the island 300*c*.

Furthermore, support frames 300*e* and 300*f* supporting the island 300*c* are formed respectively between Pin 1 (ACOUT pin) and Pin 7 (VHAC1 pin) and between Pin 4 (VCC pin) and Pin 5 (N.C. pin).

Note that relative positions of the chips, an advantage of the double chip structure, and the ground route of the first chip 300*a* are the same as described above in the first example (FIG. 16) and the second example (FIG. 19), and overlapping description is omitted.

Package Layout (Fourth Example)

Figure 36:
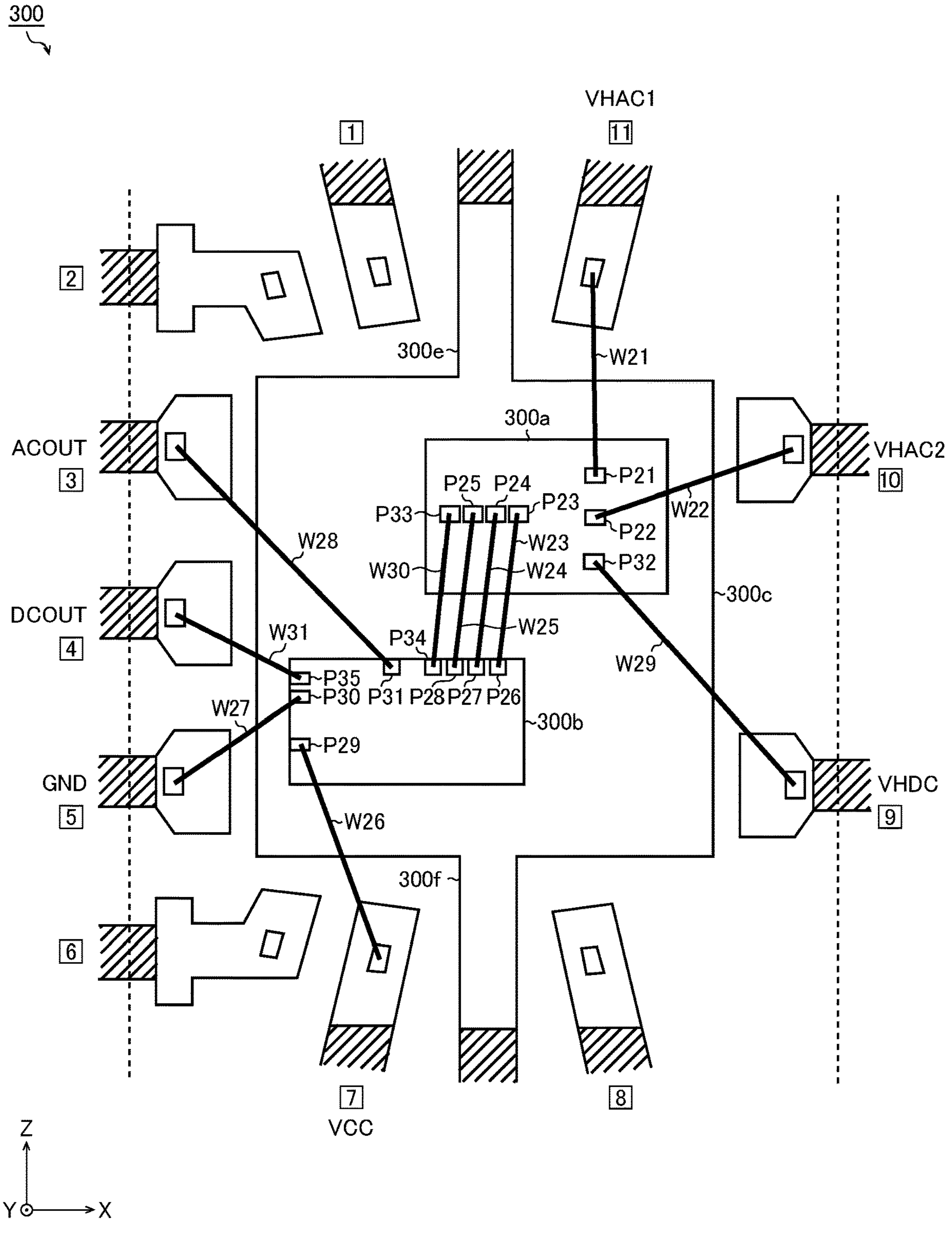
FIG. 36 is a diagram illustrating a fourth example of the package layout.

FIG. 36 is a diagram illustrating a fourth example of the package layout of the semiconductor integrated circuit device 300 (XZ plan view). In the semiconductor integrated circuit device 300 of this diagram, similarly to the third example (FIG. 34) described above, the first chip 300*a* and the second chip 300*b* are mounted on the island 300*c*. Further, in the semiconductor integrated circuit device 300 of this diagram, along with incorporation of the DC monitoring unit (details are described later), the number of package pins is increased from "7" to "11".

Figure 37:
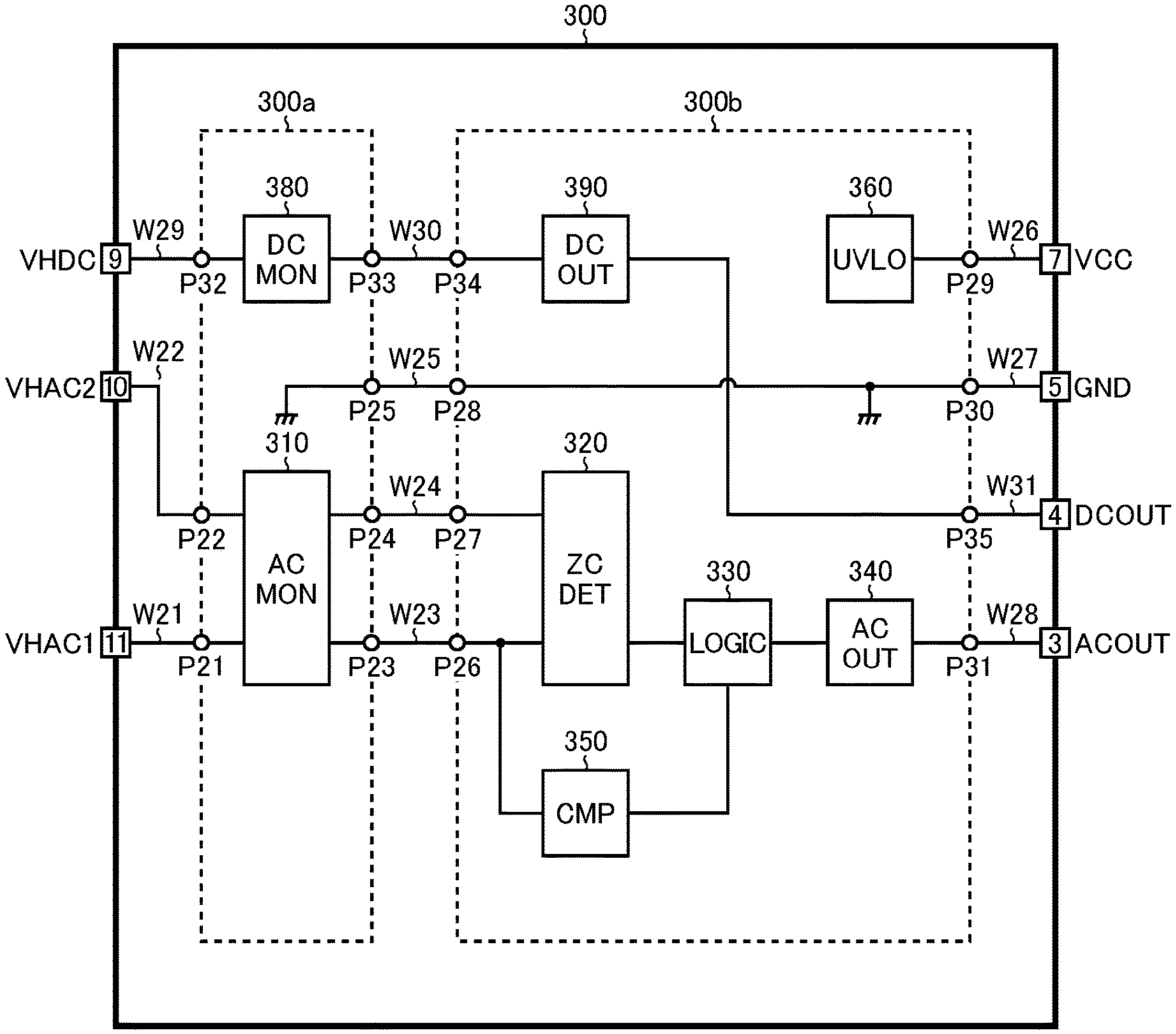
FIG. 37 is a diagram illustrating internal structures of the first chip and the second chip.

First, internal structures of the first chip 300*a* and the second chip 300*b* are described in detail with reference to the drawings. FIG. 37 is a diagram illustrating internal structures of the first chip 300*a* and the second chip 300*b*, and shows the structures based on the fifth embodiment (FIG. 22) in which a DC monitoring unit 380 and a second output unit 390 are added.

Note that internal structures of the first chip 300*a* and the second chip 300*b* are basically the same as those in FIG. 35 described above. Therefore, in the following description, parts modified from FIG. 35 are mainly described.

The first chip 300*a* further includes the integrated DC monitoring unit 380. DC monitoring unit 380 is a high-voltage circuit block (having a withstand voltage of 650 V, for example), which generates the DC monitor signal Sx from the rectified voltage V1 input to Pin 9 (VHDC pin), and corresponds to the DC monitoring unit 150 in the first to fourth embodiments.

Further, Pad P32 and Pad P33 are added to the first chip 300*a* along with the integration of the DC monitoring unit 380. Inside the first chip 300*a*, Pad P32 is connected to an input terminal of the DC monitoring unit 380. Pad P33 is connected to an output terminal of the DC monitoring unit 380.

In contrast, a second output unit 390 is additionally integrated to the second chip 300*b*. The second output unit 390 is a circuit block that receives input of the DC monitor signal Sx so as to generate the DCOUT signal S2, and outputs the DCOUT signal S2 to Pin 4 (DCOUT pin), and it corresponds to the second output unit 160 in the first to fourth embodiments.

Further, Pad P34 and P35 are added to the second chip 300*b* along with the integration of the second output unit 390. Inside the second chip 300*b*, Pad P34 is connected to an input terminal of the second output unit 390. Pad P35 is connected to an output terminal of the second output unit 390.

With reference to FIG. 36 again, description of the package layout is continued. Pad P21 is connected to Pin 11 (VHAC1 pin) via the wire W21. Pad P22 is connected to Pin 10 (VHAC2 pin) via the wire W22. Pad P23 is connected to Pad P26 via the wire W23. Pad P24 is connected to Pad P27 via the wire W24. Pad P25 is connected to Pad P28 via the wire W25. Pad P29 is connected to Pin 7 (VCC pin) via the wire W26. Pad P30 is connected to Pin 5 (GND pin) via the wire W27. Pad P31 is connected to Pin 3 (ACOUT pin) via the wire W28. Pad P32 is connected to Pin 9 (VHDC pin) via a wire W29. Pad P33 is connected to Pad P34 via a wire W30. Pad P35 is connected to Pin 4 (DCOUT pin) via a wire W31.

Note that, as to frame areas inside the package, each of Pin 2 (N.C. pin) and Pin 6 (N.C. pin) is larger than Pin 3 (ACOUT pin), Pin 4 (DCOUT pin) or Pin 5 (GND pin).

In other words, as to the X direction (i.e. the left and right direction on the paper), Pin 2 (N.C. pin) and Pin 6 (N.C. pin) have portions protruding than Pin 3 (ACOUT pin), Pin 4 (DCOUT pin), and Pin 5 (GND pin).

Further, as to the Z direction (i.e. the up and down direction on the paper), Pin 2 (N.C. pin) and Pin 6 (N.C. pin) have no portion overlapping the island 100*c*. Similarly to this, Pin 1 (N.C. pin), Pin 7 (VCC pin), Pin 8 (N.C. pin), and Pin 11 (VHAC1 pin) also have no portion overlapping the island 100*c*.

Furthermore, the support frames 300*e* and 300*f* supporting the island 300*c* are formed respectively between Pin 1 (N.C. pin) and Pin 11 (VHAC1 pin) and between Pin 7 (VCC pin) and Pin 8 (N.C. pin).

<AC Monitoring Unit and DC Monitoring Unit>

Figure 38:
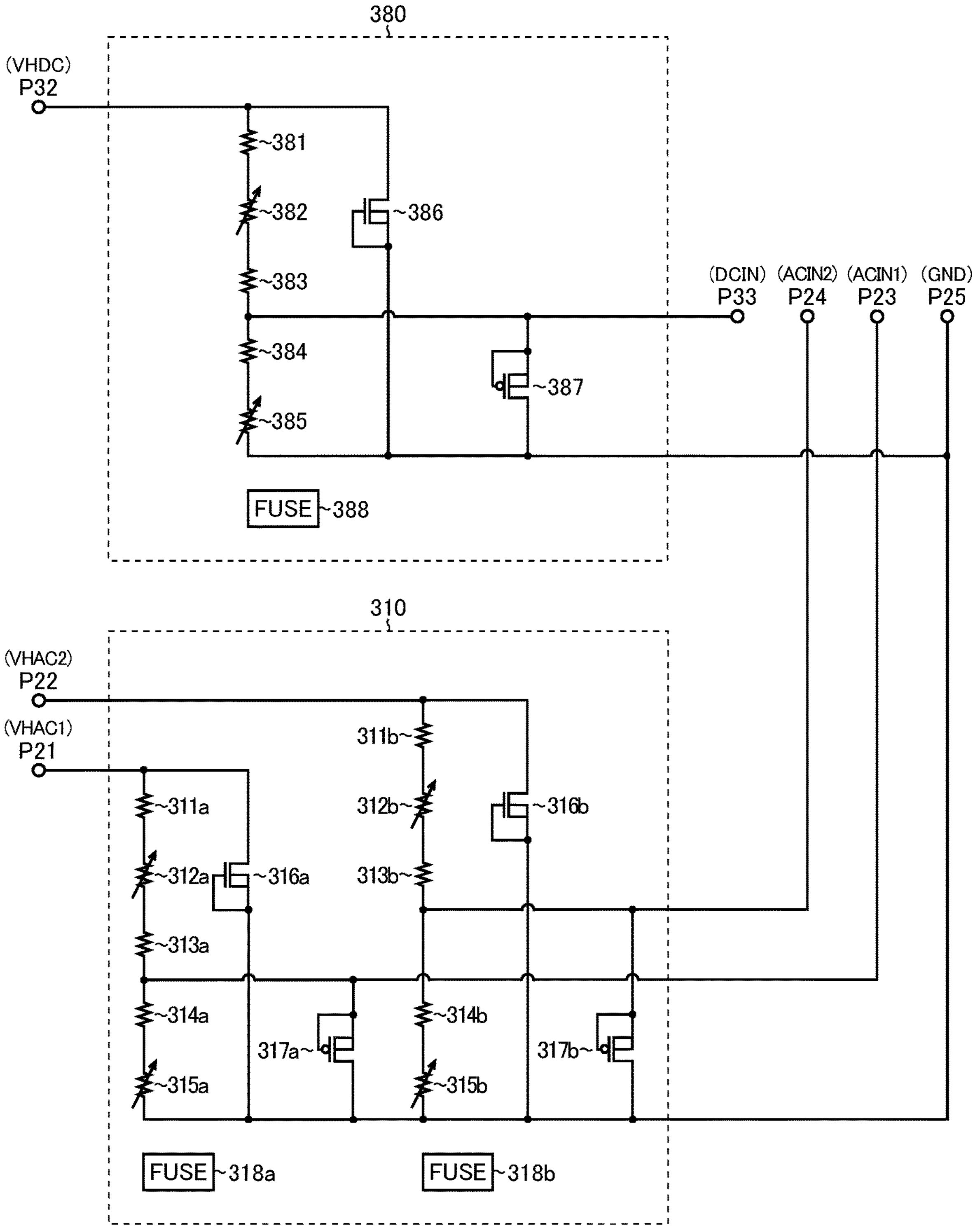
FIG. 38 is a diagram illustrating one structural example of the AC monitoring unit and a DC monitoring unit.

FIG. 38 is a diagram illustrating one structural example of the AC monitoring unit 310 and the DC monitoring unit 380 in FIG. 37 described above. The AC monitoring unit 310 of this structural example includes resistors 311*a* to 315*a* and 311*b* to 315*b*, NMOSFETs 316*a* and 316*b*, PMOSFETs 317*a* and 317*b*, and fuses 318*a* and 318*b*.

The resistors 311*a* to 315*a* are connected in series in the illustrated order between Pad P21 (VHAC1 pad) and Pad P25 (GND pad). Note that the connection node of the resistor 313*a* and the resistor 314*a* is connected to Pad P23 (ACIN1 pad). In other words, the resistors 311*a* to 315*a* function as a voltage divider circuit, which divides the monitoring target voltage V11 (i.e. the first monitoring target signal) input to Pad P21 so as to generate the AC monitor signal SA1.

In contrast, the resistors 311*b* to 315*b* are connected in series in the illustrated order between Pad P22 (VHAC2 pad) and Pad P25 (GND pad). The connection node of the resistor 313*b* and the resistor 314*b* is connected to Pad P24 (ACIN2 pad). In other words, the resistors 311*b* to 315*b* function as a voltage divider circuit, which divides the monitoring target voltage V12 (i.e. the second monitoring target signal) input to Pad P22 so as to generate the AC monitor signal SA2.

Note that, among the resistors 311*a* to 315*a* and the resistors 311*b* to 315*b*, the resistors 311*a* and resistor 311*b* correspond to first feedback resistors. Further, the resistors 312*a* to 315*a* and the resistors 312*b* to 315*b* correspond to second feedback resistors. In particular, among the second feedback resistors, each resistance value of the resistors 312*a* and 315*a*, and the resistors 312*b* and 315*b* can be arbitrarily adjusted by trimming using the fuses 318*a* and 318*b*.

A drain of the NMOSFET 316*a* is connected to Pad P21. A source, a gate, and a backgate of the NMOSFET 316*a* are connected to Pad P25. A drain of the PMOSFET 317*a* is connected to Pad P25. A source, a gate, and a backgate of the PMOSFET 317*a* are connected to Pad P23.

A drain of the NMOSFET 316*b* is connected to Pad P22. A source, a gate, and a backgate of the NMOSFET 316*b* are connected to Pad P25. A drain of the PMOSFET 317*b* is connected to Pad P25. A source, a gate, and a backgate of the PMOSFET 317*b* are connected to Pad P22.

Each of the NMOSFETs 316*a* and 316*b* and the PMOSFETs 317*a* and 317*b* connected in this way functions as an electrostatic protection element.

In contrast, the DC monitoring unit 380 of this structural example includes resistors 381 to 385, an NMOSFET 386, a PMOSFET 387, and a fuse 388.

The resistors 381 to 385 are connected in series in the illustrated order between Pad P32 (VHDC pad) and Pad P25 (GND pad). Note that the connection node of the resistor 383 and the resistor 384 is connected to Pad P33 (DCIN pad). In other words, the resistors 381 to 385 function as a voltage divider circuit, which divides the rectified voltage V1 (i.e. a third monitoring target signal) input to Pad P32 so as to generate the DC monitor signal Sx.

Note that, among the resistors 381 to 385, the resistor 381 corresponds to the first feedback resistor, the resistors 382 to 385 correspond to the second feedback resistors. In particular, among the second feedback resistors, each resistance value of the resistors 382 and 385 can be arbitrarily adjusted by trimming using the fuse 388.

A drain of the NMOSFET 386 is connected to Pad P32. A source, a gate, and a backgate of the NMOSFET 386 are connected to Pad P25. A drain of the PMOSFET 387 is connected to Pad P25. A source, a gate, and a backgate of the PMOSFET 387 are connected to Pad P33.

The NMOSFET 386 and the PMOSFET 387 connected in this way (and body diodes accompanying them) function as an electrostatic protection element.

<Chip Layout (First Chip)>

Figure 39:
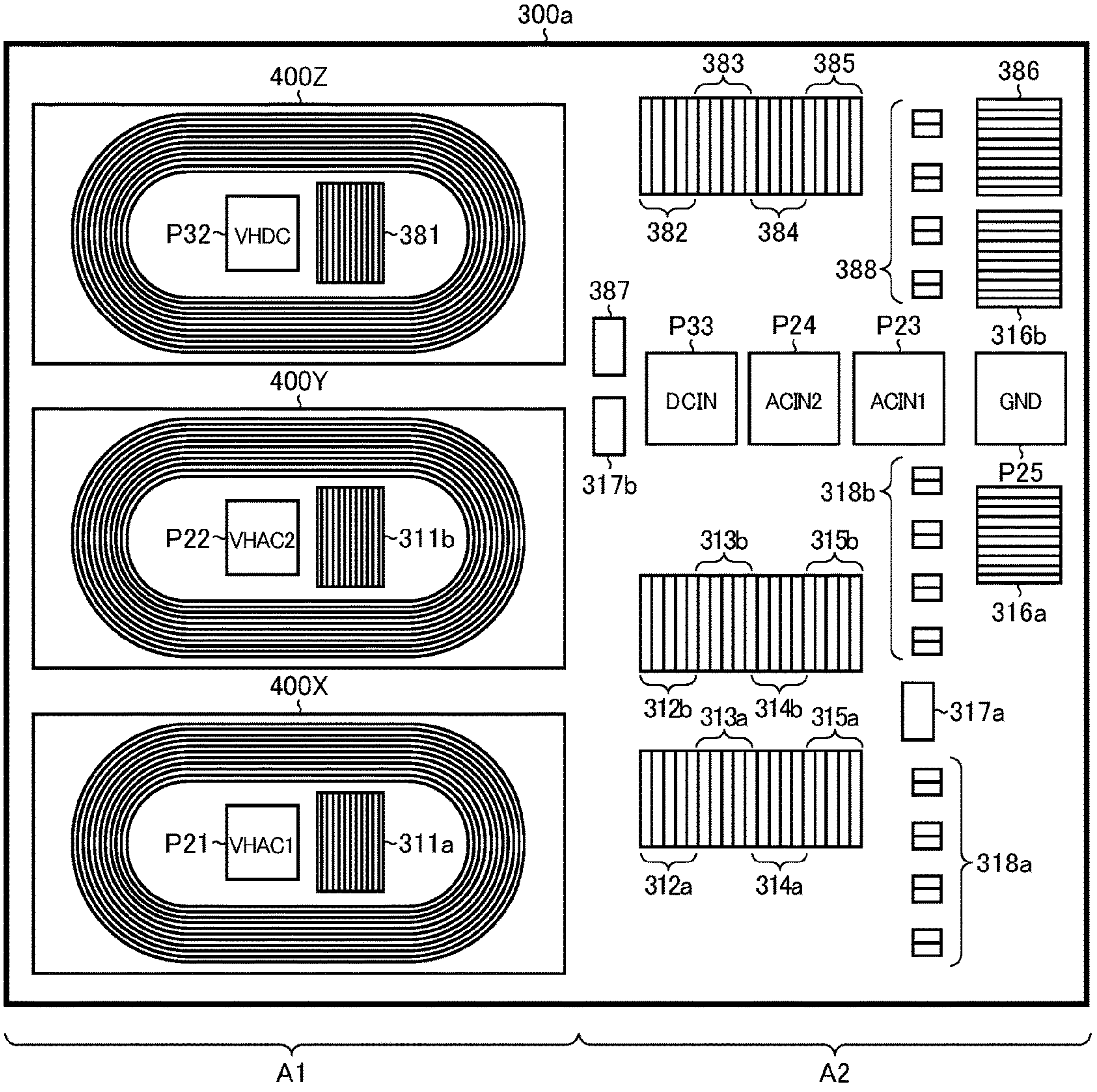
FIG. 39 is a diagram illustrating a layout of the first chip.

FIG. 39 is a diagram illustrating a layout of the first chip 300*a*. Note that wirings formed in the first chip 300*a* are not illustrated for avoiding complexity. Further, in the following description, for convenience of description, the up, down, left, and right directions on the paper are defined as the up, down, left, and right directions in a plan view of the first chip 300*a*, so as to describe a positional relationship of a pad or an element.

In the plan view, the first chip 300*a* is cut out in a rectangular shape having a substantially equal ratio between a short side (a right side or a left side) and a long side (an upper side or a lower side) (in a precise sense, slightly landscape rectangular shape).

In a plan view of the first chip 300*a*, Region A1 (i.e. a substantially left half region of the first chip 300*a*) includes three high-voltage regions 400X to 400Z (details are described later) formed and arranged in the up and down direction of the first chip 300*a*. A pair of the resistor 311*a* and Pad P21 (VHAC1), a pair of the resistor 311*b* and Pad P22 (VHAC2), and a pair of the resistor 381 and Pad P32 (VHDC) are formed respectively in the high-voltage regions 400X to 400Z.

In contrast, in a plan view of the first chip 300*a*, Pad P23 to Pad P25, and Pad P33, the resistors 312*a* to 315*a*, 312*b* to 315*b*, and 382 to 385, the NMOSFETs 316*a*, 316*b* and 386, the PMOSFETs 317*a*, 317*b*, and 387, and the fuses 318*a*, 318*b*, and 388 are formed in Region A2 (i.e. a substantially right half region of the first chip 300*a*).

In a plan view of the first chip 300*a*, Pad P23 to Pad P25, and Pad P33 are formed and arranged in the left and right direction of the first chip 300*a* a little to the upper side from the middle in the up and down direction of the first chip 300*a* (i.e. on a line extending rightward from a border between the high-voltage regions 400Y and 400Z). Note that the pads should be arranged, for example, in such a manner that Pad P33 (DCIN), Pad P24 (ACIN2), Pad P23 (ACIN1) and Pad P25 (GND) are arranged in order from the left side on the paper. Further, the inter-pad distance between Pad P23 and Pad P25 should be larger than the inter-pad distance between Pad P23 and Pad P24 or the inter-pad distance between Pad P24 and Pad P33.

In a plan view of the first chip 300*a*, the resistors 312*a* to 315*a* are formed at a position closer to the lower side of the first chip 300*a* than Pad P23 to Pad P25, and Pad P33, and at a position adjacent to the right side of the high-voltage region 400X (more specifically, at a position a little to the upper side from the middle in the up and down direction of the high-voltage region 400X). Further, in the left and right direction on the paper, the resistors 312*a* to 315*a* are formed from a position on substantially the same line as the left side of Pad P33 (DCIN) to a position on substantially the same line as the left side of Pad P23 (ACIN1) in a plan view of the first chip 300*a*.

In a plan view of the first chip 300*a*, the resistors 312*b* to 315*b* are formed at a position closer to the lower side of the first chip 300*a* than Pad P23 to Pad P25, and Pad P33 (more specifically, at a position between the resistors 312*a* to 315*a* and Pad P23 to Pad P25, and Pad P33), and at a position adjacent to the right side of the high-voltage region 400Y (more specifically, at a position close to the lower side of the high-voltage region 400Y). Further, in the left and right direction on the paper, similarly to the resistors 312*a* to 315*a*, the resistors 312*b* to 315*b* are formed from a position on substantially the same line as the left side of Pad P33 (DCIN) to a position on substantially the same line as the left side of Pad P23 (ACIN1) in a plan view of the first chip 300*a*.

In a plan view of the first chip 300*a*, the resistors 382 to 385 are formed at a position closer to the upper side of the first chip 300*a* than Pad P23 to Pad P25, and Pad P33, and at a position adjacent to the right side of the high-voltage region 400Z (more specifically, at a position close to the upper side of the high-voltage region 400Z). Further, in the left and right direction on the paper, the resistors 382 to 385 are formed, similarly to the resistors 312*a* to 315*a* and 312*b* to 315*b*, from a position on substantially the same line as the left side of Pad P33 (DCIN) to a position on substantially the same line as the left side of Pad P23 (ACIN1) in a plan view of the first chip 300*a*.

Note that the resistors 312*a* and 315*a*, the resistors 312*b* and 315*b*, and the resistors 382 and 385 have each a plurality of unit resistors, and a connection state thereof (the number of series connection and the number of parallel connection) can be arbitrarily changed using the fuses 318*a*, 318*b*, and 388.

In a plan view of the first chip 300*a*, the NMOSFETs 316*a*, 316*b*, and 386 are formed and arranged in the up and down direction of the first chip 300*a*. With reference to this diagram, the NMOSFET 316*a* is formed below the Pad P25, and the NMOSFET 316*b* is formed above Pad P25. Further, the NMOSFET 386 is formed further above the NMOSFET 316*b* (i.e. on the upper right corner of the first chip 300*a*).

In a plan view of the first chip 300*a*, the PMOSFET 317*a* is formed at substantially a middle position between Pad P23 and the lower side of the first chip 300*a*. In contrast, in a plan view of the first chip 300*a*, the PMOSFET 317*b* is formed at a position between Pad P33 and the high-voltage region 400Y. Further, in a plan view of the first chip 300*a*, the PMOSFET 387 is formed at a position between Pad P33 and the high-voltage region 400Z. Note that the PMOSFETs 317*b* and 387 are formed and arranged in the up and down direction of the first chip 300*a*.

In a plan view of the first chip 300*a*, the fuses 318*a*, 318*b*, and 388 are formed and arranged in the up and down direction of the first chip 300*a*. With reference to this diagram, the fuse 318*a* is formed between the PMOSFET 317*a* and the lower side of the first chip 300*a*, and the fuse 318*b* is formed between Pad P23 and the PMOSFET 317*a*. Further, the fuse 388 is formed between Pad P23 and the upper side of the first chip 300*a*. Note that each of the fuses 318*a*, 318*b*, and 388 can be understood as a fuse element group including a plurality of fuse elements.

Note that it is preferred to use a polysilicon resistor having a withstand voltage of 100 V or higher (e.g. 650 V) as the resistors 311*a*, 311*b*, and 381 to which high voltage is applied. In particular, when integrating the resistors described above, not only a high withstand voltage of the path through the resistors (in a lateral direction) but also a high withstand voltage between each resistor and the semiconductor substrate (in a vertical direction) is required.

Therefore, in the first chip 300*a* in which the AC monitoring unit 310 and the DC monitoring unit 380 are integrated, it is preferred to form the three high-voltage regions 400X to 400Z having a higher withstand voltage in the substrate thickness direction (in the vertical direction) than other regions, and to form the resistors 311*a* and 311*b*, and the resistor 381 on the high-voltage regions 400X to 400Z, respectively.

Note that, as the three high-voltage regions 400X to 400Z described above, a lateral double-diffused MOSFET (LDMOSFET) region with abundant results of high withstand voltage can be used. In the following description, a structure of the LDMOSFET region is specifically described.

<High-voltage Region (LDMOSFET Region)>

Figure 40:
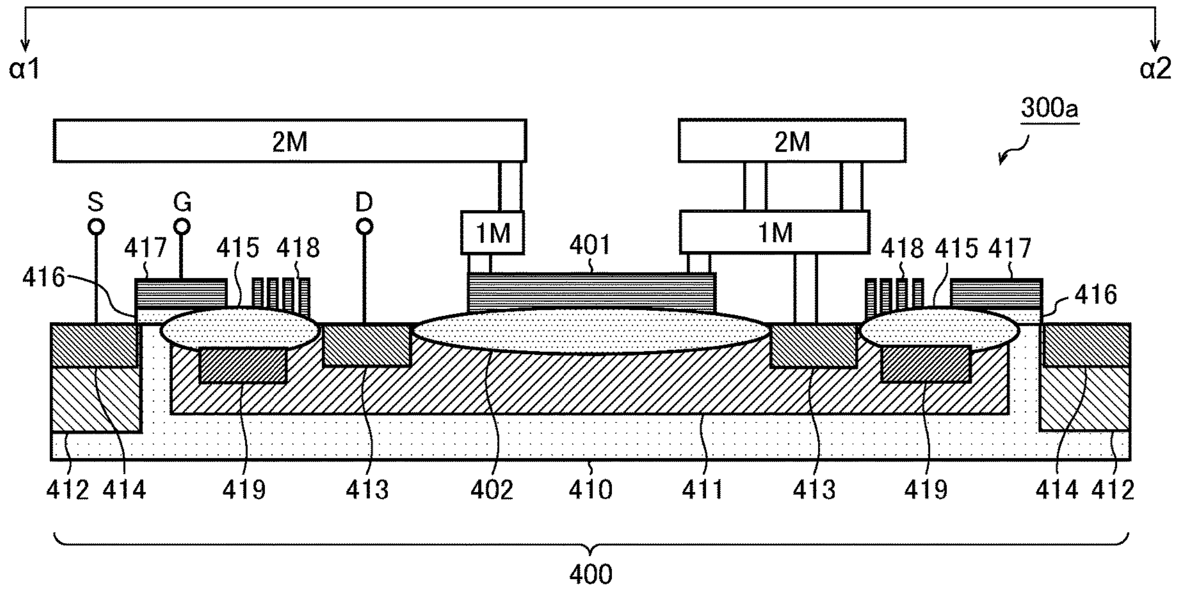
FIG. 40 is a longitudinal sectional view illustrating one structural example of a high-voltage region.
Figure 41:
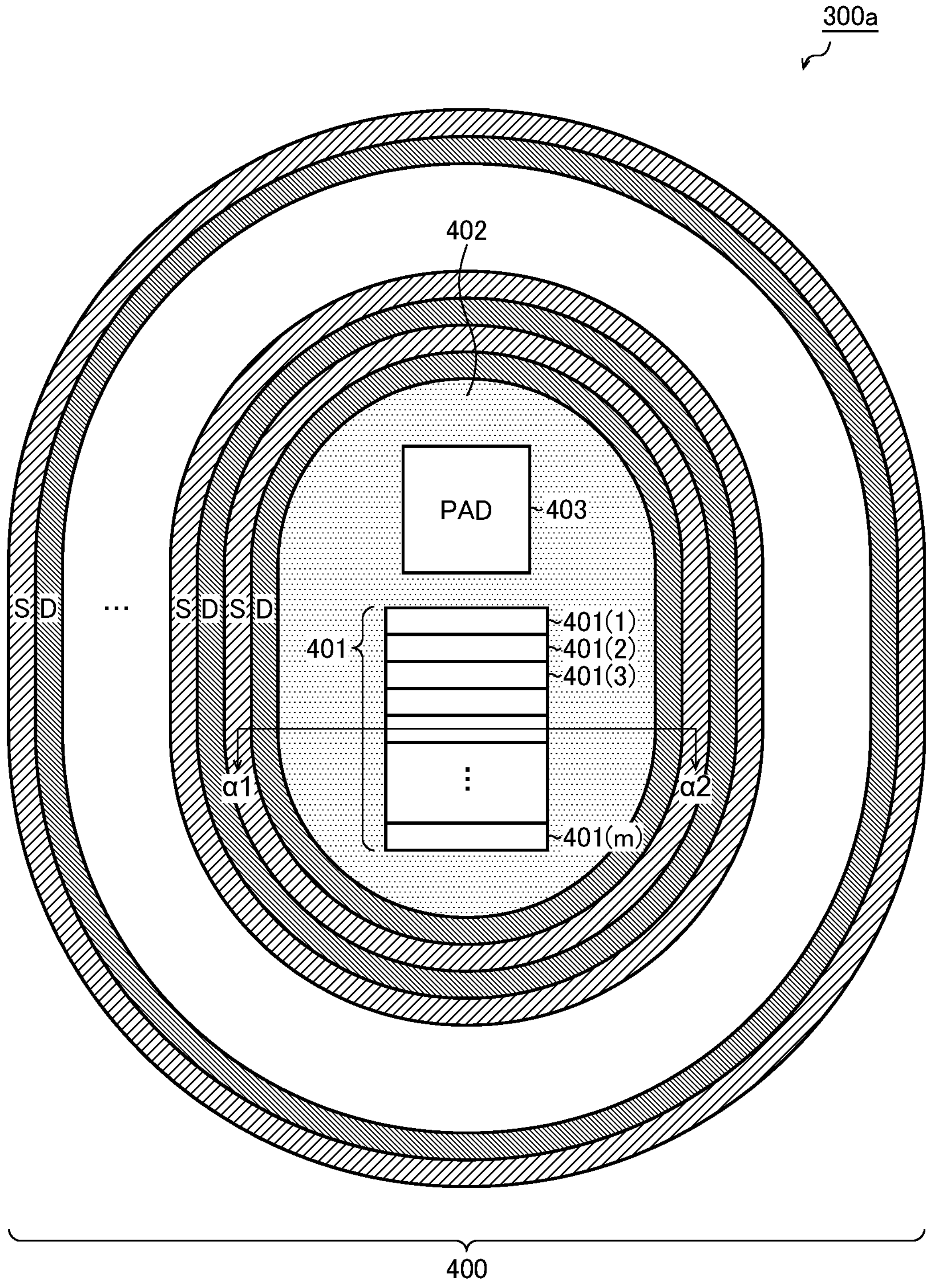
FIG. 41 is an enlarged top view illustrating one structural example of the high-voltage region.

FIGS. 40 and 41 are a longitudinal sectional view and a top view, respectively, illustrating one structural example of the first chip 300*a* (in particular, a region where the feedback resistors positioned respectively in the middle of the high-voltage regions 400X to 400Z are formed and its vicinity). Note that the longitudinal sectional view of FIG. 40 schematically illustrates an α1-α2 cross section of FIG. 41.

The first chip 300*a* of this diagram includes a p-type semiconductor substrate 410, and the LDMOSFET region that is used as a high-voltage region 400 (corresponding to the high-voltage regions 400X to 400Z described above) is formed on the p-type semiconductor substrate 410. More specifically, on the p-type semiconductor substrate 410, a low concentration n-type semiconductor region 411 and a high concentration p-type semiconductor region 412 surrounding the same are formed in the middle part of the high-voltage region 400. Note that the withstand voltage in the thickness direction of the substrate in the high-voltage region 400 is increased by decreasing impurity concentration in the low concentration n-type semiconductor region 411 or by increasing thickness of the same.

A high concentration n-type semiconductor region 413 is formed in the low concentration n-type semiconductor region 411, and a high concentration n-type semiconductor region 414 is formed in the high concentration p-type semiconductor region 412. These high concentration n-type semiconductor regions 413 and 414 correspond to a drain region (D) and a source region (S) of the LDMOSFET, respectively. Note that, as illustrated in FIG. 41, in a plan view, a plurality of concentric ring-like drain regions (D) and source regions (S) are alternately formed in the high-voltage region 400.

Further, on the outer surface layer of the low concentration n-type semiconductor region 411, a field oxide film 415 is formed so as to surround the high concentration n-type semiconductor region 413. Further, on the surface layer of the p-type semiconductor substrate 410, a gate oxide film 416 is formed to bridge between the high concentration n-type semiconductor region 414 and the field oxide film 415. Note that a gate region 417 made of polysilicon is formed on the gate oxide film 416.

Further, on the field oxide film 415, a field plate 418 made of polysilicon is formed as means for equalizing the electric field distribution (i.e. intervals between equipotential lines) so as to prevent dielectric breakdown.

Further, just under the field oxide film 415, a low concentration p-type semiconductor region 419 is formed as means for forming parasitic capacitance between the field oxide film 415 and the low concentration n-type semiconductor region 411. With this structure, the withstand voltage in the thickness direction of the substrate can be increased corresponding to a voltage held by the parasitic capacitance.

Furthermore, on the surface layer of the middle part of the low concentration n-type semiconductor region 411 surrounded by the high concentration n-type semiconductor region 413 (corresponding to the innermost drain region (D)), a field oxide film 402 is formed, and a feedback resistor 401 (i.e. the resistor 311*a*, 311*b*, or 381) is formed on this field oxide film 402. Note that the feedback resistor 401 should be formed using the same polysilicon layer as the gate region 417 and the field plate 418.

Further, in this illustrated example, both ends of the feedback resistor 401 are respectively connected to a first metal layer 1M through vias, and further the first metal layer 1M is connected to a second metal layer 2M through vias. For instance, a pad 403 (i.e. Pad P21, P22, or P32) should be formed on the second metal layer 2M. However, the number of metal layers is not limited to this. There may be only one layer, or may be three or more layers.

Further, as illustrated in FIG. 41, it is preferred to form the feedback resistor 401 by combining a plurality of unit resistors 401(1) to 401(*m*) (m≥2). For instance, if a resistance value of one unit resistor is 1 MΩ, ten unit resistors should be connected in series in order to make the feedback resistor 401 having a combined resistance of 10 MΩ.

In this way, by using the LDMOSFET region (e.g. having a withstand voltage of 600 V) as the high-voltage region 400, high withstand voltage between the feedback resistor 401 and the p-type semiconductor substrate 410 can be realized.

<Chip Layout (Second Chip)>

Figure 42:
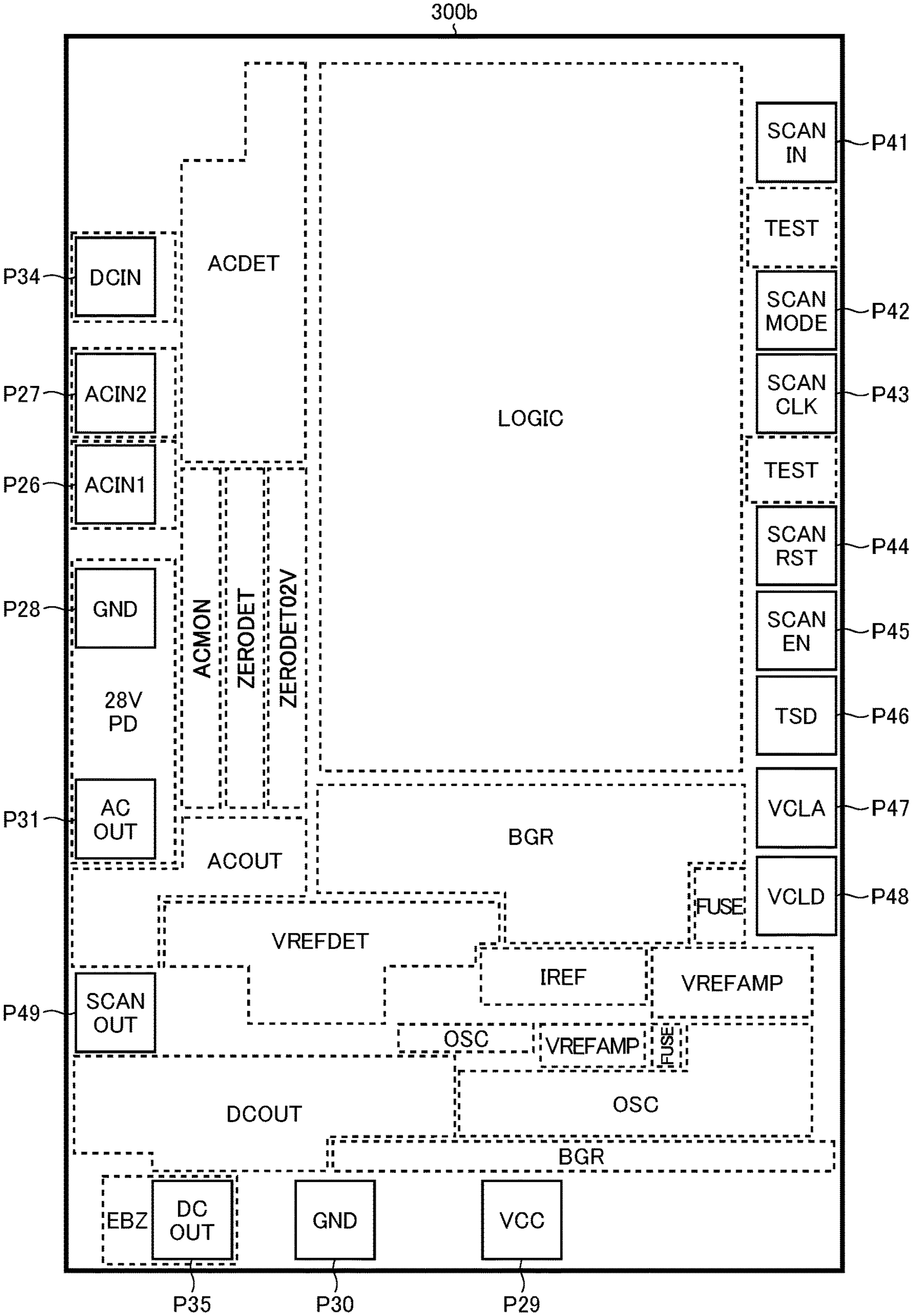
FIG. 42 is a diagram illustrating a layout of the second chip.

FIG. 42 is a diagram illustrating a layout of the second chip 300*b*. In the following description, for convenience of description, the up, down, left, and right directions on the paper are defined as the up, down, left, and right directions in a plan view of the second chip 300*b*, so as to describe a positional relationship of a pad or a circuit block.

Note that in this diagram, Pad P41 to Pad P49 for chip test are newly shown in addition to Pad P26 to Pad P31 and Pad P34 to Pad P35, which are already described above with reference to FIG. 37. Pad P41 to Pad P49 are briefly described. Pad P41 (SCANIN), Pad P42 (SCANMODE), Pad P43 (SCANCLK), Pad P44 (SCANRST), Pad P45 (SCANEN), and Pad P49 (SCANOUT) are a pad group for scan pass test (a test signal input pad, a mode switch signal input pad, a clock signal input pad, a reset signal input pad, an enable signal input pad, and a test signal output pad). Pad P46 (TSD) is a temperature protection signal output pad. Pad P47 (VCLA) is a test voltage application pad of an analog circuit. Pad P48 (VCLD) is a test voltage application pad of a digital circuit.

In the plan view, the second chip 300*b* is cut out in a portrait rectangular shape in which the right side and the left side are longer than the upper side and the lower side.

In a plan view of the second chip 300*b*, near the left side of the second chip 300*b*, Pad P34 (DCIN), Pad P27 (ACIN2), Pad P26 (ACIN1), Pad P28 (GND), Pad P31 (ACOUT), and Pad P49 (SCANOUT) are formed and arranged in the up and down direction in order from top to bottom on the paper.

In contrast, in a plan view of the second chip 300*b*, near the right side of the second chip 300*b*, Pad P41 (SCANIN), Pad P42 (SCANMODE), Pad P43 (SCANCLK), Pad P44 (SCANRST), Pad P45 (SCANEN), Pad P46 (TSD), Pad P47 (VCLA), and Pad P48 (VCLD) are formed and arranged in the up and down direction in order from top to bottom on the paper.

Further, in a plan view of the second chip 300*b*, near the lower side of the second chip 300*b*, Pad P35 (DCOUT), Pad P30 (GND), and Pad P29 (VCC) are formed and arranged in the left and right direction in order from left to right on the paper.

It is preferred to dispose Pad P26 and Pad P27 to be close to each other. It is preferred that the inter-pad distance between Pad P27 and Pad P34 be larger than the inter-pad distance between Pad P26 and Pad P27. It is preferred to dispose Pad P28 (GND) between Pad P26 (ACIN1) and Pad P31 (ACOUT). It is preferred to dispose Pad P30 (GND) between Pad P29 (VCC) and Pad P35 (DCOUT). The electrostatic protection element (28VPD or EBZ) is formed just under Pad P26 to Pad P28, Pad P31 and Pad P34 to Pad P35. A TEST block (test circuit) is formed respectively between Pad P41 and Pad P42 and between Pad P43 and Pad P44.

In a plan view of the second chip 300*b*, in a region close to Pad P26 to Pad P28, Pad P31 and Pad P34 (i.e. a region occupying approximately ¼ of the left side and approximately ¾ of the upper side of the second chip 300*b*, except for the pad forming region), there are formed an ACDET block (corresponding to the comparing unit 350), an ACMON block (i.e. an RC filter disposed on the preceding stage of a ZERODET block, not illustrated in FIG. 37), the ZERODET block (corresponding to the zero-crossing detection unit 320), a ZERODET02V block (corresponding to the input stop detection unit 370), and an ACOUT block (corresponding to the first output unit 340).

Each of the ACMON block, the ZERODET block, and the ZERODET02V block is formed in a portrait region from a position neighboring Pad P26 to a position neighboring Pad P31. Further, the ACMON block, the ZERODET block, and the ZERODET02V block are formed and arranged in the left and right direction of the second chip 300*b*.

The ACDET block is formed in a region between the upper side of the second chip 300*b* and the upper sides of the ACMON block, the ZERODET block, and the ZERODET02V block. Note that the ACDET block has a larger area than each of the ACMON block, the ZERODET block, and the ZERODET02V block.

The ACOUT block is formed in a region having a bent shape from the lower sides of the ACMON block, the ZERODET block, and the ZERODET02V block to the left side of the second chip 300*b*. In other words, a part of the ACOUT block is formed in a region between Pad P31 and Pad P49.

A DCOUT block is formed in a region close to Pad P35 (DCOUT) (i.e. in a landscape region surrounded by Pad P35, Pad P30, and Pad P49). The DCOUT block has a larger area than the ACOUT block.

A LOGIC block (corresponding to the logic unit 330 described above) is formed in the upper right region of the second chip 300*b* (i.e. a region occupying approximately ¾ of the right side and approximately 4/7 of the upper side of the second chip 300*b*, except for the pad forming region). The LOGIC block has a larger area than any other block.

In a plan view of the second chip 300*b*, in a region where the above-mentioned blocks (ACDET, ACMON, ZERODET, ZERODET02V, ACOUT, DCOUT, and LOGIC) are not formed (i.e. a region occupying approximately ¾ of the right side and approximately 3/7 of the lower side of the second chip 300*b*), there are formed a BGR block that generates a bandgap reference voltage, a VREFAMP block that generates an internal reference voltage from the bandgap reference voltage, a VREFDET block that monitors the internal reference voltage (corresponding to the undervoltage protection unit 360), an IREF block that generates an internal reference current, an OSC block that supplies a clock signal to the LOGIC block, and a FUSE block that sets operation of the LOGIC block.

Package Layout (Fifth Example)

Figure 43:
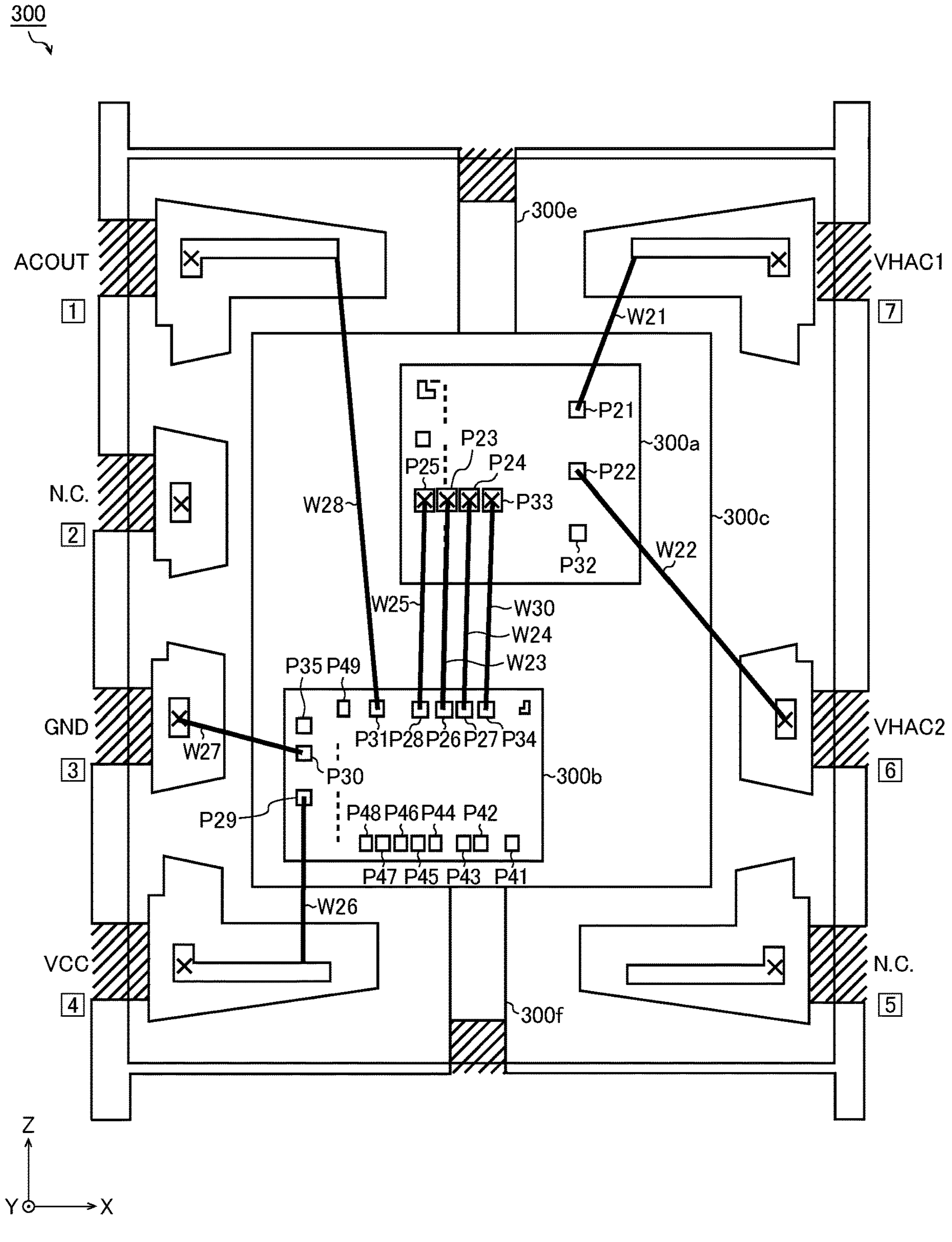
FIG. 43 is a diagram illustrating a fifth example of the package layout.

FIG. 43 is a diagram illustrating a fifth example of the package layout of the semiconductor integrated circuit device 300 (XZ plan view). The semiconductor integrated circuit device 300 of this diagram is based on the package layout of FIG. 34 (the third example), in which the first chip 300*a* of FIG. 39 and the second chip 300*b* of FIG. 42 are mounted on the island 300*c*.

Specifically, in this diagram, the first chip 300*a* of FIG. 39 is rotated by 180° in the clockwise direction (or in the counterclockwise direction) and is mounted in the upper right region of the island 300*c*. Further, in this diagram, the second chip 300*b* of FIG. 42 is rotated by 90° in the clockwise direction and is mounted in the lower left region of the island 300*c*.

Pad P21 (VHAC1) is connected to a distal end side of Pin 7 (VHAC1) via the wire W21. Pad P22 (VHAC2) is connected to Pin 6 (VHAC2) via the wire W22. Pad P23 (ACIN1) is connected to Pad P26 (ACIN1) via the wire W23. Pad P24 (ACIN2) is connected to Pad P27 (ACIN2) via the wire W24. Pad P25 (GND) is connected to Pad P28 (GND) via the wire W25. Pad P33 (DCIN) is connected to Pad P34 (DCIN) via the wire W30. Pad P29 (VCC) is connected to a distal end side of Pin 4 (VCC) via the wire W26. Pad P30 (GND) is connected to Pin 3 (GND) via the wire W27. Pad P31 (ACOUT) is connected to a distal end side of Pin 1 (ACOUT) via the wire W28.

Note that, in the semiconductor integrated circuit device 300 of this diagram, a DC voltage monitoring function is not used, and hence Pad P32 (VHDC) and Pad P35 (DCOUT) are not connected to any pin. In contrast, Pad P33 (DCIN) and Pad P34 (DCIN) are connected to each other via the wire W30. Therefore, the DC voltage monitoring function can be used only by connecting Pad P32 (VHDC) and not used Pin 5 via the wire W29 and by connecting Pad P35 (DCOUT) and not used Pin 2 via the wire W30, similarly to FIG. 37 described above, for example.

Further, Pad P23 to Pad P25, and Pad P33 of the first chip 300*a*, and Pad P26 to Pad P28 and Pad P34 of the second chip 300*b* are arranged in the left and right direction (X-axis direction) on the paper in each corresponding order. Therefore, the wires W23 to W25 and W30 between pads can be formed in minimum distances without crossing.

Further, Pad P21 to Pad P22 and Pad P32 of the first chip 300*a* are arranged in the up and down direction (Z-axis direction) on the paper in the order corresponding to Pin 7 (VHAC1 pin), Pin 6 (VHAC2 pin), and Pin 5 (that is the VHDC pin when the DC voltage monitoring function is used), respectively. Therefore, the wires W21 and W22 between pin and pad (and the wire W29 when the DC voltage monitoring function is used) can be formed in minimum distances without crossing.

Similarly, Pad P29 to Pad P30 and Pad P35 of the second chip 300*b* are arranged in the up and down direction (Z-axis direction) on the paper in the order corresponding to Pin 4 (VCC pin), Pin 3 (GND pin), and Pin 2 (that is the DCOUT pin when the DC voltage monitoring function is used), respectively. Therefore, the wires W26 and W27 between pin and pad (and the wire W29 when the DC voltage monitoring function is used) can be formed in minimum distances without crossing.

Note that Pad P41 to Pad P49 for chip test are not used after packaging into the semiconductor integrated circuit device 300, and hence they are not connected to any pin.

Further, as to frame areas inside the package, each of Pin 1 (ACOUT pin), Pin 4 (VCC pin), Pin 5 (N.C. pin), and Pin 7 (VHAC1 pin) is larger than Pin 2 (N.C. pin), Pin 3 (GND pin), or Pin 6 (VHAC2 pin).

In other words, as to the X direction (i.e. the left and right direction on the paper), Pin 1 (ACOUT pin) and Pin 4 (VCC pin) have portions protruding than Pin 2 (N.C. pin) and Pin 3 (GND pin). Similarly, Pin 5 (N.C. pin) and Pin 7 (VHAC1 pin) have portions protruding than Pin 6 (VHAC2 pin).

Further, as to the Z direction (i.e. the up and down direction on the paper), Pin 1 (ACOUT pin) and Pin 4 (VCC pin) overlap partially with the island 300*c*. Similarly, Pin 5 (N.C. pin) and Pin 7 (VHAC1 pin) overlap partially with the island 300*c*.

Furthermore, the support frames 300*e* and 300*f* for supporting the island 300*c* are formed respectively between Pin 1 (ACOUT pin) and Pin 7 (VHAC1 pin) and between Pin 4 (VCC pin) and Pin 5 (N.C. pin).

Package Layout (Sixth Example)

Figure 44:
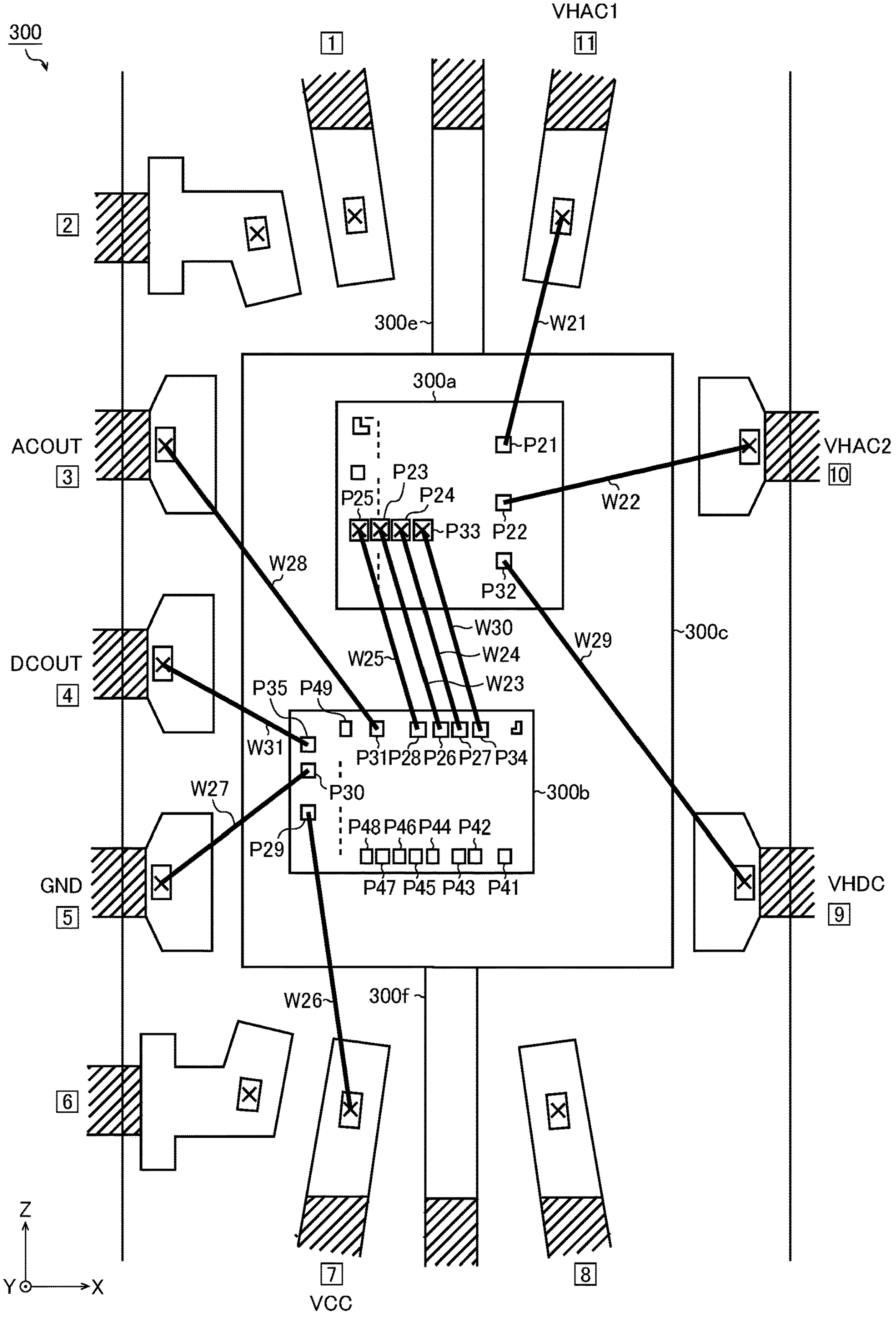
FIG. 44 is a diagram illustrating a sixth example of the package layout.

FIG. 44 is a diagram illustrating a sixth example of the package layout of the semiconductor integrated circuit device 300 (XZ plan view). The semiconductor integrated circuit device 300 of this diagram is based on the package layout of FIG. 36 (fourth example), in which the first chip 300*a* of FIG. 39 and the second chip 300*b* of FIG. 42 are mounted on the island 300*c* similarly to the fifth example (FIG. 43) described above.

Specifically, in this diagram, the first chip 300*a* of FIG. 39 is rotated by 180° in the clockwise direction (or in the counterclockwise direction) and is mounted in the left and right middle upper side region of the island 300*c* (i.e. a position shifted to the left and right middle of the island 300*c* from the position in FIG. 43). Further, in this diagram, the second chip 300*b* of FIG. 42 is rotated by 90° in the clockwise direction and is mounted in the lower left region of the island 300*c* (i.e. a position shifted to the up and down middle of the island 300*c* from the position in FIG. 43).

Pad P21 (VHAC1) is connected to Pin 11 (VHAC1) via the wire W21. Pad P22 (VHAC2) is connected to Pin 10 (VHAC2) via the wire W22. Pad P32 (VHDC) is connected to Pin 9 (VHDC) via the wire W29. Pad P23 (ACIN1) is connected to Pad P26 (ACIN1) via the wire W23. Pad P24 (ACIN2) is connected to Pad P27 (ACIN2) via the wire W24. Pad P25 (GND) is connected to Pad P28 (GND) via the wire W25. Pad P33 (DCIN) is connected to Pad P34 (DCIN) via the wire W30. Pad P29 (VCC) is connected to a distal end side of Pin 7 (VCC) via the wire W26. Pad P30 (GND) is connected to Pin 5 (GND) via the wire W27. Pad P35 (DCOUT) is connected to Pin 4 (DCOUT) via the wire W31. Pad P31 (ACOUT) is connected to a distal end side of Pin 3 (ACOUT) via the wire W28.

Note that Pad P23 to Pad P25 and Pad P33 of the first chip 300*a*, and Pad P26 to Pad P28 and Pad P34 of the second chip 300*b* are arranged in the left and right direction (X-axis direction) on the paper in each corresponding order, respectively. Therefore, the wires W23 to W25 and W30 between pads can be formed in minimum distances without crossing. This is the same as described above with reference to FIG. 43.

Further, Pad P21 to Pad P22 and Pad P32 of the first chip 300*a* are arranged in the up and down direction (Z-axis direction) on the paper in the order corresponding to Pin 11 (VHAC1 pin), Pin 10 (VHAC2 pin), and Pin 9 (VHDC pin), respectively. Therefore, the wires W21, W22, and W29 between pin and pad can be formed in minimum distances without crossing.

Similarly, Pad P29 to Pad P30 and Pad P35 of the second chip 300*b* are arranged in the up and down direction (Z-axis direction) on the paper in the order corresponding to Pin 7 (VCC pin), Pin 5 (GND pin), and Pin 4 (DCOUT pin), respectively. Therefore, the wires W26, W27, and W31 between pin and pad can be formed in minimum distances without crossing.

Note that Pad P41 to Pad P49 for chip test are not used after packaging into the semiconductor integrated circuit device 300, and hence they are not connected to any pin. This is also the same as described above with reference to FIG. 43.

Further, as to frame areas inside the package, each of Pin 2 (N.C. pin) and Pin 6 (N.C. pin) is larger than Pin 3 (ACOUT pin), Pin 4 (DCOUT pin), or Pin 5 (GND pin).

In other words, as to the X direction (i.e. the left and right direction on the paper), Pin 2 (N.C. pin) and Pin 6 (N.C. pin) have portions protruding than Pin 3 (ACOUT pin), Pin 4 (DCOUT pin), and Pin 5 (GND pin).

Further, as to the Z direction (i.e. the up and down direction on the paper), Pin 2 (N.C. pin) and Pin 6 (N.C. pin) have no portion overlapping the island 100*c*. Similarly, Pin 1 (N.C. pin), Pin 7 (VCC pin), Pin 8 (N.C. pin), and Pin 11 (VHAC1 pin) also have no portion overlapping the island 100*c*.

Furthermore, the support frames 300*e* and 300*f* for supporting the island 300*c* are formed respectively between Pin 1 (N.C. pin) and Pin 11 (VHAC1 pin) and between Pin 7 (VCC pin) and Pin 8 (N.C. pin).

<Pin Assignment>

Figure 45:
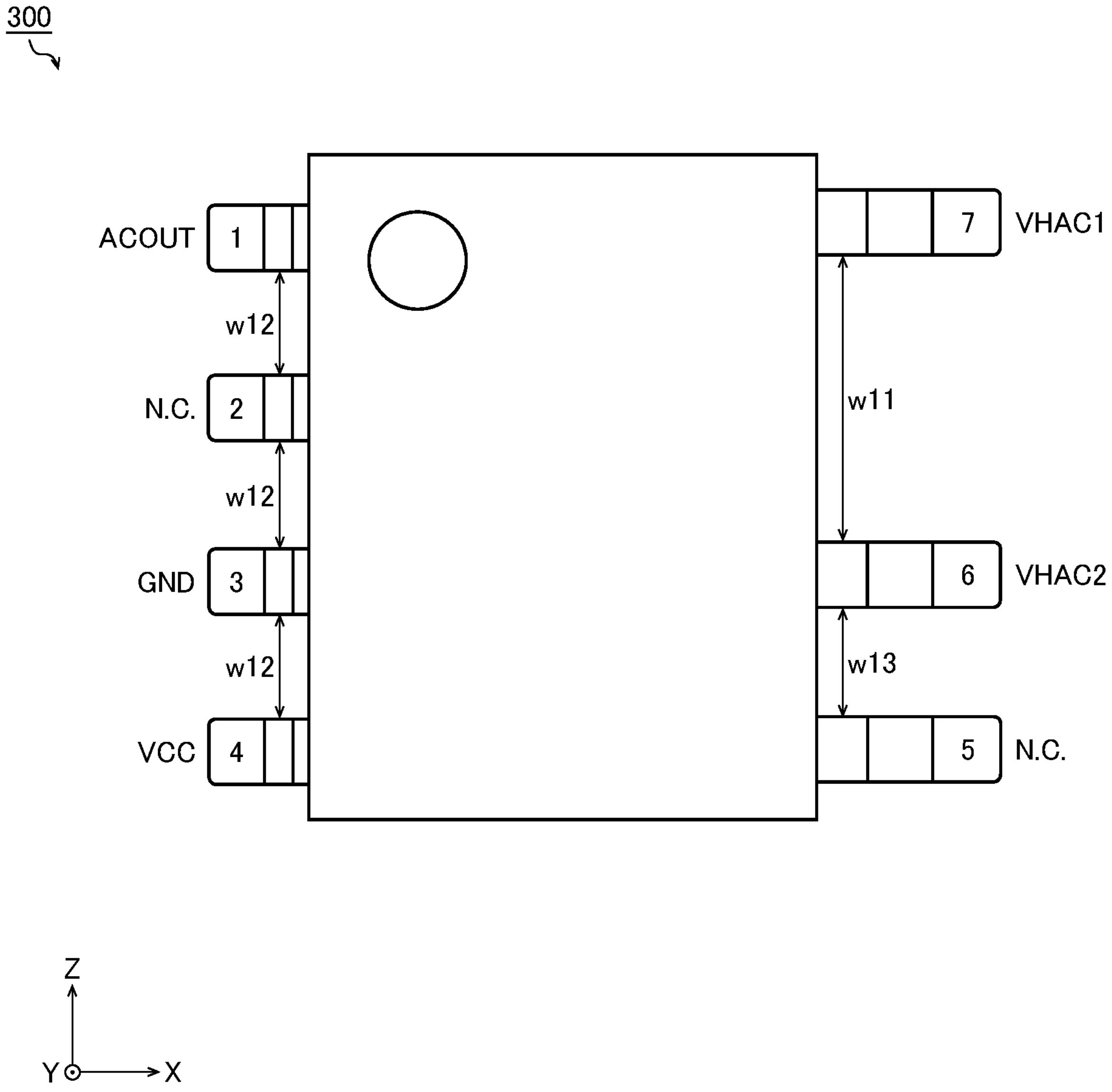
FIG. 45 is a plan view illustrating a pin assignment (seven pins) of the semiconductor integrated circuit device.

FIG. 45 is a plan view illustrating a pin assignment of the semiconductor integrated circuit device 300 adopting a seven pin package (FIG. 43). On the left side of the package, Pin 1 (ACOUT), Pin 2 (N.C.), Pin 3 (GND), and Pin 4 (VCC) are led out in order from top to bottom on the paper. In contrast, on the right side of the package, Pin 5 (N.C.), Pin 6 (VHAC2), and Pin 7 (VHAC1) are led out in order from bottom to top on the paper.

Note that it is preferred to set an inter-terminal distance w11 between Pin 7 (VHAC1) and Pin 6 (VHAC2), to each of which a high voltage is applied, to be larger than an inter-terminal distance w12 between neighboring pins of Pin 1 to Pin 4 and an inter-terminal distance w13 between Pin 5 and Pin 6. For instance, in this illustrated example, an external terminal to be originally disposed between Pin 6 and Pin 7 (i.e. a pin opposed to Pin 2) is removed, and hence the inter-terminal distance w11 between Pin 6 and Pin 7 is increased.

Further, a length of Pin 1 to Pin 4 led out from the left side of the package is not necessarily the same as a length of Pin 5 to Pin 7 led out from the right side of the package. For instance, as illustrated in this diagram, Pin 5 to Pin 7 may be led out to be longer than Pin 1 to Pin 4.

Figure 46:
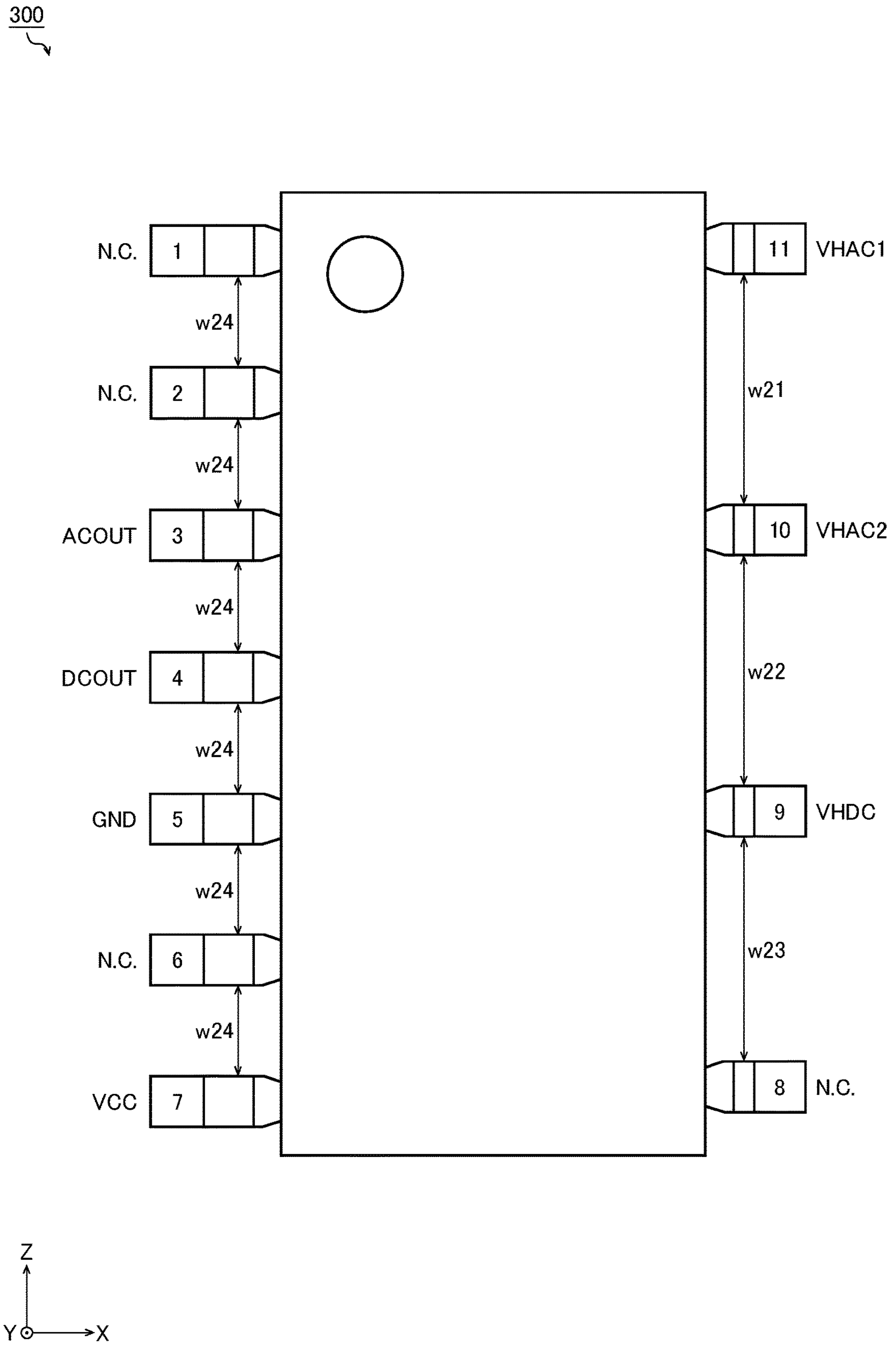
FIG. 46 is a plan view illustrating a pin assignment (eleven pins) of the semiconductor integrated circuit device.

FIG. 46 is a plan view illustrating a pin assignment of the semiconductor integrated circuit device 300 adopting an eleven pin package (FIG. 44). In the example of this diagram, on the left side of the package, Pin 1 (N.C.), Pin 2 (N.C.), Pin 3 (ACOUT), Pin 4 (DCOUT), Pin 5 (GND), Pin 6 (N.C.), and Pin 7 (VCC) are led out in order from top to bottom on the paper. In contrast, on the right side of the package, Pin 8 (N.C. pin), Pin 9 (VHDC), Pin 10 (VHAC2), and Pin 11 (VHAC1) are led out in order from bottom to top on the paper.

Note that it is preferred to set an inter-terminal distance w21 between Pin 11 (VHAC1) and Pin 10 (VHAC2), an inter-terminal distance w22 between Pin 10 (VHAC2) and Pin 9 (VHDC), and an inter-terminal distance w23 between Pin 9 (VHDC) and Pin 8 (N.C.), to each of which a high voltage is applied, to be larger than an inter-terminal distance w24 between neighboring pins of Pin 1 to Pin 7. For instance, in this illustrated example, external terminals to be originally disposed between Pin 8 and Pin 9, between Pin 9 and Pin 10, and between Pin 10 and Pin 11 (i.e. pins opposed respectively to Pin 2, Pin 4, and Pin 6) are removed, and hence the inter-terminal distance w23 between Pin 8 and in 9, the inter-terminal distance w22 between Pin 9 and Pin 10, and the inter-terminal distance w21 between Pin 10 and Pin 11 are increased.

Further, a length of Pin 1 to Pin 7 led out from the left side of the package is not necessarily the same as a length of Pin 8 to Pin 11 led out from the right side of the package. For instance, as illustrated in this diagram, Pin 8 to Pin 11 may be led out to be shorter than Pin 1 to Pin 7.

Further, each of Pin 1 to Pin 11 is preferably formed to be thin at the proximal end.

<Input Offset and Signal Delay>

Figure 47:
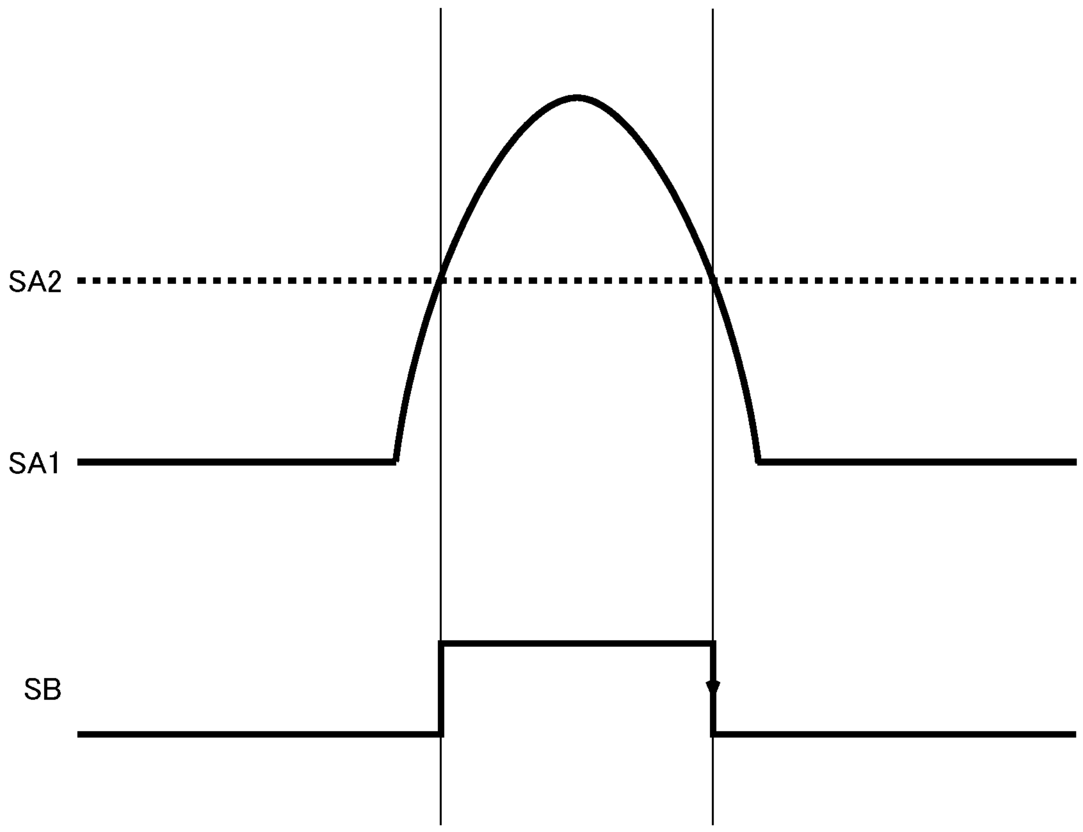
FIG. 47 is a diagram illustrating an operation of generating a comparison signal (without input offset, without signal distortion).
Figure 48:
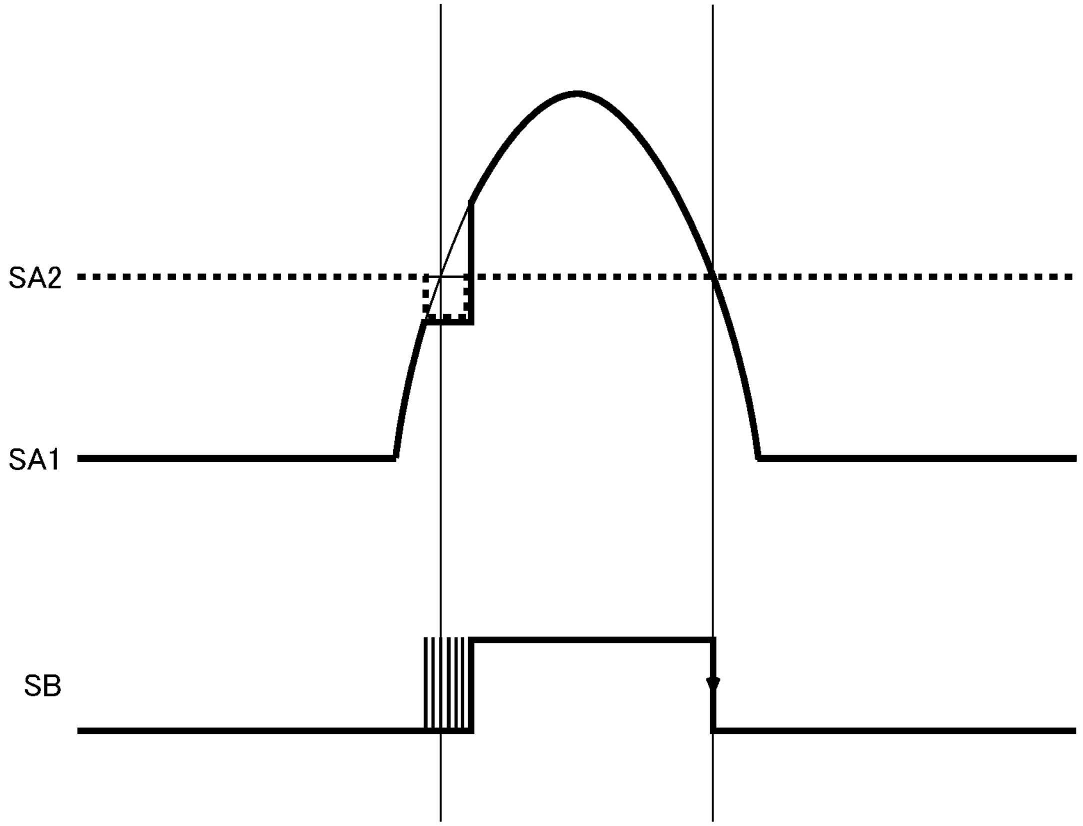
FIG. 48 is a diagram illustrating an operation of generating the comparison signal (without input offset, with signal distortion).
Figure 49:
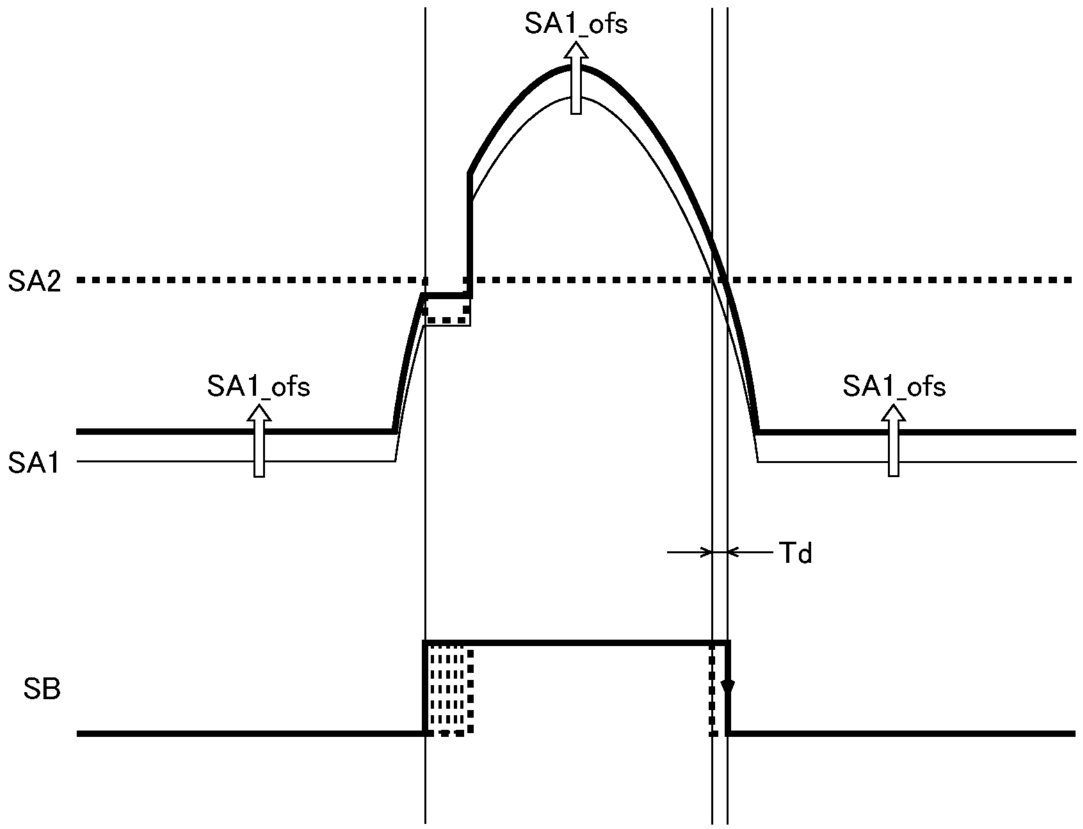
FIG. 49 is a diagram illustrating an operation of generating the comparison signal (with input offset, with signal distortion).

Next, input offset and signal delay in the zero-crossing detection unit 320 are discussed with reference to FIGS. 47 to 49. FIGS. 47 to 49 are diagrams illustrating operation of generating the comparison signal SB in the zero-crossing detection unit 320, in which the AC monitor signals SA1 (solid line) and SA2 (broken line) and the comparison signal SB are shown in order from top to bottom on the paper.

Note that FIGS. 47 to 49 show behaviors respectively under a first condition (without input offset and without signal distortion), a second condition (without input offset and with signal distortion), and a third condition (with input offset and with signal distortion).

As illustrated in FIG. 47, in an application in which a distortion hardly occurs in the AC monitor signals SA1 and SA2 (such as a dryer in which a motor is driven by a small current), chattering hardly occurs in the comparison signal SB even if the zero-crossing detection unit 320 has no input offset. Therefore, the zero-crossing detection unit 320 has no signal delay, and a logic level of the comparison signal SB switches without delay every time when the AC monitor signals SA1 and SA2 cross each other.

In contrast, as illustrated in FIG. 48, in an application in which a distortion easily occurs in the AC monitor signals SA1 and SA2 (such as a washing machine in which a motor is driven by a large current), chattering may occur in the comparison signal SB near zero cross timing if the zero-crossing detection unit 320 has no input offset.

Note that, as illustrated in FIG. 49, if the zero-crossing detection unit 320 has an input offset (e.g. an input offset SA1_ofs that shifts the AC monitor signal SA1 to the positive side), even if a distortion occurs in the AC monitor signals SA1 and SA2, chattering in the comparison signal SB can be avoided. However, if the zero-crossing detection unit 320 has an input offset, logic switch timing of the comparison signal SB (therefore a detection result of zero cross timing) is delayed by delay time Td.

In particular, it is known that the delay time Td has dependency on the monitoring target voltage V11 applied to the VHAC1 pin (therefore the AC voltage V0), and operation of the application may be disturbed. In the following description, a novel embodiment to solve such a malfunction is proposed.

Semiconductor Integrated Circuit Device (Seventh Embodiment)

Figure 50:
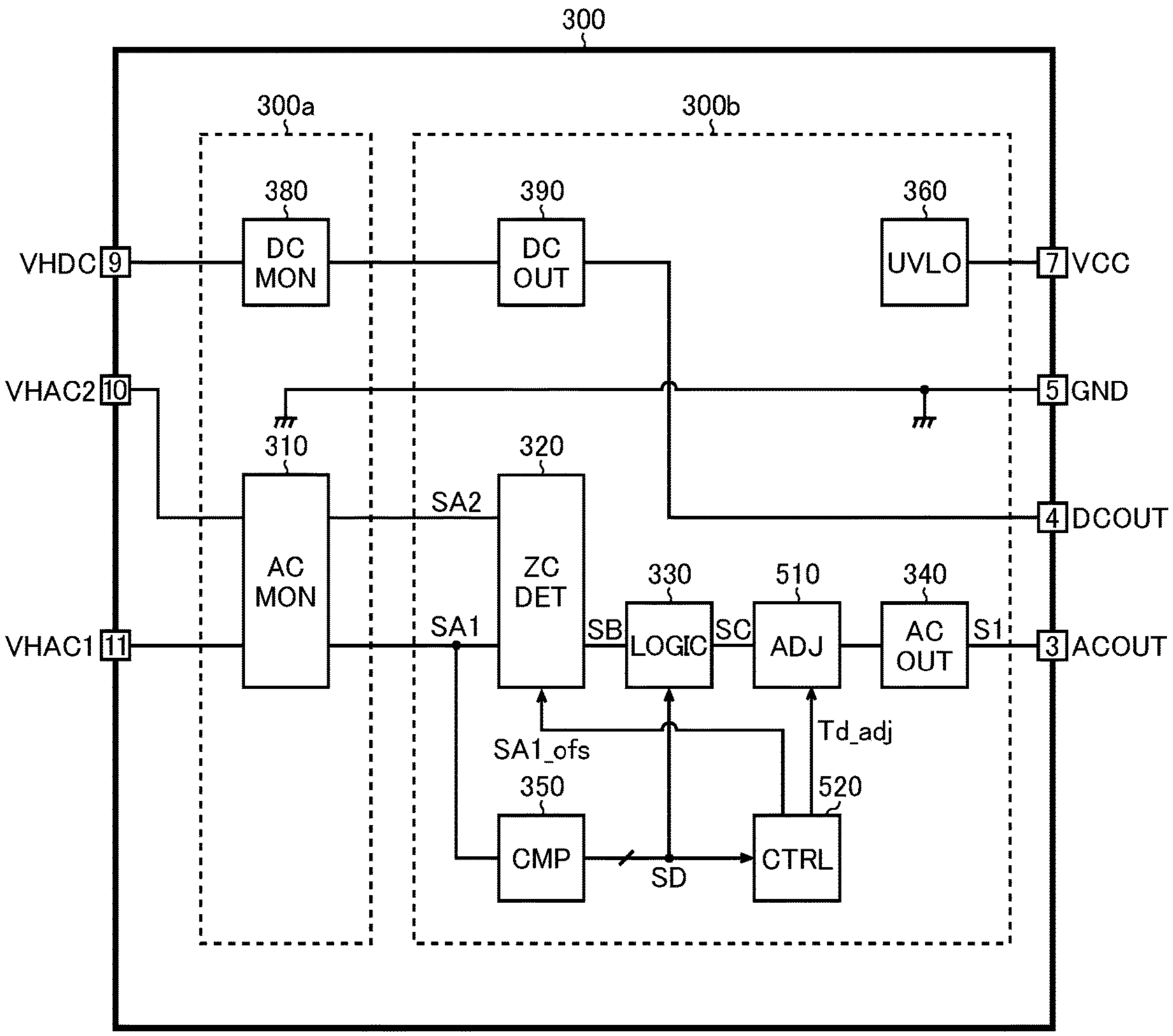
FIG. 50 is a diagram illustrating a seventh embodiment of the semiconductor integrated circuit device.

FIG. 50 is a diagram illustrating a seventh embodiment of the semiconductor integrated circuit device 300. The semiconductor integrated circuit device 300 of this embodiment is based on FIG. 37 described above (i.e. the fifth embodiment (FIG. 22) plus the DC monitoring function plus the eleven pin package), and further includes a delay adjusting unit 510 and a control unit 520. Therefore, a structural element described above is denoted by the same numeral or symbol as in FIG. 37, so that overlapping description is omitted. In the following description, characteristic parts of this embodiment are mainly described.

The delay adjusting unit 510 is disposed on a subsequent stage of the logic unit 330, and adjusts the delay time Td of the zero-crossing detection signal SC (referred to as a zero cross delay time Td in the following description), in accordance with a delay adjustment amount Td_adj instructed from the control unit 520.

The control unit 520 sets the delay adjustment amount Td_adj on the basis of a plurality of comparison signals SD output from the comparing unit 350 (i.e. a peak value of the monitoring target voltage V11, therefore a logic signal on which a peak value of the AC voltage V0 is reflected). Further, the control unit 520 also has a function of switching the input offset SA1_ofs of the zero-crossing detection unit 320 on the basis of the plurality of comparison signals SD.

Figure 51:
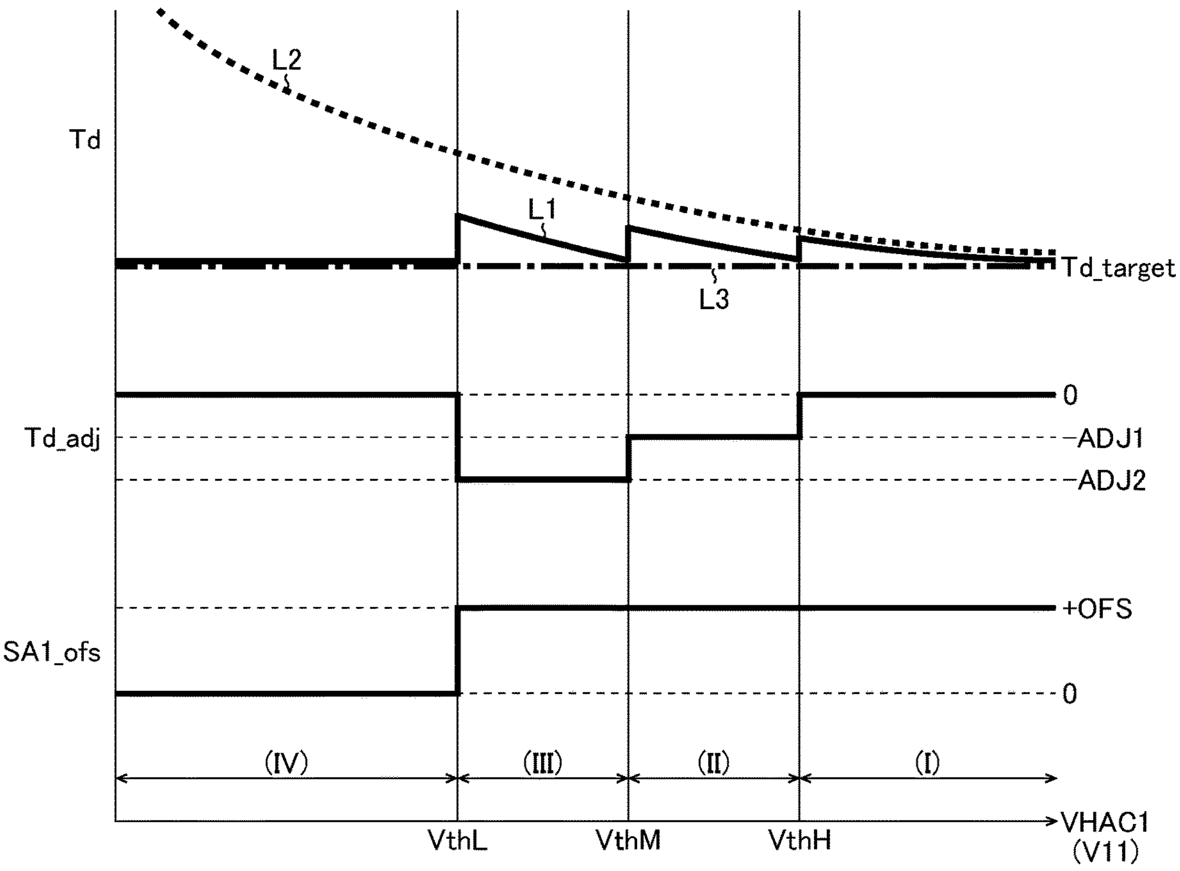
FIG. 51 is a diagram illustrating a variation suppressing process of zero cross delay time.

FIG. 51 is a diagram illustrating a variation suppressing process of the zero cross delay time Td by the delay adjusting unit 510 and the control unit 520, in which the zero cross delay time Td, the delay adjustment amount Td_adj, and the input offset SA1_ofs are shown in order from top to bottom on the paper.

Note that the horizontal axis in this diagram represents a peak value of the terminal voltage VHAC1 (i.e. a peak value of the monitoring target voltage V11 applied to the VHAC1 pin, therefore corresponding to a peak value of the AC voltage V0), and as to the threshold value voltages VthH, VthM, and VthL to be compared with the same, VthH>VthM>VthL holds.

Further, as to the zero cross delay time Td, a solid line L1 shows behaviors in the case where switching control of the delay adjustment amount Td_adj and the input offset SA1_ofs is performed. In contrast, a broken line L2 shows behaviors in the case where the switching control of the delay adjustment amount Td_adj and the input offset SA1_ofs is not performed (in the case where Td_adj=0 and SA1_ofs=+OFS always hold). Further, a dot-and-dashed line L3 shows behaviors in the case where the input offset SA1_ofs is not given (in the case where Td_adj=0 and SA1_ofs=0 always hold).

In the case where the switching control of the delay adjustment amount Td_adj and the input offset SA1 ofs is not performed, as shown by the broken line L2, the zero cross delay time Td increases and separates from a predetermined target zero cross delay time Td_target as the terminal voltage VHAC1 decreases.

In contrast, in the case where the switching control of the delay adjustment amount Td_adj and the input offset SA1_ofs is performed, as shown by the solid line L1, the zero cross delay time Td is maintained at the predetermined target zero cross delay time Td_target (or a value close to the same).

Specifically with reference to this diagram, for example, in a voltage range (I) in which VthH<VHAC1 holds, Td_adj=0 (without delay adjustment) and SA1_ofs=+OFS (with input offset) are set. In this voltage range (I), the zero cross delay time Td is not adjusted, and hence the solid line L1 shows the same behavior as the broken line L2. In other words, the zero cross delay time Td increases and separates from the target zero cross delay time Td_target along with decrease in the terminal voltage VHAC1. However, in the voltage range (I), separation from the target zero cross delay time Td_target is not so large, and hence there is no special malfunction.

In contrast, in a voltage range (II) in which VthM<VHAC1<VthH holds, Td_adj=−ADJ1 (small delay adjustment) and SA1_ofs=+OFS (with input offset) are set. In other words, the zero cross delay time Td after delay adjustment (solid line L1) is shown as Td=Td0−ADJ1 (where, Td0 represents the zero cross delay time when the delay is not adjusted (broken line L2)).

Further, in a voltage range (III) in which VthL<VHAC1<VthM holds, Td_adj=−ADJ2 (large delay adjustment) and SA1_ofs=+OFS (with input offset) are set. In other words, the zero cross delay time Td after the delay adjustment (solid line L1) is shown as Td=Td0−ADJ2 (where ADJ2>ADJ1 holds).

As a matter of course, the zero cross delay time Td after the delay adjustment (solid line L1) also varies depending on the terminal voltage VHAC1, similarly to the zero cross delay time Td0 when the delay is not adjusted (broken line L2), but because only the delay adjustment amount Td_adj is shifted to the negative side, the separation from the target zero cross delay time Td_target can be controlled to be small.

Furthermore, in a voltage range (IV) in which VHAC1<VthL holds, Td_adj=0 (without delay adjust) and SA1_ofs=0 (without input offset) are set. In this way, in the voltage range (IV) in which the separation from the target zero cross delay time Td_target cannot be controlled in a desired range even if the delay adjust is performed, giving of the input offset SA1_ofs is stopped. As a result, no signal delay occurs in the zero-crossing detection unit 320, and hence the zero cross delay time Td does not separate from the target zero cross delay time Td_target.

Note that, in an application in which a distortion hardly occurs in the AC monitor signals SA1 and SA2, without depending on a peak value of the terminal voltage VHAC1, both the delay adjustment amount Td_adj and the input offset SA1_ofs should be fixed to zero, and the zero cross delay time Td should be maintained at the target zero cross delay time Td_target, as shown by the dot-and-dashed line L3.

Semiconductor Integrated Circuit Device (Eighth Embodiment)

Figure 52:
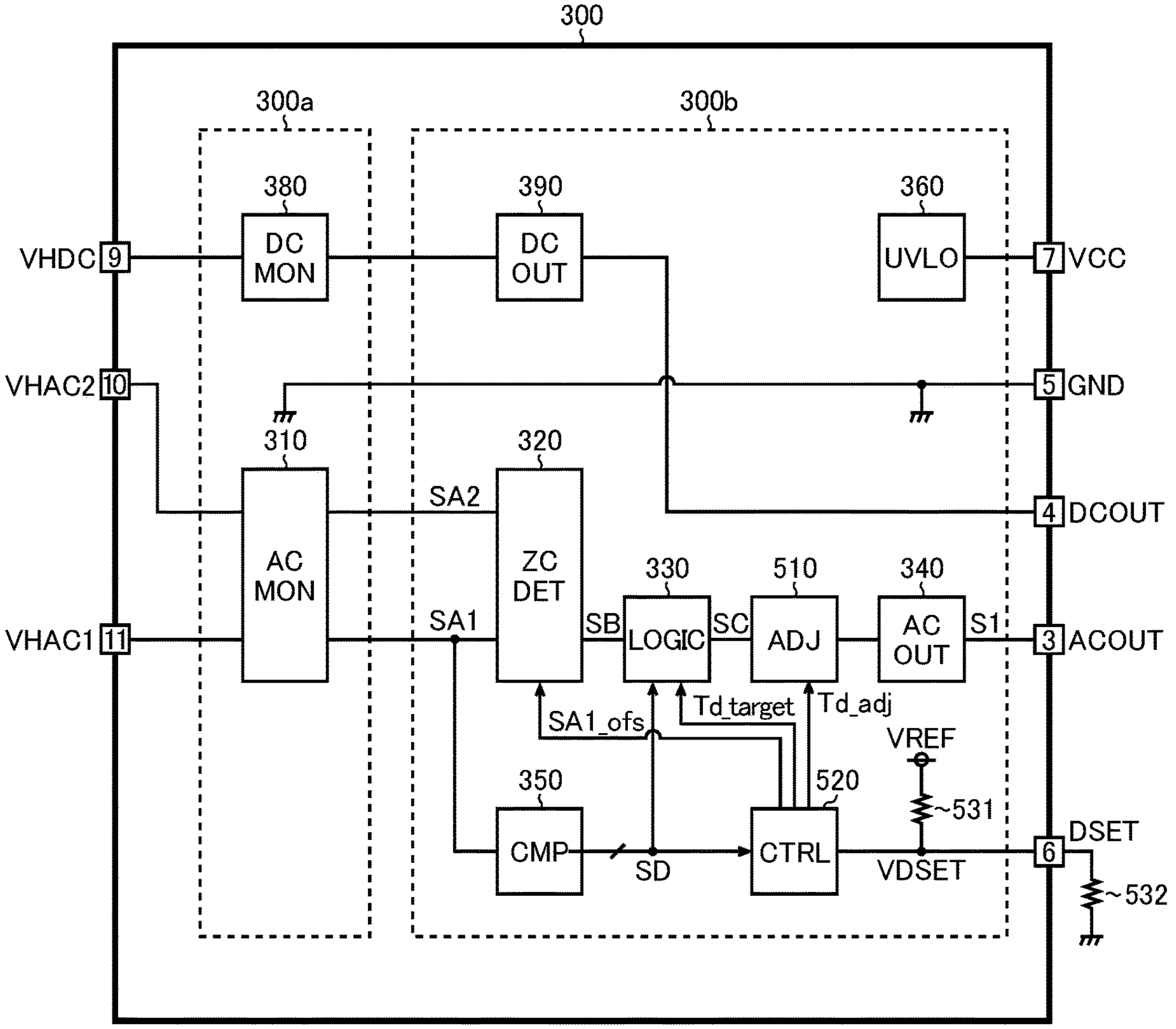
FIG. 52 is a diagram illustrating an eighth embodiment of the semiconductor integrated circuit device.

FIG. 52 is a diagram illustrating an eighth embodiment of the semiconductor integrated circuit device 300. The semiconductor integrated circuit device 300 of this embodiment is based on the seventh embodiment (FIG. 50) described above, in which Pin 6 is used as a delay setting terminal DSET. Therefore, a structural element described above is denoted by the same numeral or symbol as in FIG. 50, so that overlapping description is omitted. In the following description, characteristic parts of this embodiment are mainly described.

Inside the semiconductor integrated circuit device 300, an internal resistor 531 (having a resistance value of R1) is connected between an input terminal of an internal reference voltage VREF and the delay setting terminal DSET. Further, outside the semiconductor integrated circuit device 300, an external resistor 532 (having a resistance value of R2) is connected between the delay setting terminal DSET and the ground terminal. Therefore, a terminal voltage VDSET (=α×VREF) obtained by dividing the internal reference voltage VREF using a predetermined voltage division ratio α (=R2/(R1+R2)) appears at the delay setting terminal DSET.

The control unit 520 has a function of setting the target zero cross delay time Td_target to an arbitrary value in accordance with the terminal voltage VDSET (corresponding to a delay setting signal).

Figure 53:
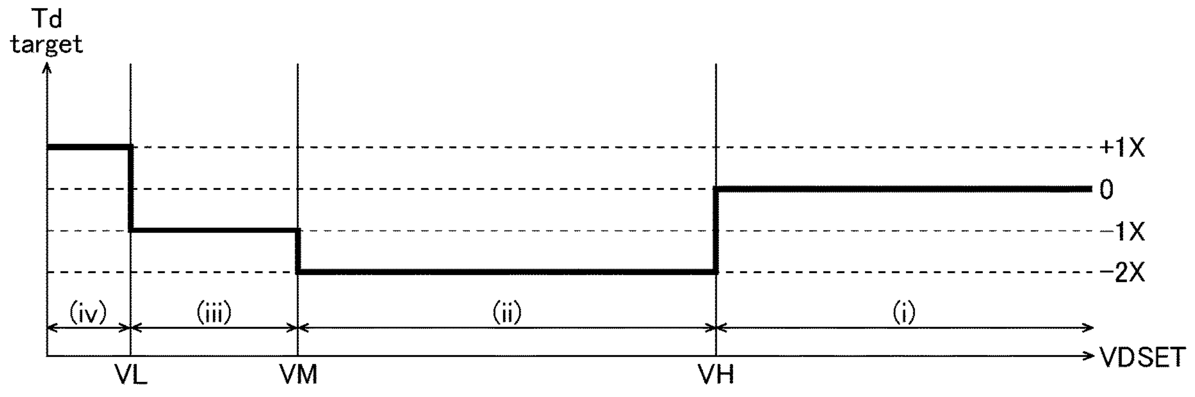
FIG. 53 is a diagram illustrating an example of arbitrarily setting a target zero cross delay time.

FIG. 53 is a diagram illustrating an example of arbitrarily setting the target zero cross delay time Td_target. Note that the horizontal axis in this diagram represents the terminal voltage VDSET, and as to the threshold value voltages VH, VM, and VL to be compared with the same, VREF>VH>VM>VL holds (e.g. VREF=3.0 V, VH=2.5 V, VM=1.0 V, and VL=0.3 V).

Specifically with reference to this diagram, in a voltage range (i) in which VH<VDSET holds, Td_target=0 is set. Note that, in order to control the terminal voltage VDSET to be within the voltage range (i), for example, the delay setting terminal DSET should be open (VDSET≈3.0 V).

Further, in a voltage range (ii) in which VM<VDSET<VH holds, Td_target=−2X (e.g. X=200 (μs)) is set. Note that, in order to control the terminal voltage VDSET to be within the voltage range (ii), for example, the external resistor 532 of 330 kΩ should be connected to the internal resistor 531 of 280 kΩ (VDSET≈1.6 V).

Further, in a voltage range (iii) in which VL<VDSET<VM holds, Td_target=−1X is set. Note that, in order to control the terminal voltage VDSET to be within the voltage range (iii), for example, the external resistor 532 of 68 kΩ should be connected to the internal resistor 531 of 280 kΩ (VDSET≈0.6 V).

Further, in a voltage range (iv) in which VDSET<VL holds, Td_target=+1X is set. Note that, in order to control the terminal voltage VDSET to be within the voltage range (iv), for example, the delay terminal DSET should be short-circuited to GND (VDSET≈0 V).

Here, in the logic unit 330, as described above, cross timing between the AC monitor signals SA1 and SA2 in the previous period is detected, and timing control of the zero-crossing detection signal SC in the next period is performed (see FIG. 26 and others). Therefore, it is also possible to set the target zero cross delay time Td_target to a negative value (<0) as described above.

Note that the function of arbitrarily setting the target zero cross delay time Td_target (the eighth embodiment) is not necessarily combined with the variation suppressing function of the zero cross delay time Td (the seventh embodiment), but each of them can be independently introduced.

Further, this embodiment shows the example in which the target zero cross delay time Td_target is switched in four steps in accordance with the terminal voltage VDSET, but the number of switching steps is arbitrary.

<ACOUT Output Waveform>

Figure 54:
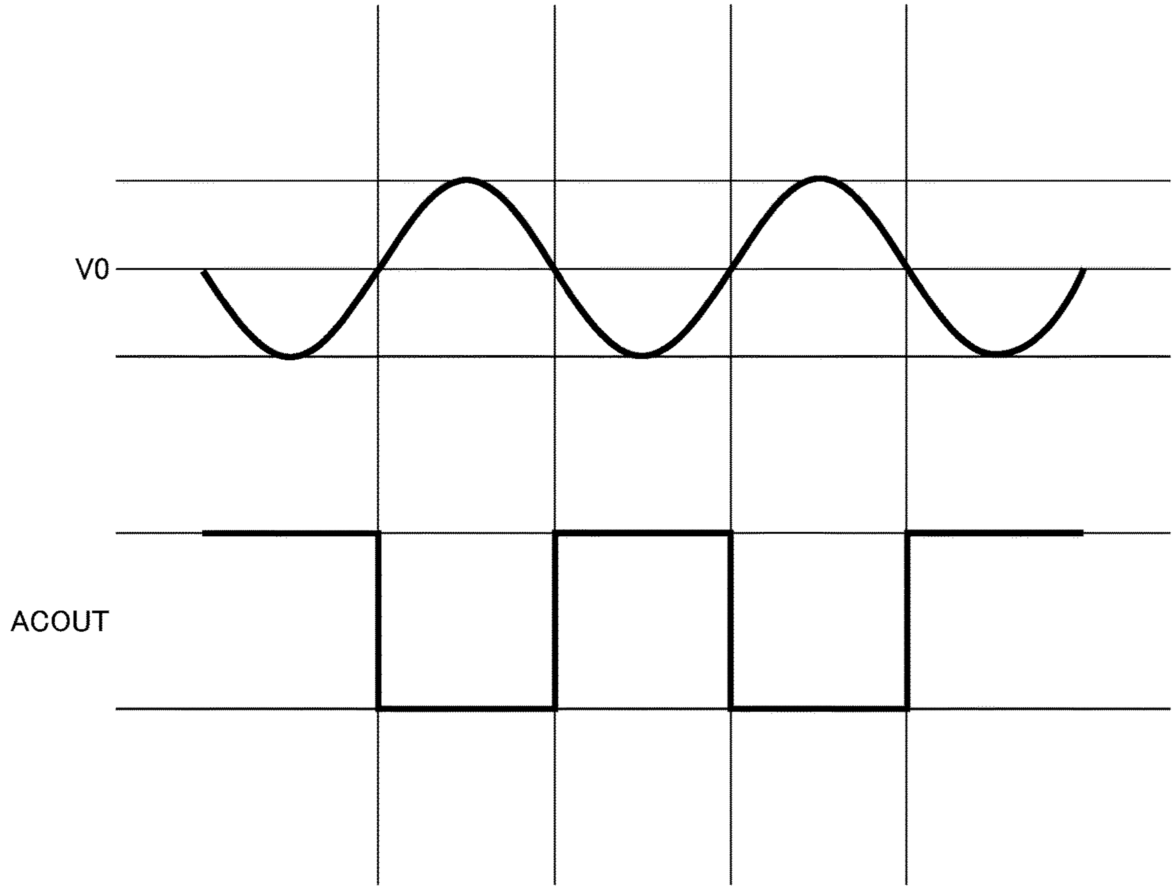
FIG. 54 is a diagram illustrating a first output waveform of an ACOUT signal.
Figure 55:
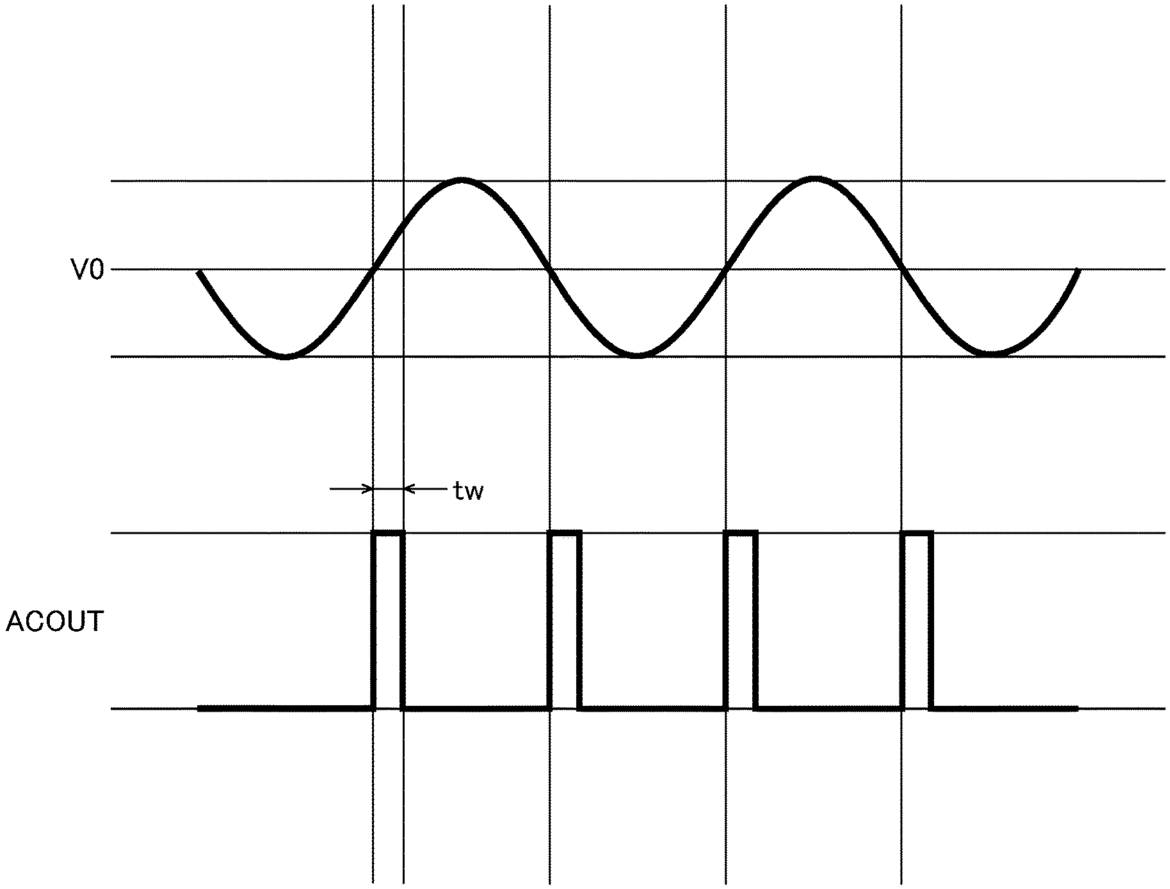
FIG. 55 is a diagram illustrating a second output waveform of the ACOUT signal.

Next, an output waveform of the ACOUT signal S1 is examined. The output form of the ACOUT signal S1 may be a rectangular type in which a logic level is alternately switched at every zero cross timing of the AC voltage V0 (FIG. 54), or may be an edge type in which a trigger pulse having a predetermined pulse width tw is generated every zero cross timing of the AC voltage V0 (FIG. 55).

Semiconductor Integrated Circuit Device (Ninth Embodiment)

Figure 56:
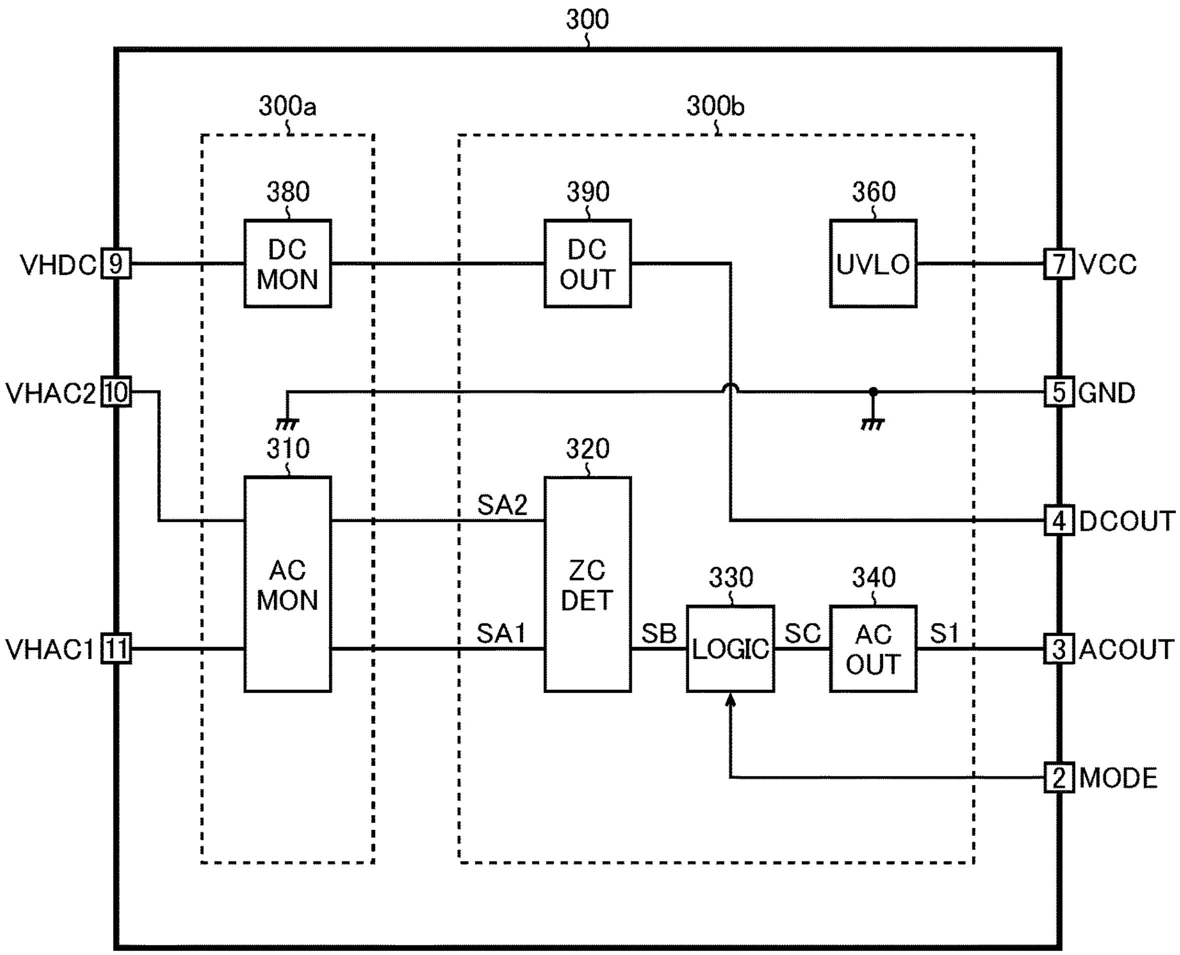
FIG. 56 is a diagram illustrating a ninth embodiment of the semiconductor integrated circuit device.
Figure 57:
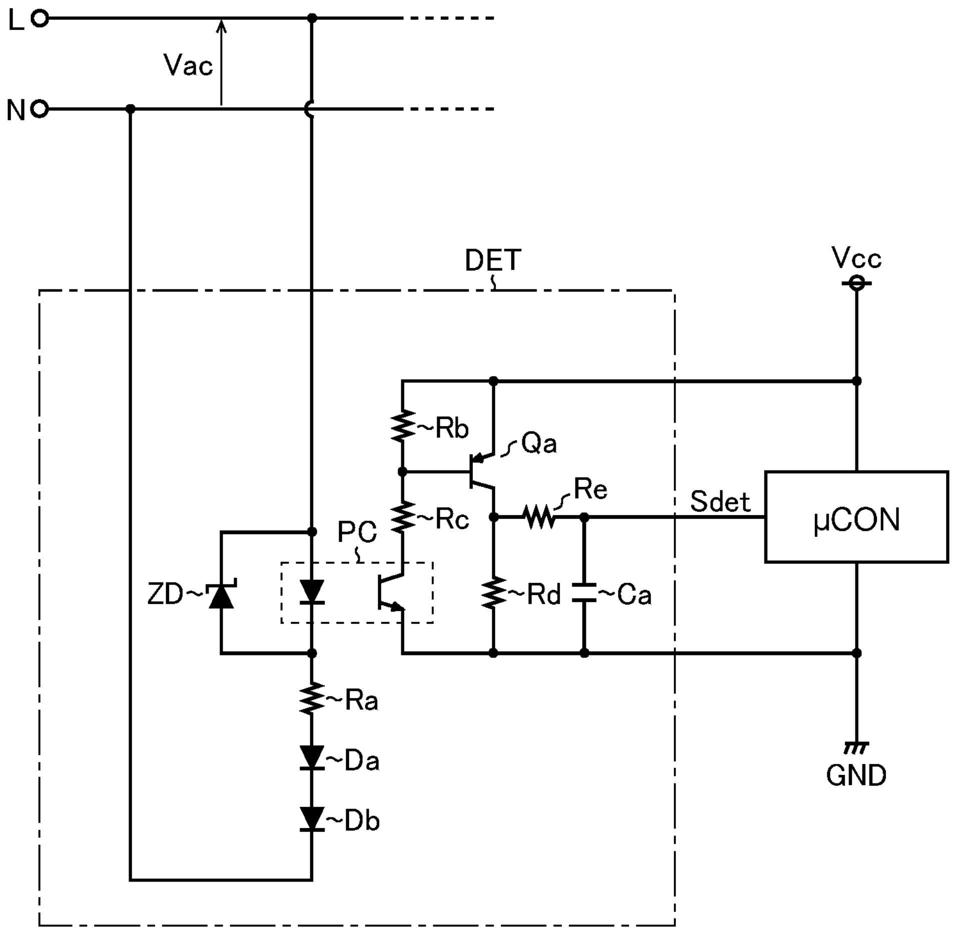
FIG. 57 is a diagram illustrating a conventional example of the zero-crossing detection circuit.

FIG. 56 is a diagram illustrating a ninth embodiment of the semiconductor integrated circuit device 300. The semiconductor integrated circuit device 300 of this embodiment is based on FIG. 37 described above (i.e. the fifth embodiment (FIG. 22) plus the DC monitoring function plus the eleven pin package), in which Pin 2 is used as an output mode setting terminal MODE. Therefore, a structural element described above is denoted by the same numeral or symbol as in FIG. 37, so that overlapping description is omitted. In the following description, characteristic parts of this embodiment are mainly described.

The logic unit 330 has a function of switching the output form of the ACOUT signal S1 to one of the rectangular type (FIG. 54) and the edge type (FIG. 55) in accordance with an input signal to the output mode setting terminal MODE. Note that the input signal to the output mode setting terminal MODE may be either an analog signal or a digital signal.

Further, the seventh embodiment (FIG. 50), the eighth embodiment (FIG. 52), and the ninth embodiment (FIG. 56) show examples based on FIG. 37, but it may be based on other embodiment. For instance, when adopting the seventh to ninth embodiments, whether the DC monitoring function is provided or not, the number of package pins, and the like do not care.

<Summary>

In the following description, various embodiments disclosed in this specification are described in the block.

For instance, the zero-crossing detection circuit disclosed in this specification includes a peak detection unit arranged to detect a peak of a monitoring target signal input through a diode from an AC signal input terminal so as to generate a peak detection signal, and a zero-crossing detection unit arranged to estimate a zero cross of the AC signal from the peak detection signal so as to generate a zero-crossing detection signal.

Note that the zero-crossing detection circuit having the above-mentioned structure preferably further includes a monitoring unit arranged to adjust the monitoring target signal to be suitable for input to the peak detection unit.

Further, in the zero-crossing detection circuit having the above-mentioned structure, the zero-crossing detection unit preferably counts a period of the peak detection signal and estimates a zero cross of the AC signal using a count value thereof.

Further, the zero-crossing detection circuit having the above-mentioned structure preferably further includes a comparing unit arranged to compare the monitoring target signal with a plurality of threshold values so as to generate a plurality of comparison signals, and a waveform determination unit arranged to detect whether or not both a rising edge and a falling edge have occurred in at least one of the comparison signals during one period of the zero-crossing detection signal so as to generate a waveform determination signal.

Further, in the zero-crossing detection circuit having the above-mentioned structure, the zero-crossing detection unit preferably stops generation or output of the zero-crossing detection signal when the waveform determination signal is an abnormal determination logic level.

Further, in the zero-crossing detection circuit having the above-mentioned structure, if a logic level of the peak detection signal is switched and then the logic level after the switching is not kept for a predetermined period, the zero-crossing detection unit preferably ignores the switching of the logic level.

Further, for example, the zero-crossing detection circuit disclosed in this specification includes a zero-crossing detection unit arranged to compare a first monitoring target signal and a second monitoring target signal, respectively input through diodes from a first node and a second node between which an AC signal is applied, so as to generate a first comparison signal, and a logic unit arranged to estimate a zero cross of the AC signal from the first comparison signal so as to generate the zero-crossing detection signal.

Note that the zero-crossing detection circuit having the above-mentioned structure preferably further includes a monitoring unit arranged to adjust the first monitoring target signal and the second monitoring target signal to be suitable for input to the zero-crossing detection unit.

Further, in the zero-crossing detection circuit having the above-mentioned structure, the logic unit preferably counts a period of the first comparison signal and estimates a zero cross of the AC signal using a count value thereof.

Further, in the zero-crossing detection circuit having the above-mentioned structure, the zero-crossing detection unit preferably compares the first monitoring target signal with a predetermined threshold value so as to generate a second comparison signal, and the logic unit preferably counts a period of the second comparison signal instead of the first comparison signal when the first monitoring target signal is lower than the threshold value, and estimates a zero cross of the AC signal using a count value thereof.

Further, in the zero-crossing detection circuit having the above-mentioned structure, if a logic level of the second comparison signal is switched and then the logic level after the switching is not kept for a predetermined period, the logic unit preferably ignores the switching of the logic level.

Further, the zero-crossing detection circuit having the above-mentioned structure preferably further includes a control unit arranged to set a delay adjustment amount on the basis of a peak value of the AC signal, and a delay adjusting unit arranged to adjust delay time of the zero-crossing detection signal in accordance with the delay adjustment amount.

Further, in the zero-crossing detection circuit having the above-mentioned structure, the control unit preferably increases the delay adjustment amount more as the peak value of the AC signal is lower.

Further, in the zero-crossing detection circuit having the above-mentioned structure, the control unit preferably switches an input offset of the zero-crossing detection unit on the basis of the peak value of the AC signal.

Further, in the zero-crossing detection circuit having the above-mentioned structure, the control unit preferably sets both the delay adjustment amount and the input offset to zero when the peak value of the AC signal is lower than a predetermined threshold value.

Further, the zero-crossing detection circuit having the above-mentioned structure preferably further includes a comparing unit arranged to compare the first monitoring target signal or its voltage-divided signal with a plurality of threshold values so as to generate a plurality of comparison signals, and the control unit preferably receives input of the plurality of comparison signals having a logic value on which the peak value of the AC signal is reflected.

Further, in the zero-crossing detection circuit having the above-mentioned structure, the control unit preferably has a function of setting both the delay adjustment amount and the input offset to zero without depending on the peak value of the AC signal.

Further, the zero-crossing detection circuit having the above-mentioned structure preferably further includes a control unit arranged to set the delay time of the zero-crossing detection signal in accordance with the delay setting signal.

Further, in the zero-crossing detection circuit having the above-mentioned structure, the delay setting signal is an analog signal having a voltage value corresponding to a resistance value of an external resistor, and the control unit preferably switches the delay time step by step in accordance with a comparison result between the analog signal and a threshold value.

Further, in the zero-crossing detection circuit having the above-mentioned structure, the zero-crossing detection signal is preferably a rectangular type in which a logic level is alternately switched at every zero cross timing of the AC signal, or an edge type in which a trigger pulse having a predetermined pulse width is generated at every zero cross timing of the AC signal.

Further, in the zero-crossing detection circuit having the above-mentioned structure, the logic unit preferably switches an output form of the zero-crossing detection signal to one of the rectangular type and the edge type in accordance with an output mode setting signal.

Further, for example, the zero-crossing detection circuit disclosed in this specification includes a logic unit arranged to estimate a zero cross of the AC signal in accordance with at least one of a first monitoring target signal and a second monitoring target signal, respectively input through diodes from a first node and a second node between which an AC signal is applied, so as to generate a zero-crossing detection signal, and an input stop detection unit arranged to compare the first monitoring target signal with the second monitoring target signal after giving an offset to one of them so as to generate an input stop detection signal, in which the logic unit fixes a logic level of the zero-crossing detection signal in accordance with the input stop detection signal.

Note that, in the zero-crossing detection circuit having the above-mentioned structure, if a logic level of the input stop detection signal is switched and then the logic level after the switching is not kept for a predetermined period, the logic unit preferably ignores the switching of the logic level.

Further, the zero-crossing detection circuit having the above-mentioned structure preferably further includes a zero-crossing detection unit arranged to compare the first monitoring target signal with the second monitoring target signal so as to generate a comparison signal, and the logic unit preferably estimates a zero cross of the AC signal from the comparison signal.

Further, the zero-crossing detection circuit having the above-mentioned structure preferably further includes a monitoring unit arranged to adjust the first monitoring target signal and the second monitoring target signal to be suitable for input to the zero-crossing detection unit.

Further, in the zero-crossing detection circuit having the above-mentioned structure, the logic unit preferably counts a period of the comparison signal and estimates a zero cross of the AC signal using a count value thereof.

Further, for example, the semiconductor integrated circuit device disclosed in this specification includes integration of at least a part of circuit elements constituting the zero-crossing detection circuit having the above-mentioned structure.

Note that, in the semiconductor integrated circuit device having the above-mentioned structure, it is preferred that an inter-terminal distance between a first external terminal that receives input of the monitoring target signal and a second external terminal neighboring the first external terminal should be larger than inter-terminal distances between other external terminals.

Further, the semiconductor integrated circuit device having the above-mentioned structure preferably further includes an integrated AC/DC converter arranged to generate a first DC voltage from an AC voltage input as the AC signal.

Further, the semiconductor integrated circuit device having the above-mentioned structure preferably further includes an integrated DC/DC converter arranged to generate a second DC voltage from the first DC voltage.

Further, the semiconductor integrated circuit device having the above-mentioned structure is preferably constituted of a first chip in which a monitoring unit arranged to adjusting the monitoring target signal to be suitable for input to the peak detection unit is integrated, and a second chip in which the peak detection unit and the zero-crossing detection unit are integrated, which are preferably sealed with mold resin.

Further, the electronic equipment disclosed in this specification includes a rectifying unit arranged to perform normal rectifying or voltage doubler rectifying of an AC voltage so as to generate a rectified voltage, a zero-crossing detection circuit arranged to detect a zero cross of the AC voltage, and a microcomputer arranged to control to drive a load in accordance with a detection result by the zero-crossing detection circuit, in which the zero-crossing detection circuit is the zero-crossing detection circuit having the above-mentioned structure, or the zero-crossing detection circuit constituted using the semiconductor integrated circuit device having the above-mentioned structure.

Note that, in the electronic equipment having the above-mentioned structure, the rectifying unit preferably includes a first capacitor and a second capacitor connected in series between an output terminal of the rectified voltage and a ground terminal, and the connection node thereof is preferably connected to the second node from which the second monitoring target signal is led out.

Note that, in the electronic equipment having the above-mentioned structure, the zero-crossing detection circuit preferably operates with respect to a ground voltage common to the microcomputer.

Further, in the electronic equipment having the above-mentioned structure, the load is preferably a motor or a triac.

<Note A>

Note about FIGS. 39 to 42 described above is added as follows. The first chip, in which the monitoring unit arranged to adjust the first monitoring target signal and the second monitoring target signal to be suitable for input to the zero-crossing detection unit is integrated, is preferably cut out in a rectangular shape having a substantially equal ratio between the short side and the long side, in the plan view.

Note that, in the first chip, it is preferred to form a high-voltage region having a higher withstand voltage in a substrate thickness direction (in a vertical direction) than other regions, and to form a first pad to which the first monitoring target signal and the second monitoring target signal are input, and a first feedback resistor connected to the first pad, above the high-voltage region.

Further, it is preferred to form a plurality of the high-voltage regions along a first side of the first chip in a plan view of the first chip. Further, it is preferred to form the plurality of high-voltage regions (e.g. a first high-voltage region, a second high-voltage region, and a third high-voltage region) to be concentrated in a first region of the first chip (e.g. a half region of the first chip) in a plan view of the first chip.

In contrast, in a plan view of the first chip, it is preferred to form a second pad that outputs a signal from the monitoring unit to the zero-crossing detection unit, a second feedback resistor connected to the second pad, a third pad connected to the ground terminal, electrostatic protection elements that protects the pads, and a fuse that adjusts a resistance value of the second feedback resistor, in the second region of the first chip (e.g. remaining half region of the first chip).

Note that it is preferred to form a plurality of the second pads and the third pads along a second side perpendicular to the first side of the first chip in a plan view of the first chip. In particular, it is preferred to form and arrange the second pads and the third pads along the second side and closer to the second side than the middle of the first side in a plan view of the first chip. Further, it is preferred to set an inter-pad distance between the second pad and the third pad to be larger than an inter-pad distance of the plurality of second pads.

Further, in a plan view of the first chip, the second feedback resistor is preferably formed at a position adjacent to the high-voltage region.

Further, it is preferred to use a polysilicon resistor having a withstand voltage of 100 V or higher (e.g. 650 V) as the first feedback resistor to which a high voltage is applied.

Further, it is preferred that the high-voltage region be the LDMOSFET region.

Further, in the LDMOSFET region in a plan view of the first chip, it is preferred that a plurality of concentric ring-like drain regions and source regions be alternately formed, and that the first feedback resistor be formed on a field oxide film surrounded by the innermost drain region.

Further, each of the first feedback resistor and the second feedback resistor is formed as a combination of a plurality of unit resistors.

In contrast, the second chip in which the zero-crossing detection unit is integrated is preferably cut out in a long rectangular shape in a plan view.

Note that a plurality of pads connected to the first chip are preferably formed and arranged close to a first side of the second chip in a plan view of the second chip.

In contrast, a plurality of pads that are not connected to the first chip are preferably formed and arranged close to a second side opposed to the first side of the second chip in a plan view of the second chip.

Further, a first pad to which a voltage-divided signal of the first monitoring target signal is input and a second pad to which a voltage-divided signal of the second monitoring target signal is input are preferably disposed adjacent to each other.

Further, the inter-pad distance between the third pad to which a voltage-divided signal of the third monitoring target signal is input and the second pad is preferably larger than the inter-pad distance between the first pad and the second pad.

Further, it is preferred to dispose a fifth pad connected to the ground potential between the first pad and a fourth pad that outputs the ACOUT signal.

Further, it is preferred to dispose an eighth pad connected to the ground potential between a sixth pad that outputs the DCOUT signal and a seventh pad connected to the power supply potential.

Further, it is preferred to form an electrostatic protection element just below each of the first to sixth pads.

Further, it is preferred to form the test circuit between the first test pad and the second test pad.

Further, it is preferred to form the comparing unit, the RC filter, the zero-crossing detection unit, the input stop detection unit, and the first output unit in a region close to the first to fifth pads in a plan view of the second chip.

Further, it is preferred to form the second output unit in a region close to the sixth pad in a plan view of the second chip.

<Note B>

Next, Note about FIGS. 43 and 44 described above is added as follows. Each pad of the first chip and the second chip is preferably connected to a corresponding pin via a wire.

Note that a DCIN pin of the first chip and a DCIN pin of the second chip are preferably connected to each other regardless whether the DC voltage monitoring function is used or not.

Further, it is preferred that a plurality of output pads and a ground pad of the first chip and a plurality of input pads and a ground pad of the second chip, which are respectively connected to each other, should be arranged in the corresponding order.

<Note C>

Next, Note about FIGS. 45 and 46 described above is added as follows. As a package of the semiconductor integrated circuit device, it is preferred to use a seven pin package or an eleven pin package, for example.

Note that it is preferred to lead out a pin to which a high voltage is not applied from the first side of the package and to lead out a pin to which a high voltage is applied from the second side of the package.

Further, it is preferred that the inter-terminal distance between pins to which a high voltage is applied should be larger than the inter-terminal distance between pins to which a high voltage is not applied.

Further, a length of pins lead out from the first side of the package is not necessarily the same as a length of pins lead out from the second side of the package. For instance, the pins led out from the second side may be longer than pins led out from the first side. Further, on the contrary, the pins from the second side may be shorter than the pins from the first side.

Further, each pin may be formed to be thin at the proximal end.

<Other Variations>

Note that the embodiment described above shows the example in which drive of a motor is controlled in accordance with a detection result by the zero-crossing detection circuit, but the application of the zero-crossing detection circuit is not limited to this. It can be also applied appropriately to a power supply device or the like in which a zero cross of the AC voltage is detected so that drive of a triac is controlled.

In this way, other than the embodiment described above, the various technical features disclosed in this specification can be variously modified within the scope of the technical invention without deviating from the spirit thereof.

For instance, bipolar transistors and MOS field-effect transistors can be replaced with each other, and logic levels of various signals can be arbitrarily inverted. In other words, the embodiment described above is merely an example in every aspect and should not be understood as a limitation. The technical scope of the present invention is not limited to the embodiment and should be understood to include all modifications within meaning and scope equivalent to the claims.

INDUSTRIAL APPLICABILITY

The zero-crossing detection circuit disclosed in this specification can be used for controlling drive of a motor or a triac, for example.

LIST OF REFERENCE SIGNS

10 electronic equipment
11 filter
12 rectifying unit
12*a* to 12*d* diode
12*e* to 12*g* capacitor
13 AC/DC converter
13*a*, 13*b* resistor
13*c* error amplifier
13*d* comparator
13*e* RS flip-flop
13*f* level shifter
13*g* NMOSFET
13*h* coil
13*i* diode
14 DC/DC converter
15 microcomputer
16 driver
17 motor
18 zero-crossing detection circuit
19 input reactor
20 relay switch
100 semiconductor integrated circuit device (zero cross IC)
100*a* first chip
100*b* second chip
100*c* island
100*d* mold resin
100*e*, 100*f* support frame
110 AC monitoring unit
111 to 115 resistor
116 NMOSFET
117 PMOSFET
118 diode
120 peak detection unit
121, 122 resistor
123, 124 capacitor
125 comparator
130 zero-crossing detection unit
140 first output unit
141, 142 inverter
143 NMOSFET
144 resistor
150 DC monitoring unit
160 second output unit
170 undervoltage protection unit
180 comparing unit
181 to 184 comparator
190 AC waveform determination unit
200 printed wiring board
210 copper wire

220 solder
300 semiconductor integrated circuit device (zero cross IC)
300*a* first chip
300*b* second chip
300*c* island
310 AC monitoring unit
311 to 314 resistor
311*a* to 315*a*, 311*b* to 315*b* resistor
316*a*, 316*b* NMOSFET
317*a*, 317*b* PMOSFET
318*a*, 318*b* fuse
320 zero-crossing detection unit
321, 322 comparator
330 logic unit
340 first output unit
350 comparing unit
360 undervoltage protection unit
370 input stop detection unit
371 offset power supply
372 comparator
380 DC monitoring unit
381 to 385 resistor
386 NMOSFET
387 PMOSFET
388 fuse
390 second output unit
400, 400X to 400Z high-voltage region (LDMOSFET region)
401 feedback resistor (polysilicon resistor)
401(1) to 401(*m*) unit resistor
402 field oxide film
410 p-type semiconductor substrate
411 low concentration n-type semiconductor region
412 high concentration p-type semiconductor region
413, 414 high concentration n-type semiconductor region
415 field oxide film
416 gate oxide film
417 gate region
418 field plate
419 low concentration p-type semiconductor region
510 delay adjusting unit
520 control unit
531 internal resistor
532 external resistor
A1, A2 region
C1, C11 capacitor
D1, D11, D12 diode
P1 to P12, P21 to P35, P41 to P49 pad
R resistance component
W1 to W9, W21 to W31 wire

What is claimed is:

1. A zero-crossing detection circuit comprising:
a peak detection unit configured to detect a peak of a monitoring target signal input through a diode from an AC signal input terminal so as to generate a peak detection signal, and
a zero-crossing detection unit configured to estimate a zero cross of the AC signal from the peak detection signal so as to generate a zero-crossing detection signal.

2. The zero-crossing detection circuit according to claim 1, further comprising a monitoring unit configured to adjust the monitoring target signal to be suitable for input to the peak detection unit.

3. The zero-crossing detection circuit according to claim 1, wherein the zero-crossing detection unit counts a period of the peak detection signal and estimates a zero cross of the AC signal using a count value thereof.

4. The zero-crossing detection circuit according to claim 1, further comprising:
a comparing unit configured to compare the monitoring target signal with a plurality of threshold values so as to generate a plurality of comparison signals, and
a waveform determination unit configured to detect whether or not both a rising edge and a falling edge have occurred in at least one of the comparison signals during one period of the zero-crossing detection signal so as to generate a waveform determination signal.

5. The zero-crossing detection circuit according to claim 4, wherein the zero-crossing detection unit stops generation or output of the zero-crossing detection signal when the waveform determination signal is an abnormal determination logic level.

6. The zero-crossing detection circuit according to claim 1, wherein if a logic level of the peak detection signal is switched and then the logic level after the switching is not kept for a predetermined period, the zero-crossing detection unit ignores the switching of the logic level.

7. A semiconductor integrated circuit device comprising integration of at least a part of circuit elements constituting the zero-crossing detection circuit according to claim 1.

8. The semiconductor integrated circuit device according to claim 7, wherein an inter-terminal distance between a first external terminal that receives input of the monitoring target signal and a second external terminal neighboring the first external terminal is larger than inter-terminal distances between other external terminals.

9. The semiconductor integrated circuit device according to claim 7, further comprising an integrated AC/DC converter configured to generate a first DC voltage from an AC voltage input as the AC signal.

10. The semiconductor integrated circuit device according to claim 9, further comprising an integrated DC/DC converter configured to generate a second DC voltage from the first DC voltage.

11. The semiconductor integrated circuit device according to claim 7, further comprising:
a first chip in which a monitoring unit configured to adjust the monitoring target signal to be suitable for input to the peak detection unit is integrated, and
a second chip in which the peak detection unit and the zero-crossing detection unit are integrated, wherein
the first chip and the second chip are sealed with mold resin.

12. Electronic equipment comprising:
a rectifying unit configured to perform normal rectifying or voltage doubler rectifying of an AC voltage so as to generate a rectified voltage;
a zero-crossing detection circuit configured to detect a zero cross of the AC voltage; and
a microcomputer configured to control drive of a load in accordance with a detection result by the zero-crossing detection circuit,
wherein the zero-crossing detection circuit is a zero-crossing detection circuit according to claim 1.

13. Electronic equipment according to claim 12, wherein the rectifying unit includes a first capacitor and a second capacitor connected in series between an output terminal of the rectified voltage and a ground terminal, and the connection node thereof is connected to a node from which the monitoring target signal is led out.

14. Electronic equipment according to claim 12, wherein the zero-crossing detection circuit operates with respect to a ground voltage common to the microcomputer.

15. Electronic equipment according to claim 12, wherein the load is a motor or a triac.

16. Electronic equipment comprising:

a rectifying unit configured to perform normal rectifying or voltage doubler rectifying of an AC voltage so as to generate a rectified voltage;

a zero-crossing detection circuit according to claim 1 configured to detect a zero cross of the AC voltage;

a microcomputer configured to control drive of a load in accordance with a detection result by the zero-crossing detection circuit, and a semiconductor integrated circuit device comprising integration of at least a part of circuit elements constituting the zero-crossing detection circuit.

* * * * *